United States Patent
Choi

(10) Patent No.: US 12,550,323 B2
(45) Date of Patent: Feb. 10, 2026

(54) SEMICONDUCTOR MEMORY DEVICE WITH A GATE CONTACT SURROUNDED BY A CONDUCTIVE PATTERN

(71) Applicant: SK hynix Inc., Icheon-si (KR)

(72) Inventor: Kang Sik Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 757 days.

(21) Appl. No.: 17/542,241

(22) Filed: Dec. 3, 2021

(65) Prior Publication Data

US 2022/0399365 A1   Dec. 15, 2022

(30) Foreign Application Priority Data

Jun. 14, 2021   (KR) .................. 10-2021-0076983

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ........ H10B 41/10; H10B 41/50; H10B 43/10; H10B 41/00–70; H10B 43/00–50; H01L 23/5226; H01L 23/535
See application file for complete search history.

(56) References Cited

U.S. PATENT DOCUMENTS

| | | | |
|---|---|---|---|
| 9,853,038 B1 * | 12/2017 | Cui | H10B 43/35 |
| 10,304,852 B1 | 5/2019 | Cui et al. | |
| 2016/0163732 A1 * | 6/2016 | Lim | H10B 43/27 257/314 |
| 2020/0091071 A1 * | 3/2020 | Lee | H01L 21/76816 |
| 2020/0350249 A1 * | 11/2020 | Kim | H10B 41/27 |
| 2021/0098367 A1 * | 4/2021 | Lee | H10B 43/50 |
| 2022/0173120 A1 * | 6/2022 | Lee | H10B 43/40 |
| 2022/0399369 A1 * | 12/2022 | Son | H01L 23/5226 |

FOREIGN PATENT DOCUMENTS

| | | | | |
|---|---|---|---|---|
| KR | 20160069903 A | * | 6/2016 | ............. H10B 41/30 |
| KR | 1020190122372 A | | 10/2019 | |
| KR | 1020190140253 A | | 12/2019 | |
| KR | 1020200127650 A | | 11/2020 | |
| KR | 1020210039183 A | | 4/2021 | |
| KR | 1020210071544 A | | 6/2021 | |
| KR | 1020210079087 A | | 6/2021 | |
| KR | 1020160069903 A | | 7/2021 | |

* cited by examiner

*Primary Examiner* — Christine S. Kim
*Assistant Examiner* — Tyler J Wiegand
(74) *Attorney, Agent, or Firm* — WILLIAM PARK AND ASSOCIATES LTD.

(57) ABSTRACT

There are provided a semiconductor memory device and a manufacturing method of a semiconductor memory device. The semiconductor memory device includes a conductive gate contact penetrating a contact region of a stepped stack structure including a plurality of interlayer insulating layers and a plurality of conductive patterns, which are alternately stacked.

17 Claims, 83 Drawing Sheets

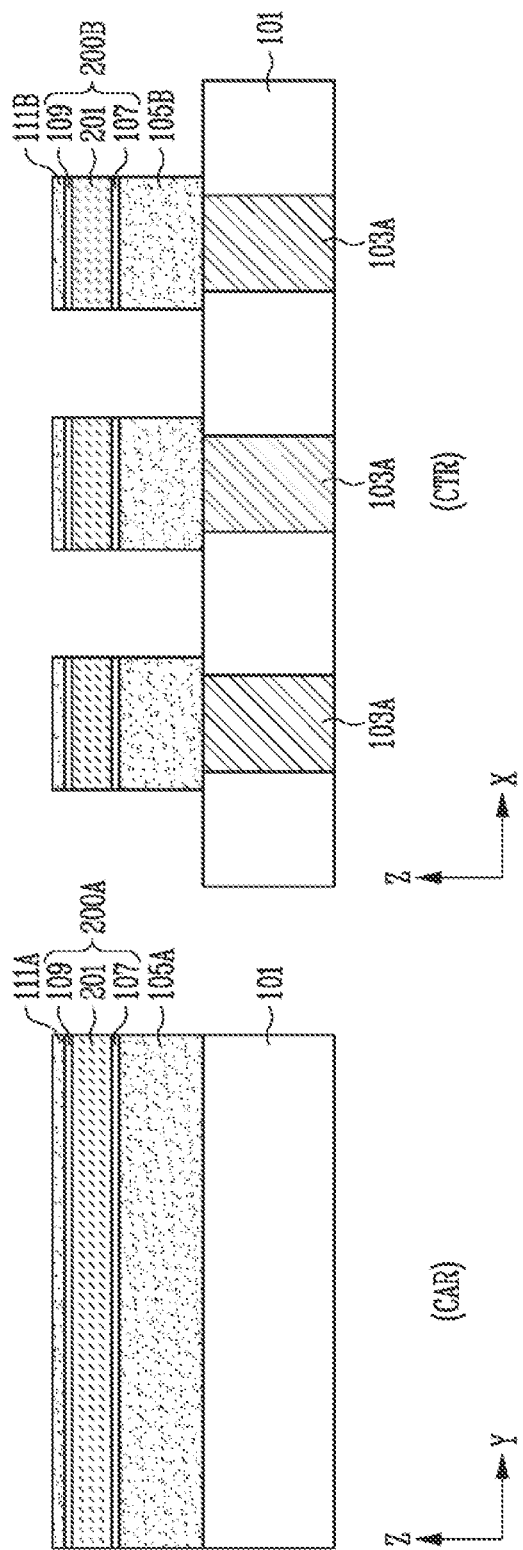

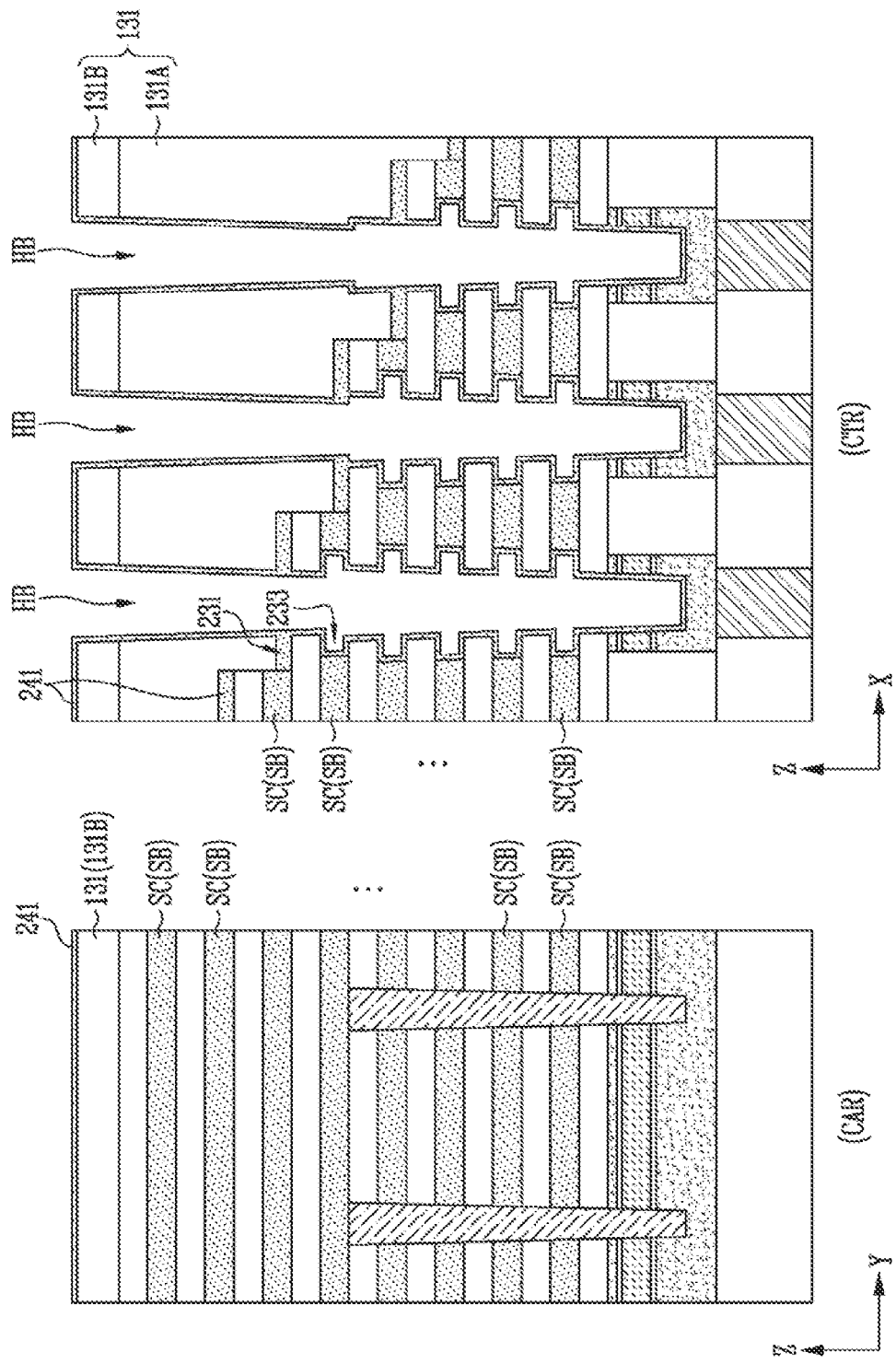

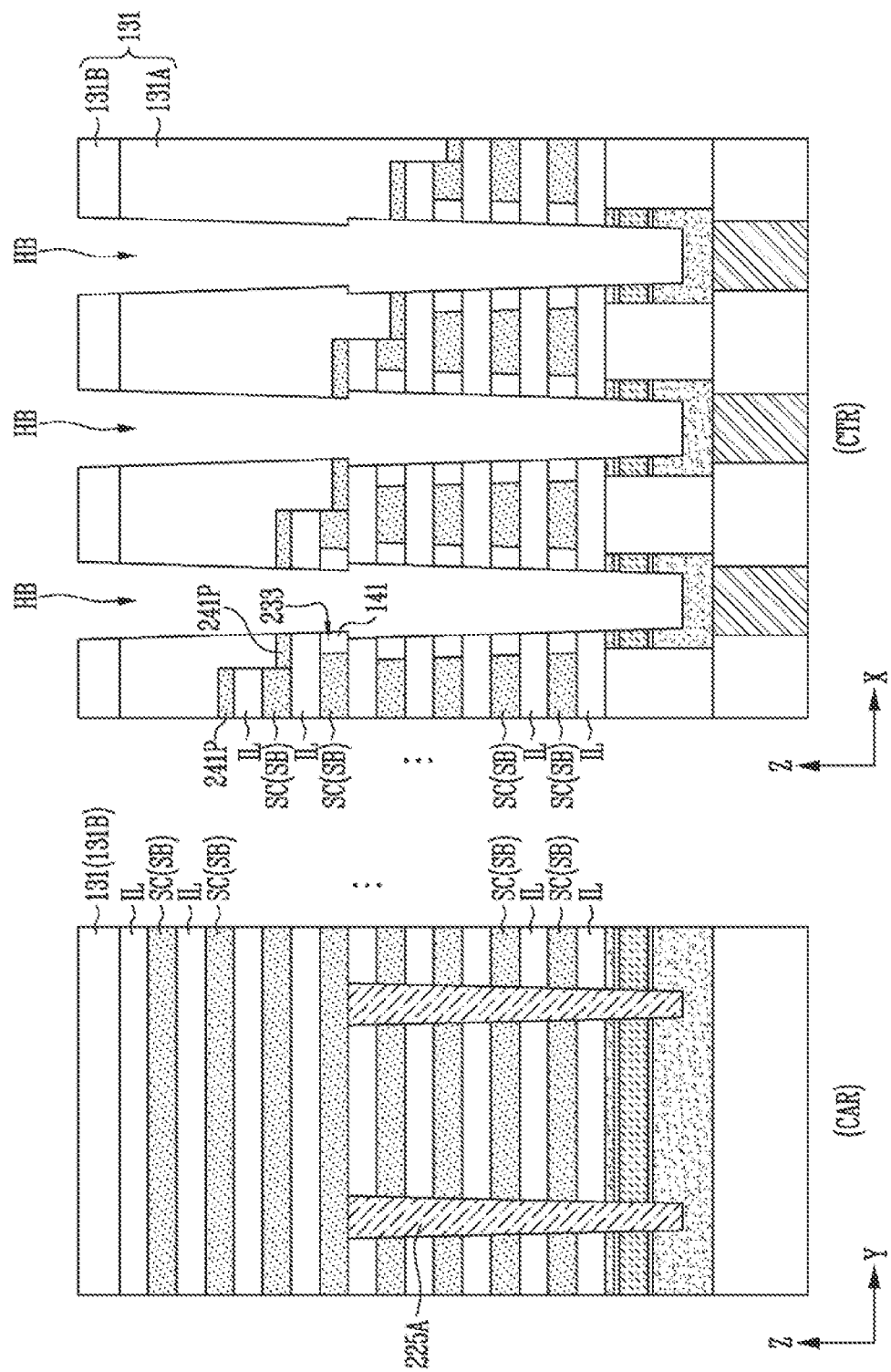

(CTR')

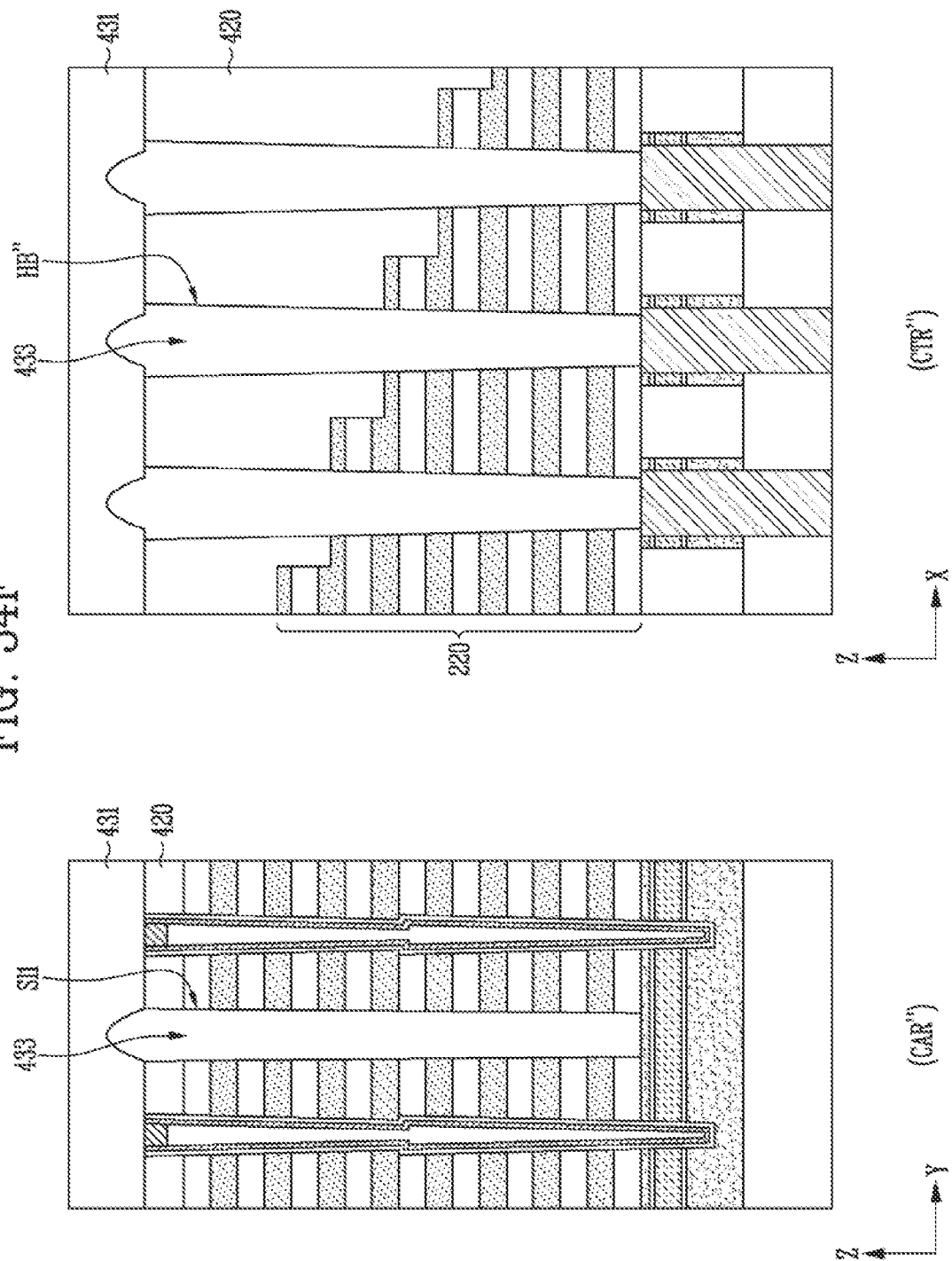

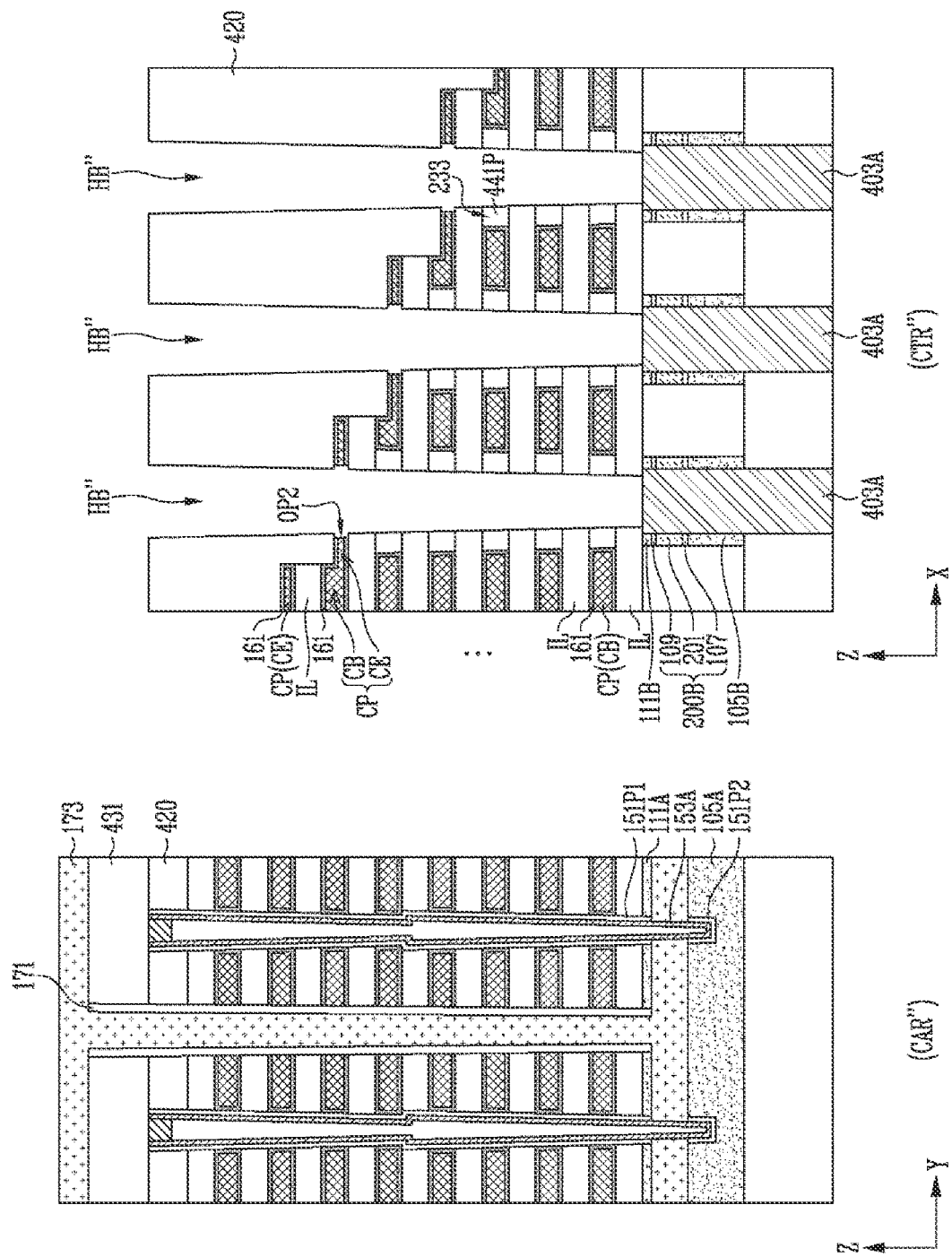

SEMICONDUCTOR MEMORY DEVICE WITH A GATE CONTACT SURROUNDED BY A CONDUCTIVE PATTERN

CROSS-REFERENCE TO RELATED APPLICATION

The present application claims priority under 35 U.S.C. § 119(a) to Korean patent application number 10-2021-0076983, filed on Jun. 14, 2021, in the Korean Intellectual Property Office, the entire disclosure of which is incorporated herein by reference.

BACKGROUND

1. Technical Field

The present disclosure generally relates to a semiconductor memory device and a manufacturing method of a semiconductor memory device, and more particularly, to a three-dimensional semiconductor memory device and a manufacturing method of a three-dimensional semiconductor memory device.

2. Related Art

A semiconductor memory device includes memory cells capable of storing data. A three-dimensional semiconductor memory device includes a three-dimensional memory cell array.

In order to improve the degree of integration of the three-dimensional memory cell array, a stacked number of memory cells may be increased. As the stacked number of memory cells is increased, manufacturing processes of the three-dimensional semiconductor memory device may be complicated, and the structural stability of the three-dimensional semiconductor memory device may deteriorate.

SUMMARY

In accordance with an embodiment of the present disclosure, there is provided a semiconductor memory device including: a first conductive gate contact; a first contact insulating pattern surrounding the first conductive gate contact; a first conductive pattern surrounding the first contact insulating pattern; and a second conductive pattern disposed over the first conductive pattern, the second conductive pattern surrounding the first conductive gate contact, wherein the second conductive pattern includes: a first edge part overlapping with the first contact insulating pattern, the first edge part being in contact with the first conductive gate contact; and a first base part, spaced apart from the first conductive gate contact by the first edge part, extending from the first edge part and away from the first conductive gate contact, and the first base part being thicker than the first edge part.

In accordance with another embodiment of the present disclosure, there is provided a semiconductor memory device including: a horizontal doped semiconductor pattern; a stepped stack structure including a plurality of interlayer insulating layers and a plurality of conductive patterns, which are alternately stacked on the horizontal doped semiconductor pattern, the stepped stack structure including a cell region overlapping with the horizontal doped semiconductor pattern and a contact region extending from the cell region; a cell channel layer in contact with the horizontal doped semiconductor pattern, the cell channel layer penetrating the cell region of the stepped stack structure; a plurality of conductive gate contacts penetrating the contact region of the stepped stack structure, the plurality of conductive gate contacts extending to a level at which the horizontal doped semiconductor pattern is disposed; and a protective layer penetrating a sidewall of each of the conductive gate contacts.

In accordance with still another embodiment of the present disclosure, there is provided a semiconductor memory device including: a stepped stack structure including a plurality of interlayer insulating layers and a plurality of conductive patterns, which are alternately stacked, the stepped stack structure including a cell region and a contact region extending from the cell region; a horizontal doped semiconductor pattern disposed under the cell region of the stepped stack structure; a lower insulating layer disposed under the contact region of the stepped stack structure and disposed at substantially the same level as a level at which the horizontal doped semiconductor pattern is disposed; a plurality of lower contacts penetrating the lower insulating layer; a cell channel layer in contact with the horizontal doped semiconductor pattern, the cell channel layer penetrating the cell region of the stepped stack structure; and a plurality of conductive gate contacts connected to the plurality of lower contacts, the plurality of conductive gate contacts penetrating the contact region of the stepped stack structure.

In accordance with still another embodiment of the present disclosure, there is provided a method of manufacturing a semiconductor memory device, the method including: forming a preliminary stepped stack structure including a lower interlayer insulating layer, a middle interlayer insulating layer, an upper interlayer insulating layer, a lower sacrificial layer including a lower base part between the lower interlayer insulating layer and the middle interlayer insulating layer and a lower edge part which further protrudes to a side portion than the middle interlayer insulating layer from the lower base part and is thinner than the lower base part, and an upper sacrificial layer including an upper base part between the middle interlayer insulating layer and the upper interlayer insulating layer and an upper edge part which further protrudes to a side portion than the upper interlayer insulating layer from the upper base part and is thinner than the upper base part; forming a filling insulating layer covering the preliminary stepped stack structure; forming a contact hole penetrating the filling insulating layer, the upper edge part, the middle interlayer insulating layer, the lower base part, and the lower interlayer insulating layer; replacing the upper edge part with a sacrificial pad through the contact hole; replacing a portion of the lower base part with a contact insulating pattern through the contact hole; and forming a support structure surrounded by the contact insulating pattern and the sacrificial pad in the contact hole.

In accordance with still another embodiment of the present disclosure, there is provided a method of manufacturing a semiconductor memory device, the method including: forming a lower stack structure in which a horizontal layer and a protective layer are stacked; isolating the lower stack structure into a preliminary horizontal pattern and a preliminary contact structure; forming a preliminary stepped stack structure by stacking a lower interlayer insulating layer, a lower sacrificial layer, a middle interlayer insulating layer, an upper sacrificial layer, and an upper interlayer insulating layer over the preliminary horizontal pattern and the preliminary contact structure; forming a support structure penetrating the preliminary stepped stack structure, the support structure extending to the inside of the preliminary contact structure; replacing each of the lower sacrificial layer and the upper sacrificial layer with a conductive pattern; and replacing the horizontal layer of the preliminary contact structure and the support structure with a conductive gate contact.

In accordance with still another embodiment of the present disclosure, there is provided a method of manufacturing a semiconductor memory device, the method including: forming a lower stack structure in which a horizontal layer and a protective layer are stacked; isolating the lower stack structure into a preliminary horizontal pattern and a preliminary contact structure; forming a lower contact penetrating the preliminary contact structure; forming a preliminary stepped stack structure including a plurality of interlayer insulating layers and a plurality of sacrificial layers, which are alternately stacked, over a lower structure including the preliminary horizontal pattern, the preliminary contact structure, and the lower contact; etching the preliminary stepped stack structure to form a slit penetrating a cell region of the preliminary stepped stack structure, which overlaps with the horizontal layer, and a contact hole penetrating a contact region of the preliminary stepped stack structure, which overlaps with the lower contact; forming a support structure disposed in the contact hole, the support structure extending between the interlayer insulating layers; replacing each of the sacrificial layers with a conductive pattern; and replacing a portion of the support structure in the contact hole with a conductive gate contact connected to the lower contact.

BRIEF DESCRIPTION OF THE DRAWINGS

FIGS. 7A and 7B are sectional views illustrating a process of isolating a lower stack structure into a plurality of patterns in accordance with an embodiment of the present disclosure.

FIGS. 14A, 14B, 15A, 15B, 16A, 16B, 17A, and 17B are sectional views illustrating a method of forming a sacrificial pad and a contact insulating pattern in accordance with an embodiment of the present disclosure.

FIGS. 34A, 34B, 34C, 34D, 34E, 34F, 34G, 34H, 34I, 34J, 34K, 34L, 34M, 34N, and 34O are sectional views illustrating a manufacturing method of a semiconductor memory device in accordance with an embodiment of the present disclosure.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

Hereinafter, the terms 'first' and 'second' are used to distinguish one component from another component and are not meant to imply a specific number or order of components. The terms may be used to describe various components, but the components are not limited by the terms. It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present.

Embodiments provide a semiconductor memory device and a manufacturing method of a semiconductor memory device, which can improve structural stability and stability in manufacturing processes.

Figure 1:
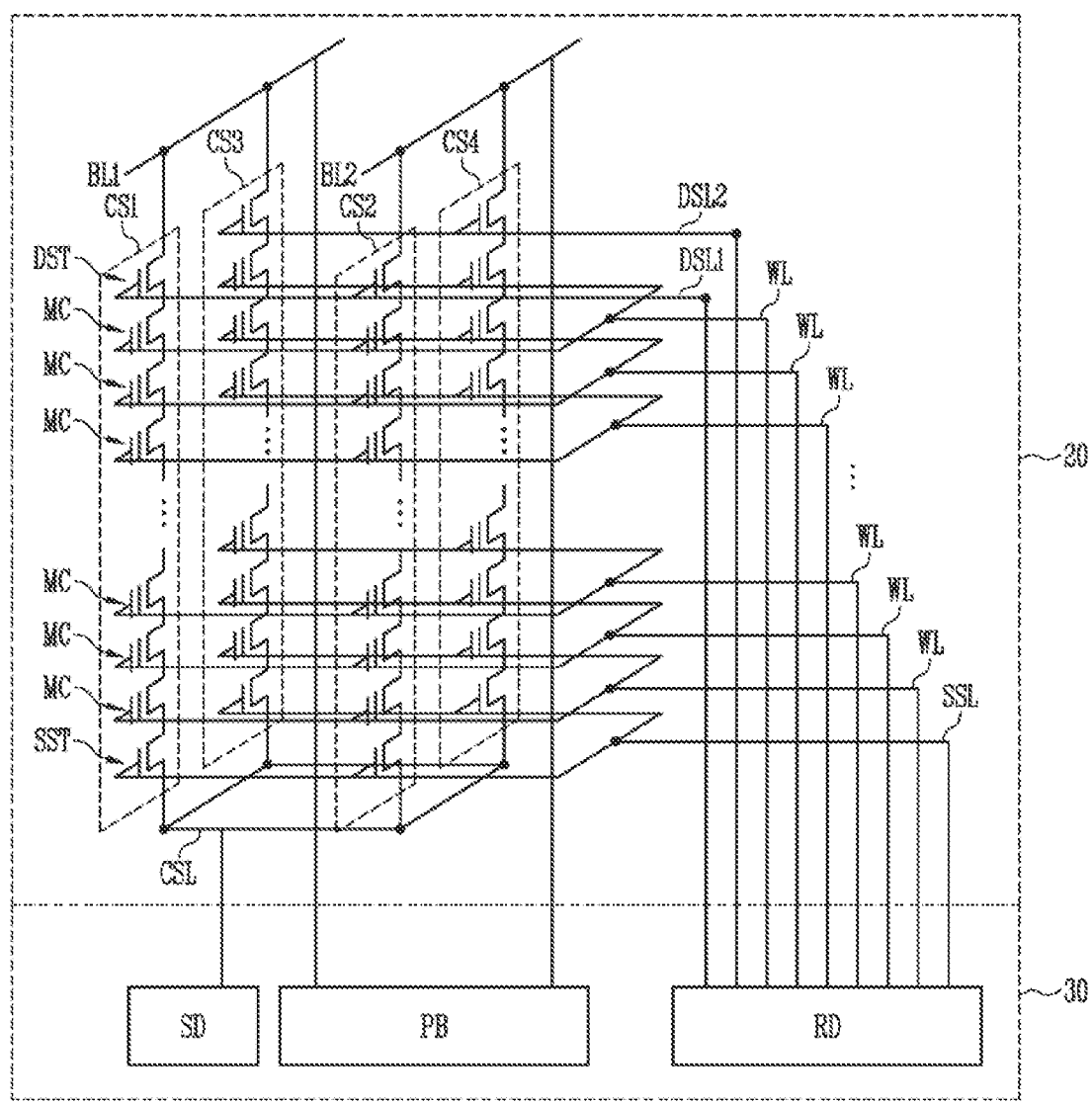
FIG. 1 is a diagram illustrating a schematic configuration of a semiconductor memory device in accordance with an embodiment of the present disclosure.

FIG. 1 is a diagram illustrating a schematic configuration of a semiconductor memory device in accordance with an embodiment of the present disclosure.

Referring to FIG. 1, the semiconductor memory device may include a memory cell array 20 and a peripheral circuit 30 for controlling the memory cell array 20. The memory cell array 20 may be disposed over the peripheral circuit 30. Accordingly, in an embodiment, the area of a substrate occupied by the memory cell array 20 and the peripheral circuit 30 can be reduced.

The memory cell array 20 may include a plurality of memory blocks. Each memory block may be connected to the peripheral circuit 30 via a bit line BL1 or BL2, a word line WL, a source select line SSL, a drain select line DSL1 or DSL2, and a common source pattern CSL.

Each memory block may include a plurality of bit lines. The plurality of bit lines may include a first bit line BL1 and a second bit line BL2. The number of bit lines is not limited to that shown in the drawing.

A plurality of memory cell strings may be connected in parallel to each bit line BL1 or BL2. Each memory block may include a first memory cell string CS1, a second memory cell string CS2, a third memory cell string CS3, and a fourth memory cell string CS4, which are connected in parallel to the common source pattern CSL. In an embodiment, the first memory cell string CS1 and the third memory cell string CS3 may be connected in parallel to the first bit line BL1, and the second memory cell string CS2 and the fourth memory cell string CS4 may be connected in parallel to the second bit line BL2. The number of memory cell strings connected to each bit line BL1 or BL2 and the number of memory cell string connected to the common source pattern CSL are not limited to those shown in the drawing.

The first memory cell string CS1, the second memory cell string CS2, the third memory cell string CS3, and the fourth memory cell string CS4 may be connected to a plurality of word lines WL. The first memory cell string CS1, the second memory cell string CS2, the third memory cell string CS3, and the fourth memory cell string CS4 may be commonly connected to each word line WL.

The first memory cell string CS1, the second memory cell string CS2, the third memory cell string CS3, and the fourth memory cell string CS4 commonly connected to each word line WL may be dividedly connected to two or more source select lines isolated from each other, or be dividedly connected to two or more drain select lines isolated from each other. In an embodiment, the first memory cell string CS1, the second memory cell string CS2, the third memory cell string CS3, and the fourth memory cell string CS4 may be commonly connected to the source select line SSL. The first memory cell string CS1 and the second memory cell string CS2, which are respectively connected to the first and second bit lines BL1 and BL2, may be commonly connected to a first drain select line DSL1, and the third memory cell string CS3 and the fourth memory cell string CS4, which are respectively connected to the first and second bit lines BL1 and BL2, may be commonly connected to a second drain select line DSL2. However, the present disclosure is not limited thereto, and the connection structure of memory cell strings, drain select lines, and source select lines may be various.

Each memory cell string CS1, CS2, CS3 or CS4 may include a source select transistor SST, a drain select transistor DST, and a plurality of memory cells MC connected in series to each other. Each memory cell string CS1, CS2, CS3 or CS4 may be connected to the common source pattern CSL via the source select transistor SST. Each memory cell string CS1, CS2, CS3 or CS4 may be connected to a bit line BL1 or BL2 corresponding thereto via the drain select transistor DST. The plurality of memory cells MC may be connected in series between the source select transistor SST and the drain select transistor DST by a cell channel layer.

A gate of the source select transistor SST may be connected to the source select line SSL. A gate of the drain select transistor DST may be connected to the drain select line DSL1 or DSL2. A gate of the memory cell MC may be connected to a word line WL corresponding thereto.

The peripheral circuit 30 may include a source driver SD, a page buffer PB, and a row decoder RD.

The source driver SD may be connected to the memory cell array 20 through the common source pattern CSL. The source driver SD may transmit a voltage necessary for an operation of the memory cell array 20 to the common source pattern CSL.

The row decoder RD may be connected to the memory cell array 20 through the plurality of word lines WL, the source select line SSL, and the first and second drain select lines DSL1 and DSL2. The row decoder RD may be configured to transfer operating voltages to the plurality of word lines WL, the source select line SSL, and the first and second drain select lines DSL1 and DSL2 in response to a row address signal.

The page buffer PB may be connected to the memory cell array 20 through the first and second bit lines BL1 and BL2. The page buffer PB may selectively precharge the first and second bit lines BL1 and BL2 according to external data input thereto, to store data in the memory cell. The page buffer PB may sense a current or voltage of the first and second bit lines BL1 and BL2, to read data from the memory cell MC.

The source driver SD, the page buffer PB, and the row decoder RD may be connected to the plurality of word lines WL, the source select line SSL, the first and second drain select lines DSL1 and DSL2, and the first and second bit lines BL1 and BL2 through interconnections.

Figure 2:
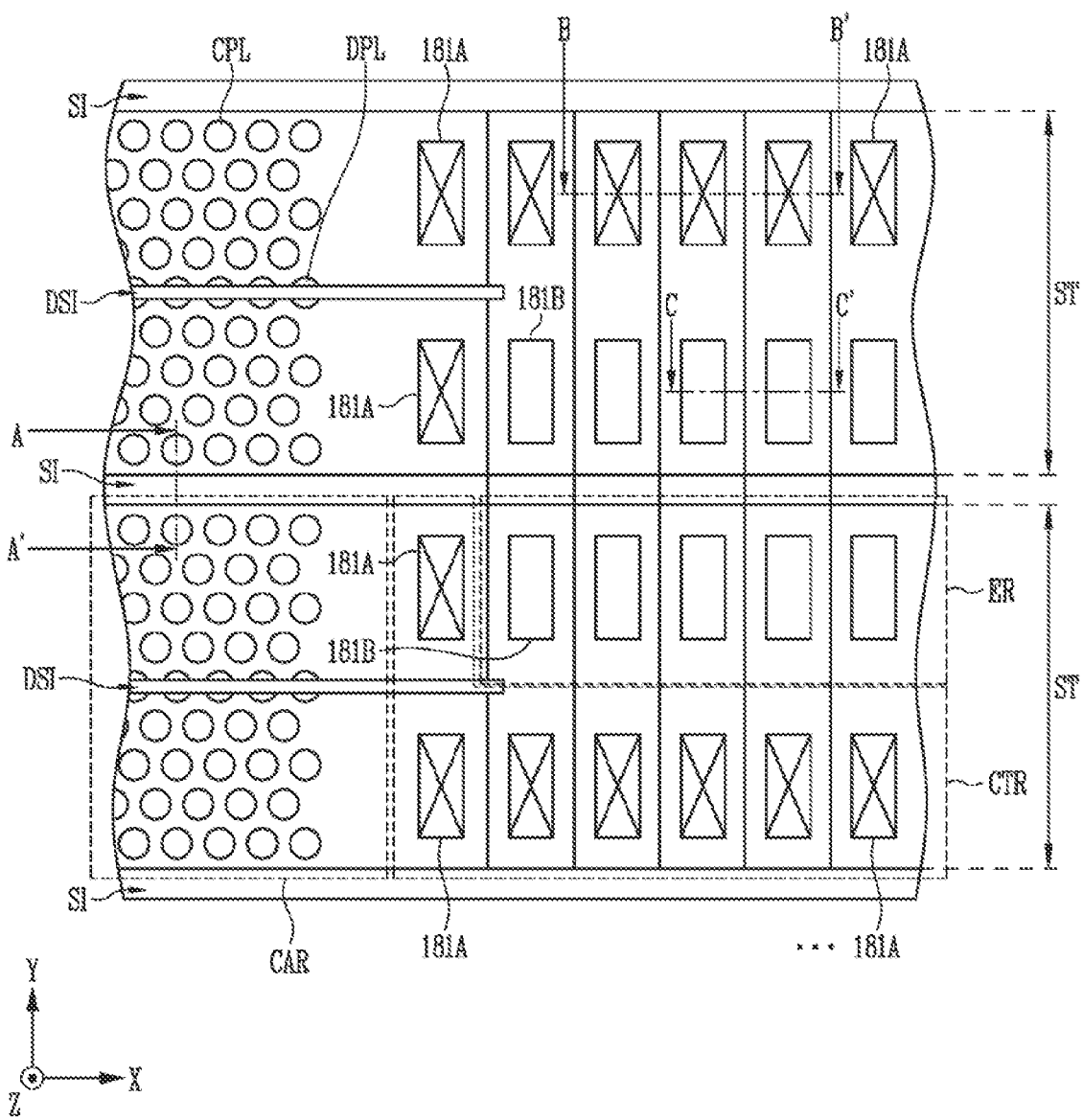
FIG. 2 is a plan view illustrating a portion of a semiconductor memory device in accordance with an embodiment of the present disclosure.

FIG. 2 is a plan view illustrating a portion of a semiconductor memory device in accordance with an embodiment of the present disclosure.

Referring to FIG. 2, the semiconductor memory device may include a plurality of stepped stack structures ST isolated from each other by a plurality of slits SI. Each stepped stack structure ST may include a cell region CAR, a contact region CTR, and an extension region ER.

The cell region CAR of the stepped stack structure ST may be penetrated by a plurality of cell plugs CPL. The plurality of cell plugs CPL may be arranged in zigzag on an XY plane of an XYZ coordinate system. The arrangement of the plurality of cell plugs CPL is not limited thereto. Each cell plug CPL may extend in a Z-axis direction of the XYZ coordinate system. The cell plug CPL may have various cross-sectional shapes including a circular shape, an elliptical shape, a polygonal shape, a square shape, and the like.

The contact region CTR of the stepped stack structure ST may extend from the cell region CAR. The contact region CTR of the stepped stack structure ST may be penetrated by a plurality of conductive gate contacts 181A. Each conductive gate contact 181A may extend in the Z-axis direction. The conductive gate contact 181A may have various cross-sectional shapes including a circular shape, an elliptical shape, a polygonal shape, a square shape, and the like. The conductive gate contact 181A may be formed with an area wider than that of the cell plug CPL on the XY plane.

The extension region ER of the stepped stack structure ST may extend from the contact region CTR. The extension region ER of the stepped stack structure ST may be penetrated by a plurality of dummy contacts 181B. The dummy contact 181B may have various cross-sectional shapes including a circular shape, an elliptical shape, a polygonal shape, a square shape, and the like. Each dummy contact 181B may be formed with an area wider than that of the cell plug CPL on the XY plane. In an embodiment, the dummy contact 181B may be formed with an area substantially equal to that of the conductive gate contact 181A on the XY plane.

At least one drain isolation slit DSI may be disposed between the slits SI adjacent to each other. The first drain select line DSL1 and the second drain select line DSL2, which are shown in FIG. 1, may be isolated from each other by the drain isolation slit DSI. The drain isolation slit DSI may be buried in the stepped stack structure ST. In the Z-axis direction, the drain isolation slit DSI may be shorter than the slit SI.

Figure 3A:
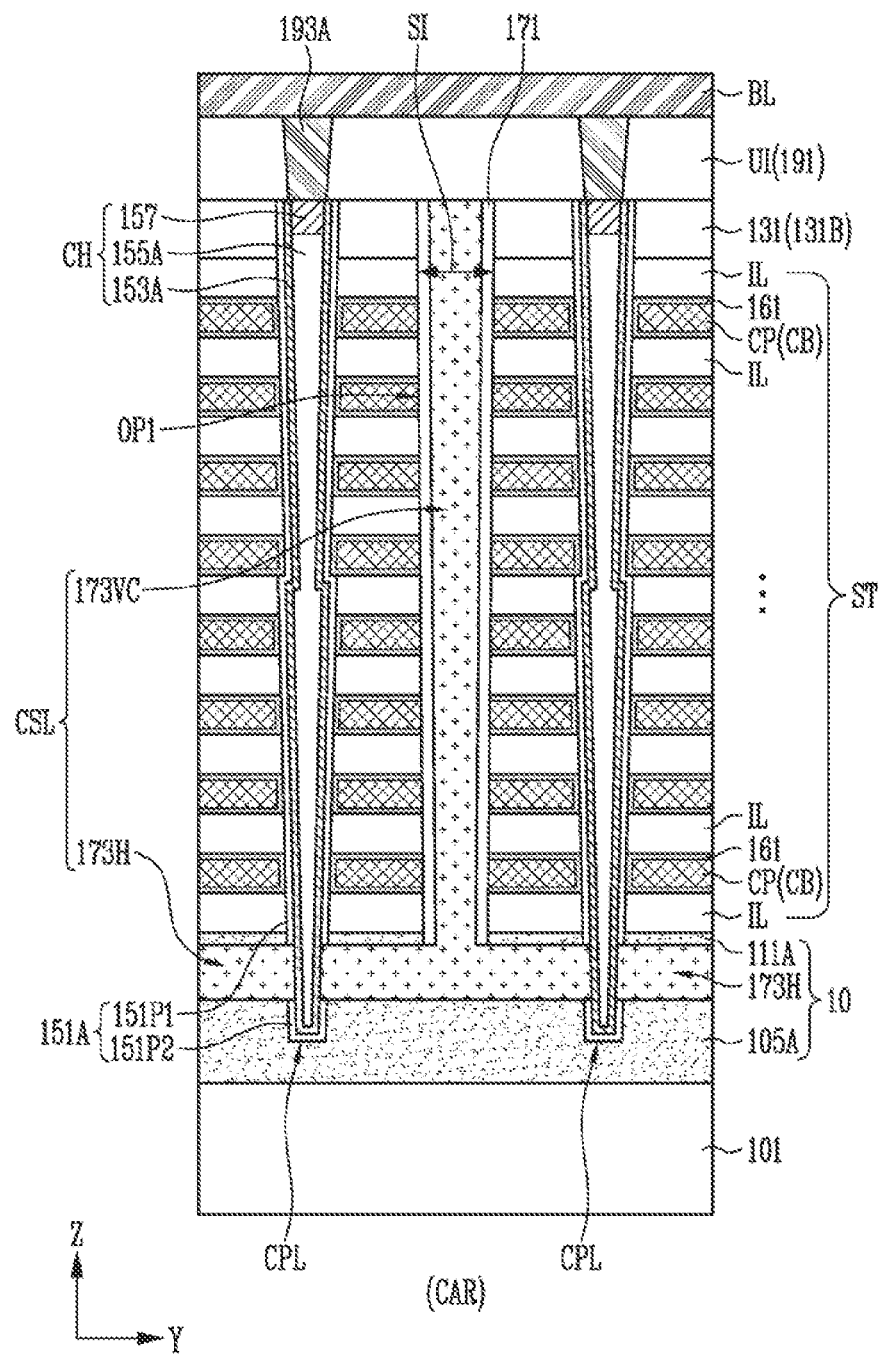
FIGS. 3A, 3B, and 3C are sectional views of the semiconductor memory device shown in FIG. 2.
Figure 3B:
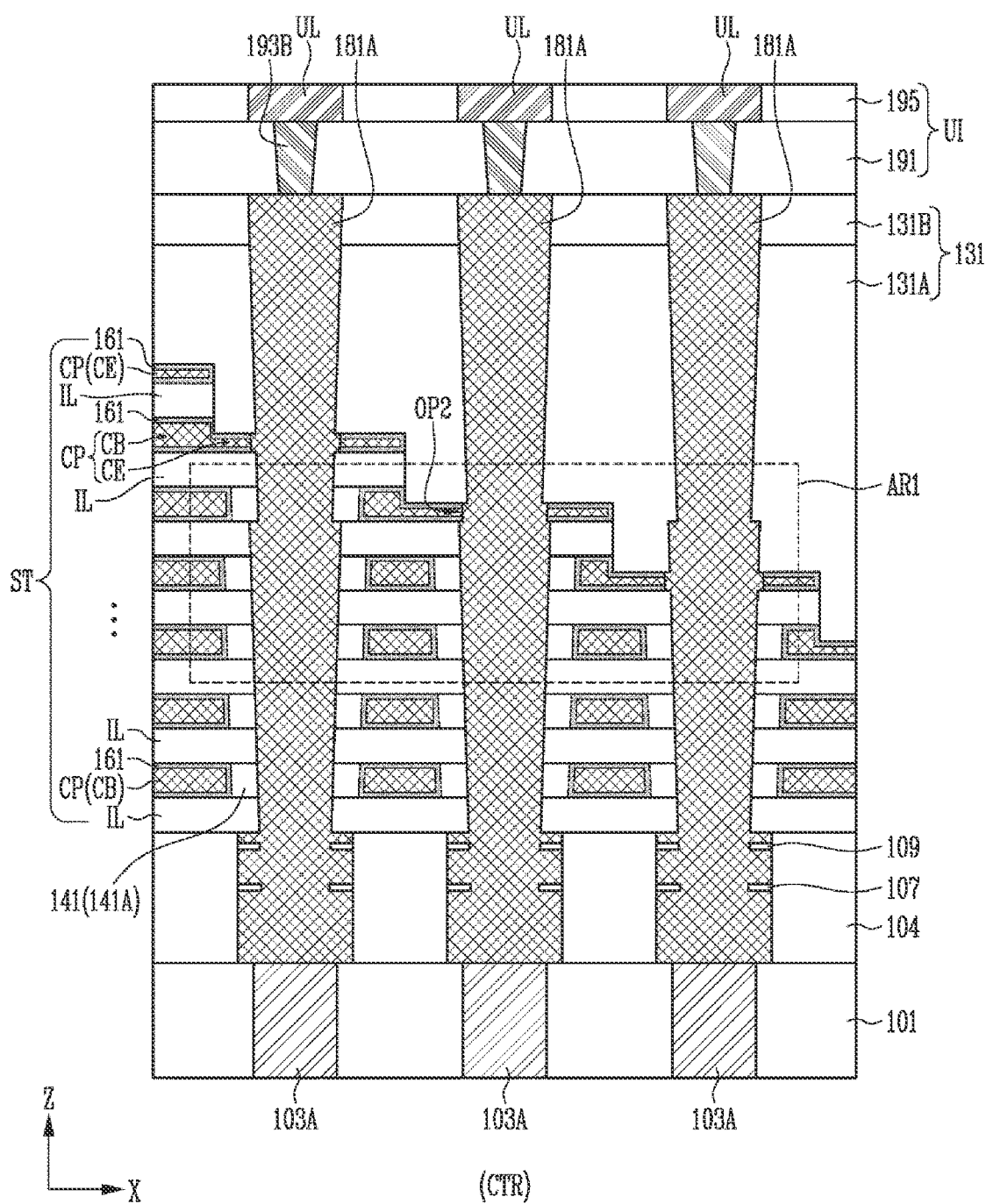
Figure 3C:
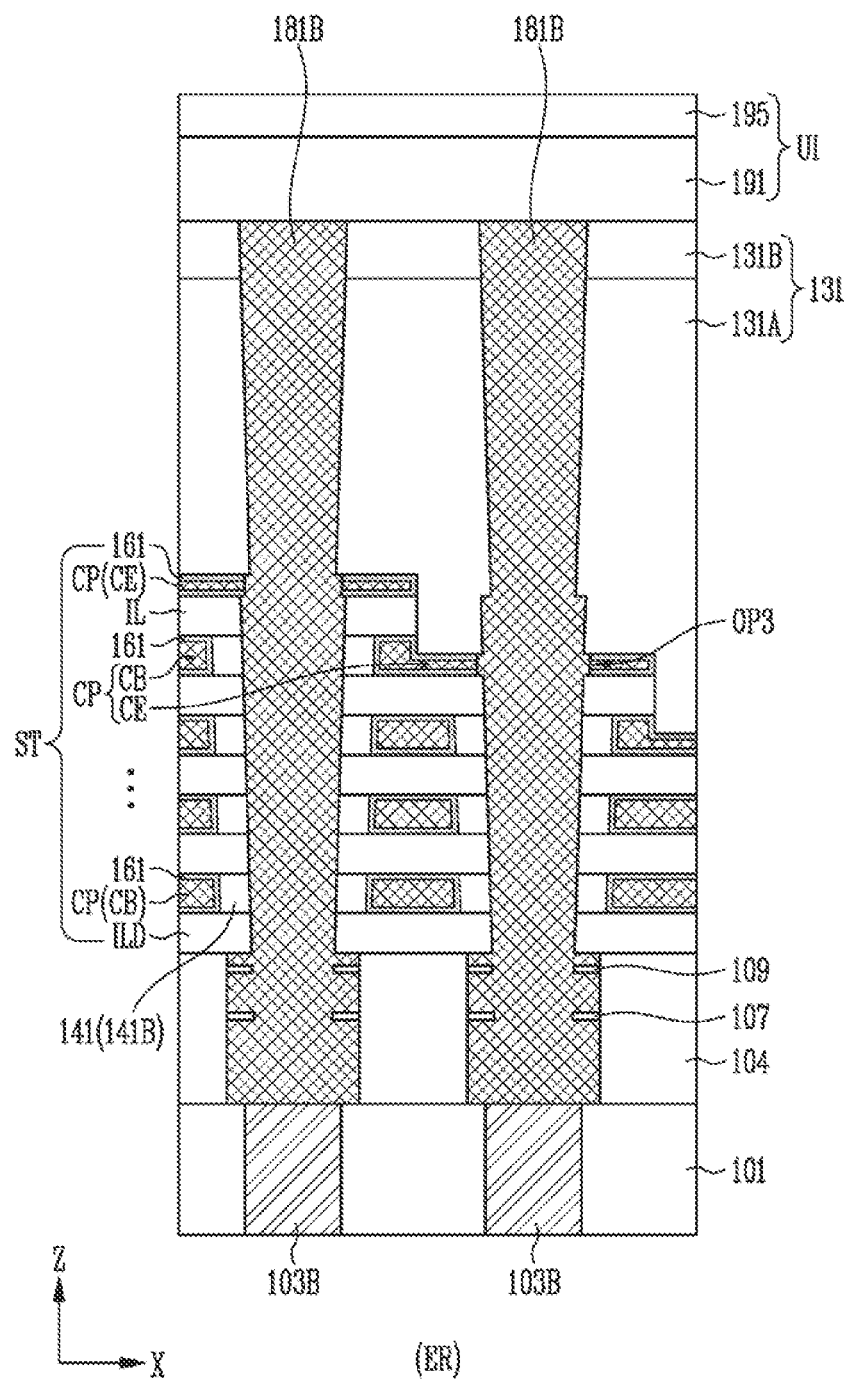

FIGS. 3A, 3B, and 3C are sectional views of the semiconductor memory device shown in FIG. 2. FIG. 3A illustrates a section of the cell region CAR of the stepped stack structure ST taken along line A-A' shown in FIG. 2. FIG. 3B illustrates a section of the contact region CTR of the stepped stack structure ST taken along line B-B' shown in FIG. 2. FIG. 3C illustrates a section of the extension region ER of the stepped stack structure ST taken along line C-C' shown in FIG. 2.

Referring to FIGS. 3A to 3C, the stepped stack structure ST may be disposed on a first lower insulating layer 101 penetrated by a plurality of lower contacts 103A and a plurality of lower dummy contacts 103B. The plurality of lower contacts 103A and the plurality of lower dummy contacts 103B may be formed of various conductive materials.

The semiconductor memory device may include a horizontal source layer 10 and a second lower insulating layer 104 between the first lower insulating layer 101 and the stepped stack structure ST.

The horizontal source layer 10 may include a first semiconductor pattern 105A, a horizontal doped semiconductor pattern 173H, and a second semiconductor pattern 111A, which are stacked on the first lower insulating layer 101. Each of the first semiconductor pattern 105A, the horizontal doped semiconductor pattern 173H, and the second semiconductor pattern 111A may include at least one of an n-type impurity and a p-type impurity. In an embodiment, each of the first semiconductor pattern 105A, the horizontal doped semiconductor pattern 173H, and the second semiconductor pattern 111A may include an n-type impurity. The horizontal source layer 10 may overlap with the cell region CAR of the stepped stack structure ST.

The second lower insulating layer 104 may be disposed at a level substantially equal to that of the horizontal source layer 10. In an embodiment, the second lower insulating layer 104 may be disposed under the contact region CTR of the stepped stack structure ST and may be disposed at substantially the same level as the level at which the horizontal doped semiconductor pattern 173H is disposed. The second lower insulating layer 104 may be disposed between the first lower insulating layer 101 and each of the contact region CTR and the extension region ER of the stepped stack structure ST.

The cell plug CPL may extend to the inside of the horizontal source layer 10. In an embodiment, the cell plug CPL may penetrate the second semiconductor pattern 111A and the horizontal doped semiconductor pattern 173H, and extend to the inside of the first semiconductor pattern 105A. The cell plug CPL may include a channel structure CH and a memory pattern 151A surrounding the channel structure CH.

The horizontal doped semiconductor pattern 173H may penetrate the memory pattern 151A to be in contact with the channel structure CH. The memory pattern 151A may be isolated into a first memory pattern 151P1 and a second memory pattern 151P2 by the horizontal doped semiconductor pattern 173H. The first memory pattern 151P1 may be disposed between the channel structure CH and the stepped stack structure ST. The second memory pattern 151P2 may be disposed between the channel structure CH and the first semiconductor pattern 105A.

In an embodiment, the memory pattern 151A may include a tunnel insulating layer, a data storage layer, and a first blocking insulating layer. The tunnel insulating layer may extend along a surface of the channel structure CH, and include an insulating material through which charges can tunnel. The data storage layer may extend along the surface of the channel structure CH with the tunnel insulating layer interposed therebetween. The data storage layer may include a material layer capable of storing data changed using Fowler-Nordheim tunneling. In an embodiment, the data storage layer may include a nitride layer in which charges can be trapped. However, the present disclosure is not limited thereto, and the data storage layer may include a phase change material, a nano dot, and the like. The first blocking insulating layer may extend along the surface of the channel structure CH with the tunnel insulating layer and the data storage layer, which are interposed therebetween. The first blocking insulating layer may include an insulating material capable of blocking movement of charges.

The channel structure CH may include a cell channel layer 153A, a core insulating pattern 155A, and a capping pattern 157. The cell channel layer 153A is used as a channel of a memory cell string. The cell channel layer 153A may be connected to the horizontal doped semiconductor pattern 173H of the horizontal source layer 10.

The cell channel layer 153A may be disposed on the memory pattern 151A. The cell channel layer 153A may be formed of a semiconductor material. For example, the cell channel layer 153A may include silicon. The core insulating pattern 155A and the capping pattern 157 may fill a central region of the channel structure CH. The core insulating pattern 155A may include oxide. The capping pattern 157 may be disposed on the core insulating pattern 155A, and include a sidewall surrounded by an upper end of the cell channel layer 153A. The capping pattern 157 may include a doped semiconductor layer including at least one of an n-type impurity and a p-type impurity.

The stepped stack structure ST may include a plurality of interlayered insulating layers IL and a plurality of conductive patterns CP, which are alternately stacked in the Z-axis direction.

The plurality of conductive patterns CP may be used as the source select line SSL, the plurality of word lines WL, and the drain select line DSL1 or DSL2, which are shown in FIG. 1. In an embodiment, a lowermost layer among the plurality of conductive patterns CP may be used as the source select line SSL shown in FIG. 1, an uppermost layer among the plurality of conductive patterns CP may be used as the drain select line DSL1 or DSL2 shown in FIG. 1, and a plurality of intermediate layers between the lowermost layer and the uppermost layer among the plurality of conductive patterns CP may be used as the plurality of word lines WL shown in FIG. 1.

The plurality of conductive patterns CP extend toward the contact region CTR and the extension region ER from the cell region CAR of the stepped stack structure ST. The plurality of contact patterns CP may form a stepped structure in the contact region CTR and the extension region ER. To this end, the plurality of conductive patterns CP may extend to have a longer length as they get closer to the second lower insulating layer 104 in the contact region CTR and the extension region ER. In an embodiment, the plurality of conductive patterns CP may extend to have a longer length in an X-axis direction as they get closer to the second lower insulating layer 104 in the contact region CTR and the extension region ER.

Each conductive pattern CP may include an edge part CE and a base part CB extending from the edge part CE. A plurality of edge parts CE of the plurality of conductive patterns CP may form the stepped structure in the contact region CTR and the extension region ER. A plurality of base parts CB of the plurality of contact patterns CP may extend to the cell region CAR from the plurality of edge parts CE to surround the cell plug CPL.

The stepped stack structure ST may be covered by a filling insulating layer 131. The filling insulating layer 131 may include a first filling insulating layer 131A and a second filling insulating layer 131B on the first filling insulating layer 131A. The first filling insulating layer 131A may overlap with the contact region CTR and the extension region ER of the stepped stack structure ST to cover the plurality of edge parts CE of the plurality of conductive pattern CP. The second filling insulating layer 131B may extend to cover the cell region CAR, the contact region CTR, and the extension region ER of the stepped stack structure ST. The filling insulating layer 131 may be penetrated by the cell plug CPL and the slit SI.

The filling insulating layer 131 and the plurality of edge parts CE may be penetrated by a plurality of conductive gate contacts 181A and a plurality of dummy contacts 181B. The plurality of conductive gate contacts 181A may respectively penetrate a plurality of edge parts CE in the contact region CTR, and the plurality of dummy contacts 181B may respectively penetrate a plurality of edge parts CE in the extension region ER. Each of the conductive gate contact 181A and the dummy contact 181B may be surrounded by at least one of the plurality of conductive patterns CP and at least one of the plurality of interlayer insulating layers IL. At least one of the plurality of conductive gate contacts 181A and the plurality of dummy contacts 181B may penetrate the base part CB of at least one of the plurality of conductive patterns CP.

The plurality of conductive gate contacts 181A and the plurality of dummy contacts 181B might not only be spaced apart from the plurality of base parts CB of the plurality of conductive patterns CP but also be insulated from the plurality of conductive patterns CP by a plurality of contact insulating patterns 141. The plurality of contact insulating patterns 141 may include a first contact insulating pattern 141A and a second contact insulating pattern 141B. The first contact insulating pattern 141A may be disposed between the conductive gate contact 181A and the base part CB of the conductive pattern CP. The first contact insulating pattern 141A may surround a sidewall of a conductive gate contact 181A corresponding thereto. The second contact insulating pattern 141B may be disposed between the dummy contact 181B and the base part CB of the conductive pattern CP. The second contact insulating pattern 141B may surround a dummy contact 181B corresponding thereto.

The plurality of conductive gate contacts 181A and the plurality of dummy contacts 181B may extend to a level at which the horizontal source layer 10 is disposed. For example, the plurality of conductive gate contacts 181A and the plurality of dummy contacts 181B may extend to penetrate the second lower insulating layer 104. At least one groove filled with a protective layer may be defined at a sidewall of the conductive gate contact 181A and a sidewall of the dummy contact 181B. In an embodiment, the semiconductor memory device may include a first protective layer 107 and a second protective layer 109, which are spaced apart from each other in the Z-axis direction at a level at which the horizontal source layer 10 and the second lower insulating layer 104 are disposed. The first protective layer 107 and the second protective layer 109 may penetrate the sidewall of the conductive gate contact 181A or penetrate the sidewall of the dummy contact 181B. Each of the first protective layer 107 and the second protective layer 109 may surround a sidewall of a conductive gate contact 181A or a dummy contact 181B, which corresponds thereto.

The slit SI may be filled with a sidewall insulating layer 171 and a conductive vertical contact 173VC. The sidewall insulating layer 171 may extend along sidewalls of the plurality of conductive patterns CP and the plurality of interlayer insulating layers IL. The slit SI and the sidewall insulating layer 171 may extend to penetrate the second semiconductor pattern 111A. The conductive vertical contact 173VC may be disposed on the sidewall insulating layer 171, and be disposed in a central region of the slit SI. The conductive vertical contact 173VC might not only be spaced apart from the plurality of conductive patterns CP but also be insulated from the plurality of conductive patterns CP by the sidewall insulating layer 171. The conductive vertical contact 173VC may extend in the Z-axis direction to be parallel to the cell channel layer 153A from the horizontal doped semiconductor pattern 173H. In an embodiment, the conductive vertical contact 173VC may be integrated with the horizontal doped semiconductor pattern 173H, and be formed of the same material as the horizontal doped semiconductor pattern 173H. However, the embodiment of the present disclosure is not limited thereto. In another embodiment, the conductive vertical contact 173VC may include a conductive material different from that of the horizontal doped semiconductor pattern 173H. For example, the conductive vertical contact 173VC may include a metal. The conductive vertical contact 173VC and the horizontal doped semiconductor pattern 173H may be used as the common source pattern CSL shown in FIG. 1.

The semiconductor memory device may include a second blocking insulating layer 161 extending along a surface of each conductive pattern CP. The second blocking insulating layer 161 may include an insulating material having a dielectric constant higher than that of the first blocking insulating layer of the memory pattern 151A. In an embodiment, the first blocking insulating layer may include silicon oxide, and the second blocking insulating layer 161 may include metal oxide such as aluminum oxide.

The second blocking insulating layer 161 may include a first opening OP1 facing the sidewall insulating layer 171, a second opening OP2 facing each conductive gate contact 181A, and a third opening OP3 facing each dummy contact 181B. The conductive pattern CP may be in contact with the sidewall insulating layer 171 through the first opening OP1. The conductive pattern CP may be in contact with a conductive gate contact 181A corresponding thereto through the second opening OP2. The conductive pattern CP may be in contact with a dummy contact 181B corresponding thereto through the third opening OP3.

Each conductive gate contact 181A may be in contact with an edge part CE corresponding thereto, and be surrounded by the edge part CE corresponding thereto. Each dummy contact 181B may be in contact with an edge part CE corresponding thereto, and be surrounded by the edge part CE corresponding thereto. The base part CB of the conductive pattern CP may be thicker than the edge part CE of the conductive pattern CP. Accordingly, a width of each of the second opening OP2 and the third opening OP3 in the Z-axis direction may be narrower than that of the first opening OP1 in the Z-axis direction.

The filling insulating layer 131 may be covered by an upper insulating layer UI. The upper insulating layer UI may include a first upper insulating layer 191 over the filling insulating layer 131 and a second upper insulating layer 195 over the first upper insulating layer 191.

The capping pattern 157 of the cell plug CPL may be connected to a bit line BL via a bit line contact 193A. The bit line BL may be disposed at a level at which the second upper insulating layer 195 is disposed. That is, the bit line BL may be disposed on the first upper insulating layer 191. The bit line contact 193A may penetrate the first upper insulating layer 191, and connect the capping pattern 157 and the bit line BL to each other.

The plurality of conductive gate contacts 181A may be connected to a plurality of upper lines UL via a plurality of upper contacts 193B. The first upper insulating layer 191 may fill between the plurality of upper contacts 193B. The second upper insulating layer 195 may fill between the plurality of upper lines UL. The plurality of upper lines UL, the plurality of upper contacts 193B, the plurality of conductive gate contacts 181A, and the plurality of lower contacts 103A may be used as interconnections for connecting the plurality of conductive patterns CP to the row decoder RD shown in FIG. 1.

The plurality of lower dummy contacts 103B and the plurality of dummy contacts 181B may remain as floating patterns which are not electrically connected to the peripheral circuit 30 shown in FIG. 1. To this end, top surfaces of the plurality of dummy contacts 181B may be covered by the upper insulating layer UI.

In accordance with the embodiment of the present disclosure, the contact region CTR and the extension region ER are formed in structures similar to each other, and thus a manufacturing process for providing the extension region ER can be performed by using a manufacturing process for providing the contact region CTR. Accordingly, in accordance with the embodiment of the present disclosure, manufacturing processes of the semiconductor memory device can be simplified.

Figure 4:
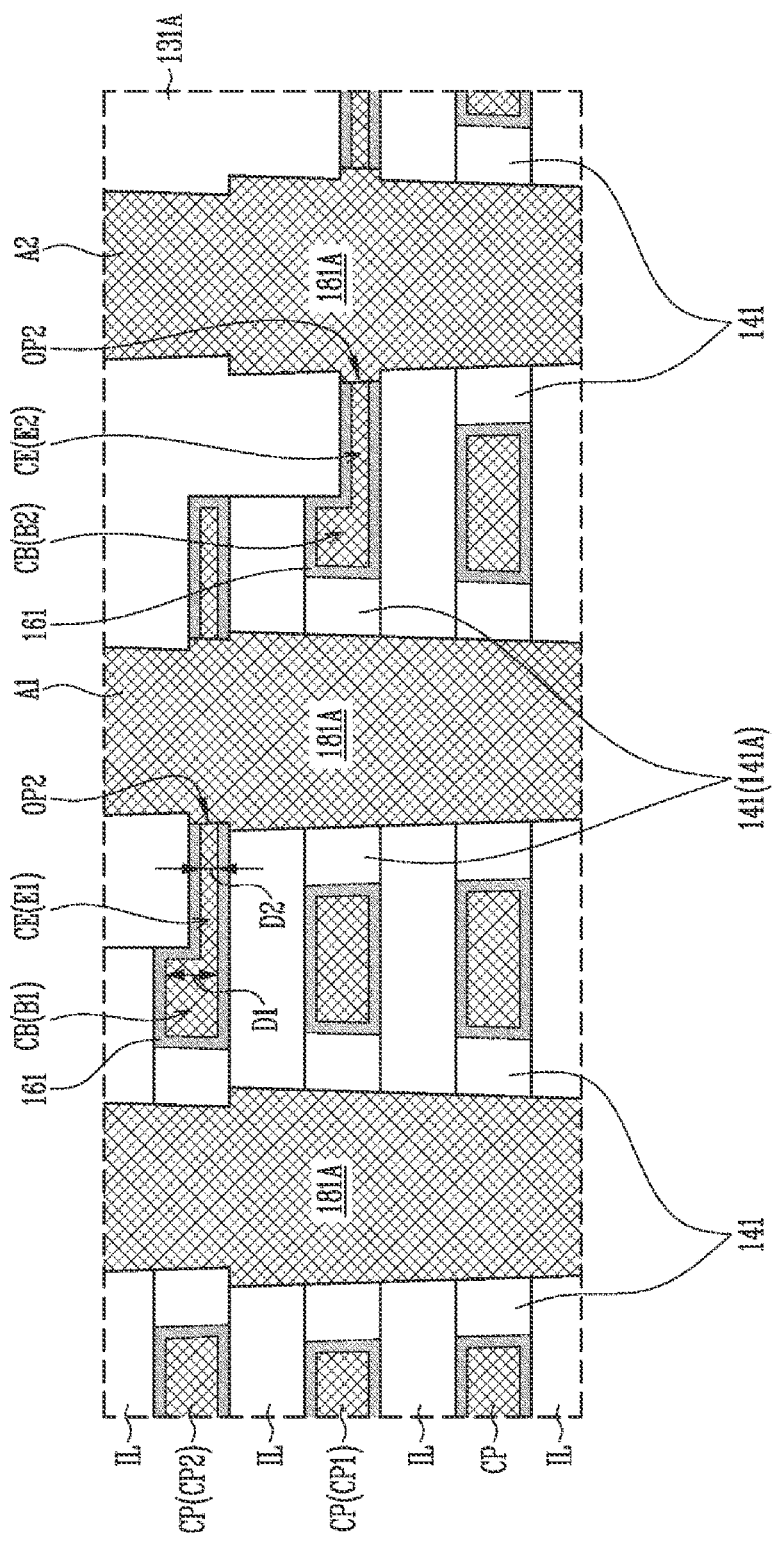
FIG. 4 is an enlarged sectional view of region AR1 shown in FIG. 3B.

FIG. 4 is an enlarged sectional view of region AR1 shown in FIG. 3B.

Referring to FIG. 4, the plurality of conductive gate contacts 181A may include a first conductive gate contact A1 surrounded by a relatively large number of conductive patterns CP and a second conductive gate contact A2 surrounded by a relatively small number of conductive patterns CP. The first conductive gate contact A1 and the second conductive gate contact A2 may be spaced apart from each other.

The plurality of conductive patterns CP may include a first conductive pattern CP1 disposed at a relatively lower portion and a second conductive pattern CP2 disposed at a relatively upper portion. That is, the second conductive pattern CP2 may be disposed above the first conductive pattern CP1. One of the plurality of interlayer insulating layers IL may be disposed between the first conductive pattern CP1 and the second conductive pattern CP2.

The first conductive pattern CP1 and the second conductive pattern CP2 may extend in parallel to each other to surround the first conductive gate contact A1. The first contact insulating pattern 141A may be disposed between the first conductive gate contact A1 and the first conductive pattern CP1. The first conductive pattern CP1 may be insulated from the first conductive gate contact A1 by the first contact insulating pattern 141A. The first conductive pattern CP1 may extend to surround the second conductive gate contact A2.

The second blocking insulating layer 161 may surround a sidewall of the first contact insulating pattern 141A. The second blocking insulating layer 161 may extend along a surface of each of the first conductive pattern CP1 and the second conductive pattern CP2, which face the first filling insulating layer 131A, and extend along a surface of each of the first conductive pattern CP1 and the second conductive pattern CP2, which face the interlayer insulating layer IL. The second opening OP2 of the second blocking insulating layer 161 may be aligned at each of a level at which the first conductive pattern CP1 is disposed and a level at which the second conductive pattern CP2 is disposed. An edge part CE of each of the first conductive pattern CP1 and the second conductive pattern CP2 may be in contact with a conductive gate contact 181A corresponding thereto through the second opening OP2.

For example, the second conductive pattern CP2 may include a first edge part E1 in contact with the first conductive gate contact A1 and a first base part B1 extending from the first edge part E1. The first conductive pattern CP1 may include a second edge part E2 in contact with the second conductive gate contact A2 and a second base part B2 extending from the second edge part E2. As described with reference to FIGS. 3A to 3C, a thickness D2 of each of the first edge part E1 and the second edge part E2 may be smaller than that D1 of each of the first base part B1 and the second base part B2.

The first edge part E1 of the second conductive pattern CP2 may overlap with the first contact insulating pattern 141A. The first edge part E1 may surround the first conductive gate contact A1. The first filling insulating layer 131A may be interposed between the first edge part E1 of the second conductive pattern CP2 and the second conductive gate contact A2.

A first contact insulating pattern 141A overlapping with the first edge part E1 among the plurality of first contact insulating patterns 141A may be surrounded by the second base part B2 of the first conductive pattern CP1. The second conductive gate contact A2 may be spaced apart from the first contact insulating pattern 141A overlapping with the first edge part E1. The second conductive gate contact A2 may have a sidewall in contact with the second edge part E2 of the first conductive pattern CP1. The second edge part E2 may extend from the second base part B2, and surround the second conductive gate contact A2.

Figure 5:
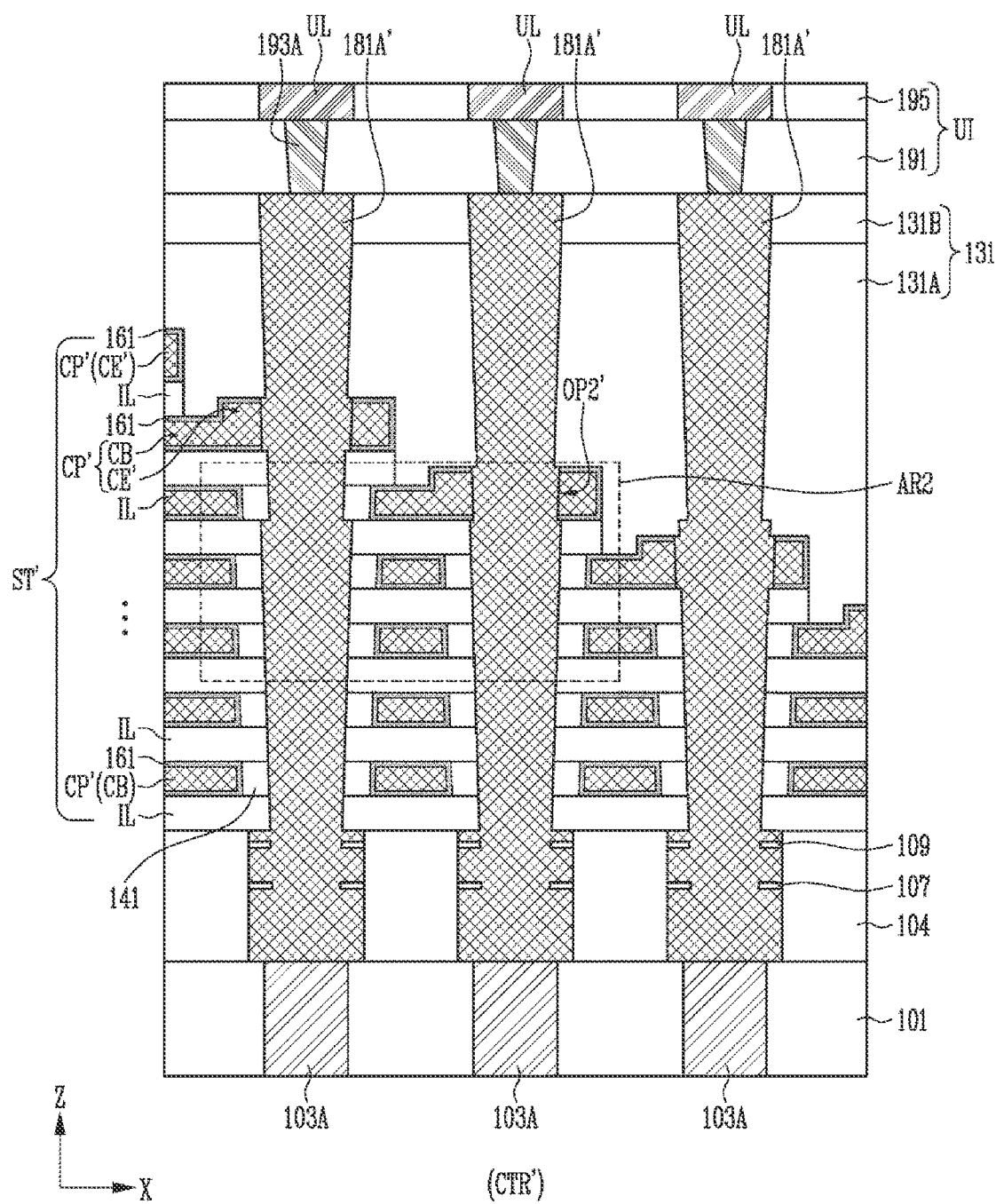
FIG. 5 is a sectional view illustrating a semiconductor memory device in accordance with an embodiment of the present disclosure.
Figure 6:
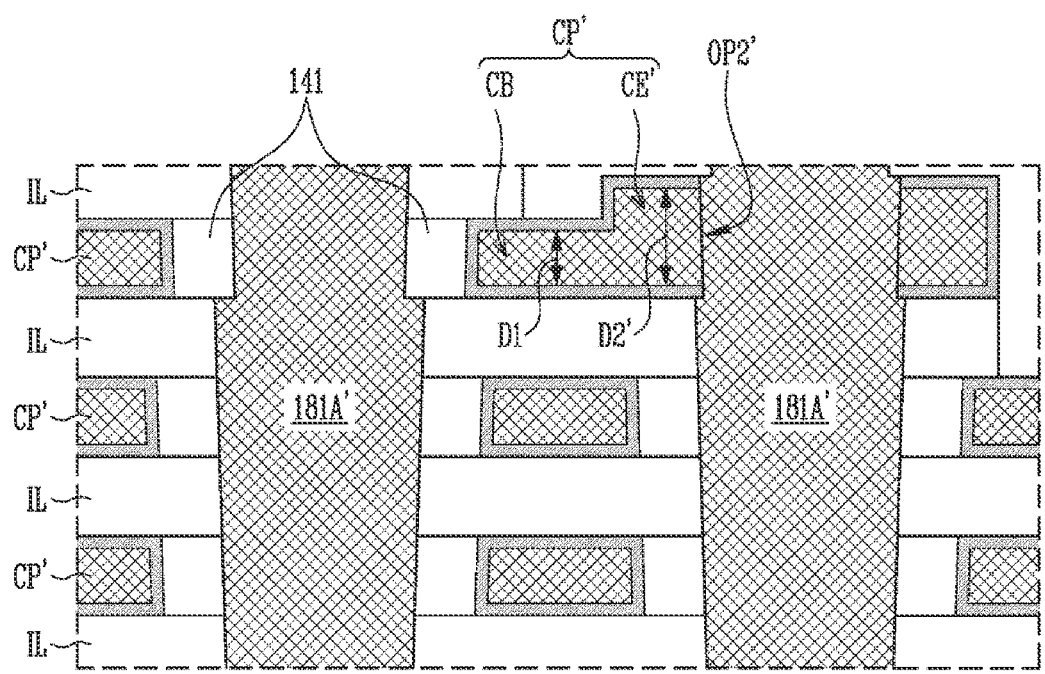
FIG. 6 is an enlarged sectional view of region AR2 shown in FIG. 5.

FIG. 5 is a sectional view illustrating a semiconductor memory device in accordance with an embodiment of the present disclosure. More specifically, FIG. 5 is a sectional view illustrating a modified embodiment of the stepped stack structure. FIG. 5 illustrates a contact region CTR' of a stepped stack structure ST' in accordance with an embodiment of the present disclosure. The contact region CTR' shown in FIG. 5 may extend from the cell region CAR shown in FIG. 3A. Although not shown in the drawing, an extension region of the stepped stack structure ST, which extends from the contact region CTR' shown in FIG. 5, may be formed in a structure similar to that of the contact region CTR' shown in FIG. 5. FIG. 6 is an enlarged sectional view of region AR2 shown in FIG. 5. Hereinafter, for simplification of description, descriptions overlapping with those shown in FIGS. 3A to 3C and 4 will be omitted.

Referring to FIGS. 5 and 6, a second lower insulating layer 104 may be disposed on a first lower insulating layer 101 penetrated by a plurality of lower contacts 103A. The second lower insulating layer 104 may be penetrated by a plurality of conductive gate contacts 181A' respectively connected to the plurality of lower contacts 103A. The plurality of conductive gate contacts 181A' may penetrate the stepped stack structure ST'. A first protective layer 107 and a second protective layer 109 may be buried in each conductive gate contact 181A'.

A plurality of conductive patterns CP' and a plurality of interlayer insulating layers IL of the stepped stack structure ST' may be alternately disposed in the Z-axis direction. Each conductive pattern CP' may include an edge part CE' and a base part CB extending from the edge part CE'. A plurality of edge parts CE' of the plurality of conductive patterns CP' may form a stepped structure in the contact region CTR'. The base part CB may be in contact with a sidewall insulating layer 171 by a first opening OP1 of a second blocking insulating layer 161 as shown in FIG. 3A, and the edge part CE' may be in contact with a conductive gate contact 181A' corresponding thereto by a second opening OP2' of the second blocking insulating layer 161 as shown in FIGS. 5 and 6. A thickness D2' of the edge part CE' may be greater than that D1 of the base part CB. In addition, a width of the second opening OP2' shown in FIGS. 5 and 6 in the Z-axis direction may be further greater than that of the first opening shown in FIG. 3A in the Z-axis direction.

The plurality of edge parts CE' of the plurality of conductive patterns CP' may be spaced apart from sidewalls of the plurality of interlayer insulating layers IL. A first filling insulating layer 131A of a filling insulating layer 131 may extend between an interlayer insulating layer IL and an edge part CE, which are adjacent to each other at the same level.

Each conductive gate contact 181A' may extend in the Z-axis direction to penetrate the stepped stack structure ST', the first filling insulating layer 131A, and a second filling insulating layer 131B. An edge part CE' of a conductive pattern CP' may surround a conductive gate contact 181A' corresponding thereto.

A contact insulating pattern 141 may overlap with an edge part CE' of a conductive pattern CP, and be surrounded by a base part CB of another conductive pattern CP' disposed under the edge part CE' of the conductive pattern CP'. The conductive gate contact 181A' may be insulated from the base part CB by the contact insulating pattern 141.

Hereinafter, manufacturing methods of semiconductor memory devices in accordance with embodiments of the present disclosure will be described.

Figure 7B:
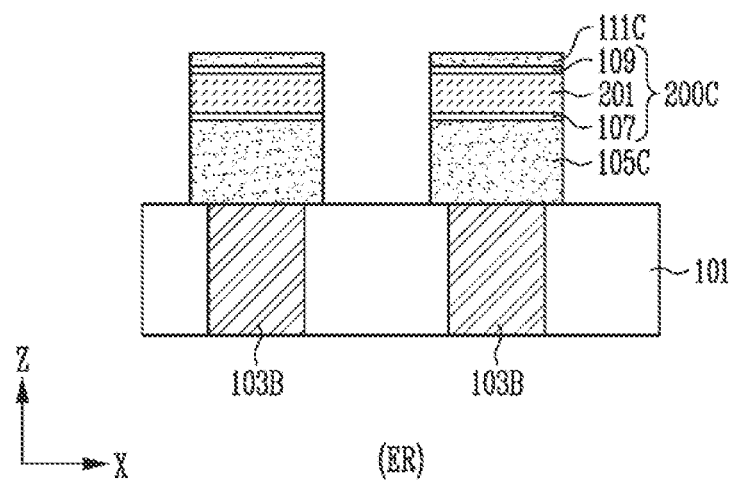

FIGS. 7A and 7B are sectional views illustrating a process of isolating a lower stack structure into a plurality of patterns in accordance with an embodiment of the present disclosure.

Referring to FIGS. 7A and 7B, the lower stack structure may include a first protective layer 107, a horizontal layer 201 on the first protective layer 107, and a second protective layer 109 on the horizontal layer 201.

Before the lower stack structure is formed, a process of forming a first lower insulating layer 101 penetrated by a plurality of lower contacts 103A and a plurality of lower dummy contacts 103B and a process of stacking a first semiconductor layer on the first lower insulating layer 101 may be performed. Although not shown in the drawings, the first lower insulating layer 101 may be formed on a peripheral circuit structure including the source driver SD, the page buffer PB, and the row decoder RD, which are shown in FIG. 1. The first semiconductor layer is a layer for a plurality of first semiconductor patterns 105A, 105B, and 105C, and may include at least one of an n-type impurity and a p-type impurity. In an embodiment, the first semiconductor layer may include an n-type impurity.

The first protective layer 107, the horizontal layer 201, and a second protective layer 109 of the lower stack structure may be stacked on the first semiconductor layer. The horizontal layer 201 may be selected from materials having an etch selectivity with respect to the first protective layer 107 and the second protective layer 109. The first protective layer 107 and the second protective layer 109 may include the same material. In an embodiment, the first protective layer 107 and the second protective layer 109 may include silicon oxide, and the horizontal layer 201 may include undoped silicon.

After the lower stack structure is formed, a second semiconductor layer may be formed on the second protective layer 109. The second semiconductor layer is a layer for a plurality of second semiconductor patterns 111A, 111B, and 111C, and may be an undoped semiconductor layer or a doped semiconductor layer including at least one of an n-type impurity and a p-type impurity. In an embodiment, the second semiconductor layer may include an n-type impurity.

Subsequently, the second semiconductor layer, the lower stack structure, and the first semiconductor layer may be etched through an etching process using a photolithography process. Accordingly, the second semiconductor layer may be isolated into the plurality of second semiconductor patterns 111A, 111B, and 111C. In addition, the lower stack structure may be isolated into a preliminary horizontal pattern 200A, a plurality of preliminary contact structures 200B and a plurality of preliminary dummy structures 200C. In addition, the first semiconductor layer may be isolated into the plurality of first semiconductor patterns 105A, 105B, and 105C. The plurality of first semiconductor patterns 105A, 105B, and 105C may respectively overlap with the preliminary horizontal pattern 200A, the plurality of preliminary contact structures 200B and the plurality of preliminary dummy structures 200G. The preliminary horizontal pattern 200A may overlap with the first lower insulating layer 101. The plurality of preliminary contact structures 200B may respectively overlap with the plurality of lower contact 103A. The plurality of preliminary dummy structures 200C may respectively overlap with the plurality of lower dummy contacts 103B. The plurality of second semiconductor patterns 111A, 111B, and 111C may respectively overlap with the preliminary horizontal pattern 200A, the plurality of preliminary contact structures 200B, and the plurality of preliminary dummy structures 200G.

FIGS. 8A, 8B, 9A, 9B, 10A, and 10B are sectional views illustrating a method of forming a preliminary stepped stack structure in accordance with an embodiment of the present disclosure.

Figure 8A:
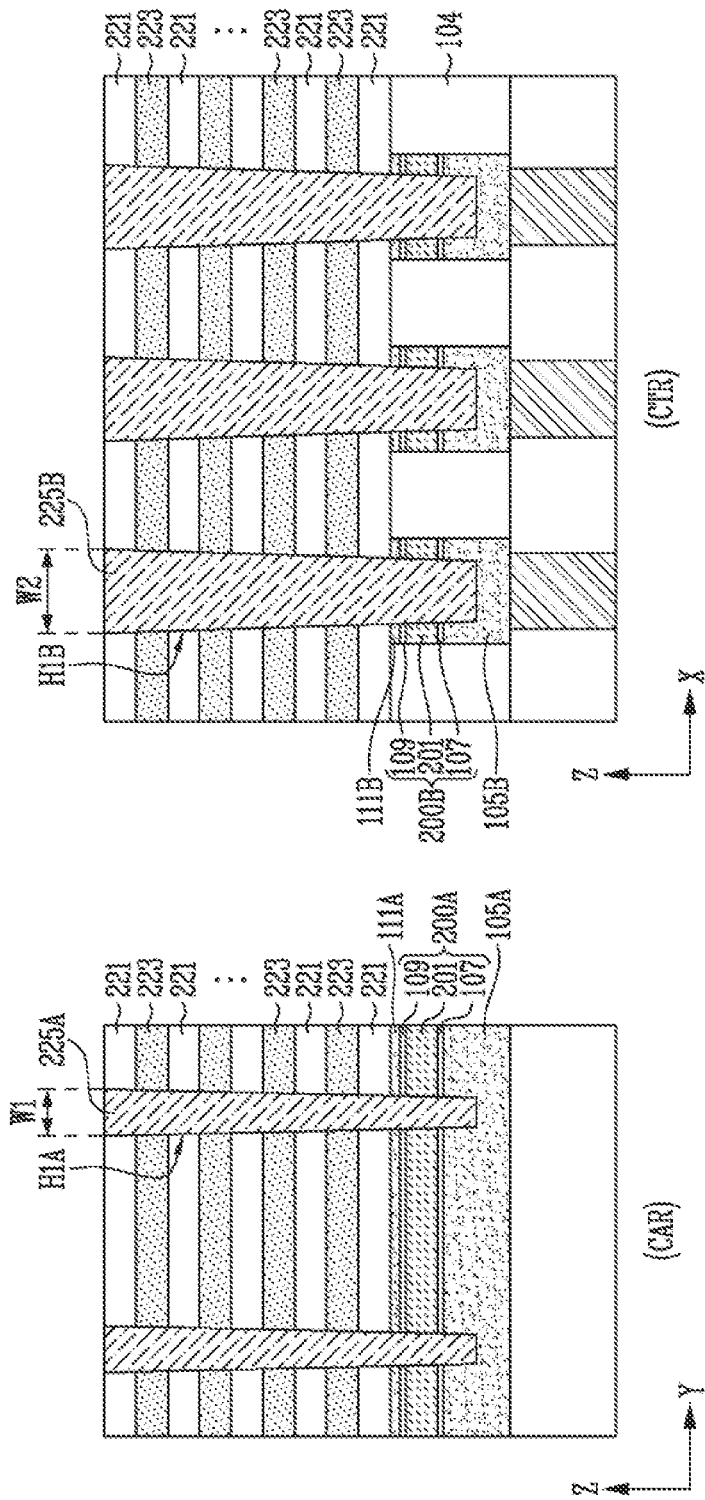
FIGS. 8A, 8B, 9A, 9B, 10A, and 10B are sectional views illustrating a method of forming a preliminary stepped stack structure in accordance with an embodiment of the present disclosure.
Figure 8B:
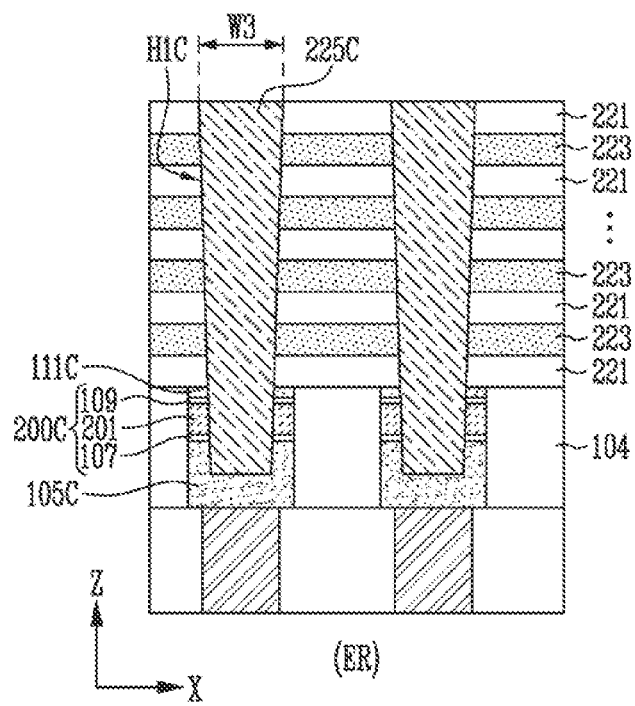

Referring to FIGS. 8A and 8B, a second lower insulating layer 104 may be filled in spaces between the plurality of first semiconductor patterns 105A, 105B, and 105C. The second lower insulating layer 104 may be filled between the preliminary horizontal pattern 200A, the plurality of preliminary contact structures 200B, and the plurality of preliminary dummy structures 200C and between the plurality of second semiconductor patterns 111A, 111B, and 111C.

Subsequently, a plurality of first material layers 221 and a plurality of second material layers 223 may be alternately stacked in the Z-axis direction on the second lower insulating layer 104 and the plurality of second semiconductor patterns 111A, 111B, and 111C.

Subsequently, a plurality of first preliminary holes H1A, H1B, and H1C may be formed, which penetrate the plurality of first material layers 221 and the plurality of second material layers 223, and extend to the inside of the plurality of first semiconductor patterns 105A, 105B, and 105C. The plurality of first preliminary holes H1A, H1B, and H1C may include a first preliminary channel hole H1A, a plurality of first preliminary contact holes H1B, and a plurality of first preliminary dummy holes H1C. The first preliminary channel hole H1A may penetrate the second semiconductor pattern 111A and the preliminary horizontal pattern 200A, and extend to the inside of the first semiconductor pattern 105A. Each first preliminary contact hole H1B may penetrate a second semiconductor pattern 111B corresponding thereto and a preliminary contact structure 200B corresponding thereto, and extend to the inside of a first semiconductor pattern 105B corresponding thereto. Each first preliminary dummy hole H1C may penetrate a second semiconductor pattern 111C corresponding thereto and a preliminary dummy structure 200G corresponding thereto, and extend to the inside of the first semiconductor pattern 105C corresponding thereto. Each of a width W2 of the first preliminary contact hole H1B and a width W3 of the first preliminary dummy hole H1C may be formed wider than that W1 of the first preliminary channel hole H1A. The width W2 of the first preliminary contact hole H1B and the width W3 of the first preliminary dummy hole H1C may be the same or be different from each other.

When etching processes for forming the plurality of first preliminary holes H1A, H1B, and H1C are performed, the plurality of first semiconductor patterns 105A, 105B, and 105C may be used as an etch stop layer.

Subsequently, the first preliminary holes H1A, H1B, and H1C may be respectively filled with a plurality of sacrificial pillars 225A, 225B, and 225C. The plurality of sacrificial pillars 225A, 225B, and 225C may include a first sacrificial pillar 225A, a plurality of second sacrificial pillars 225B, and a plurality of third sacrificial pillars 225C. The first sacrificial pillar 225A may fill the first preliminary channel hole H1A. Each second sacrificial pillar 225B may fill a first preliminary contact hole H1B corresponding thereto. Each third sacrificial pillar 225C may fill a first preliminary dummy hole H1C corresponding thereto.

Figure 9A:
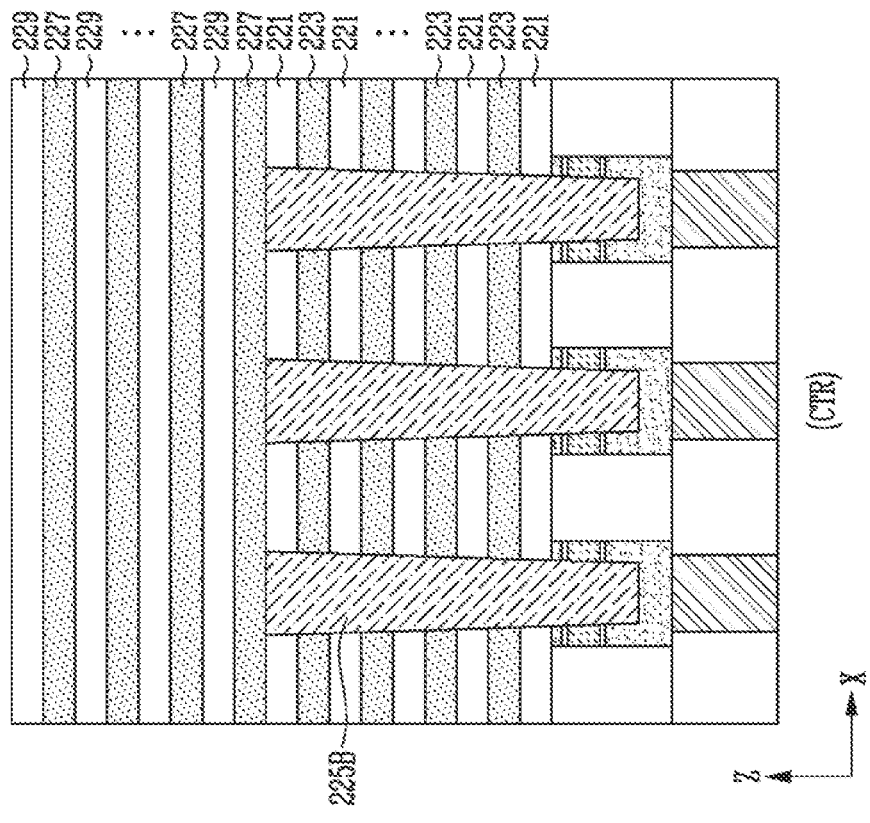
Figure 9A:
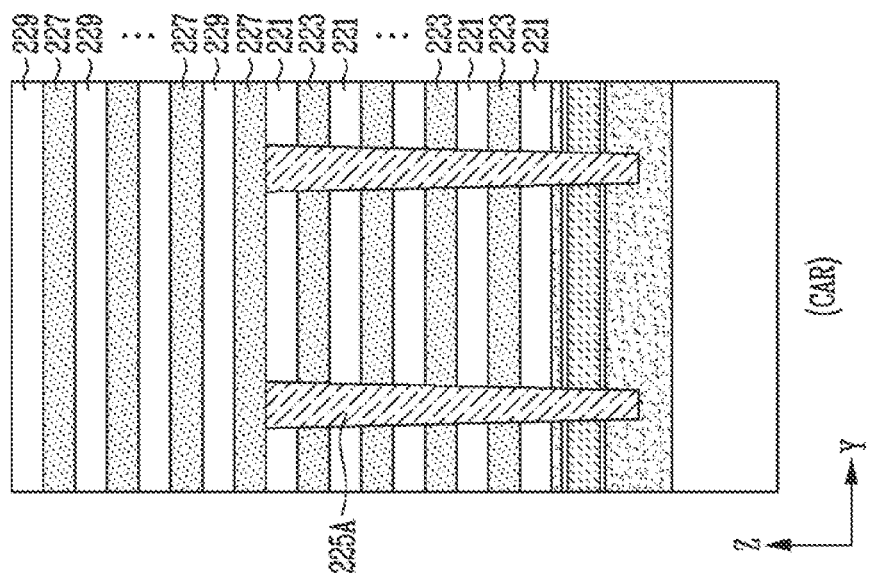
Figure 9B:
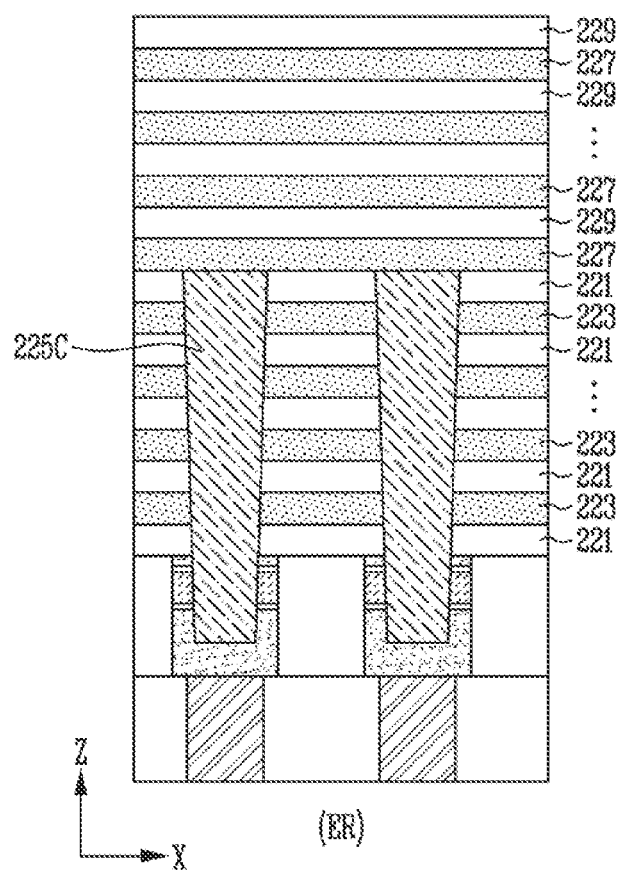

Referring to FIGS. 9A and 9B, a plurality of third material layers 227 and a plurality of fourth material layers 229 may be alternately stacked in the Z-axis direction on the stack structure of the plurality of first material layers 221 and the plurality of second material layers 223 and the plurality of sacrificial pillars 225A, 225B, and 225C.

A lowermost third material layer 227 in the stack structure of the plurality of third material layers 227 and the plurality of fourth material layers 229 may be in contact with an uppermost first material layer 221 in the stack structure of the plurality of first material layers 221 and the plurality of second material layers 223. The plurality of third material layers 227 may be configured with the same material as the plurality of second material layers 223, and the plurality of fourth material layers 229 may be configured with the same material as the plurality of first material layers 221.

The plurality of first material layers 221 and the plurality of fourth material layers 229 may be configured with an insulating material for interlayer insulating layers. The plurality of second material layers 223 and the plurality of third material layers 227 may be configured with a material having an etch selectivity with respect to the plurality of first material layers 221 and the plurality of fourth material layers 229. In an embodiment, the plurality of second material layers 223 and the plurality of third material layers 227 may include silicon nitride. The plurality of sacrificial pillars 225A, 225B, and 225C may be configured with a material having an etch selectivity with respect to the plurality of first material layers 221, the plurality of second material layers 223, the plurality of third material layers 227, and the plurality of fourth material layers 229. In an embodiment, the plurality of sacrificial pillars 225A, 225B, and 225C may include a metal such as tungsten.

Figure 10A:
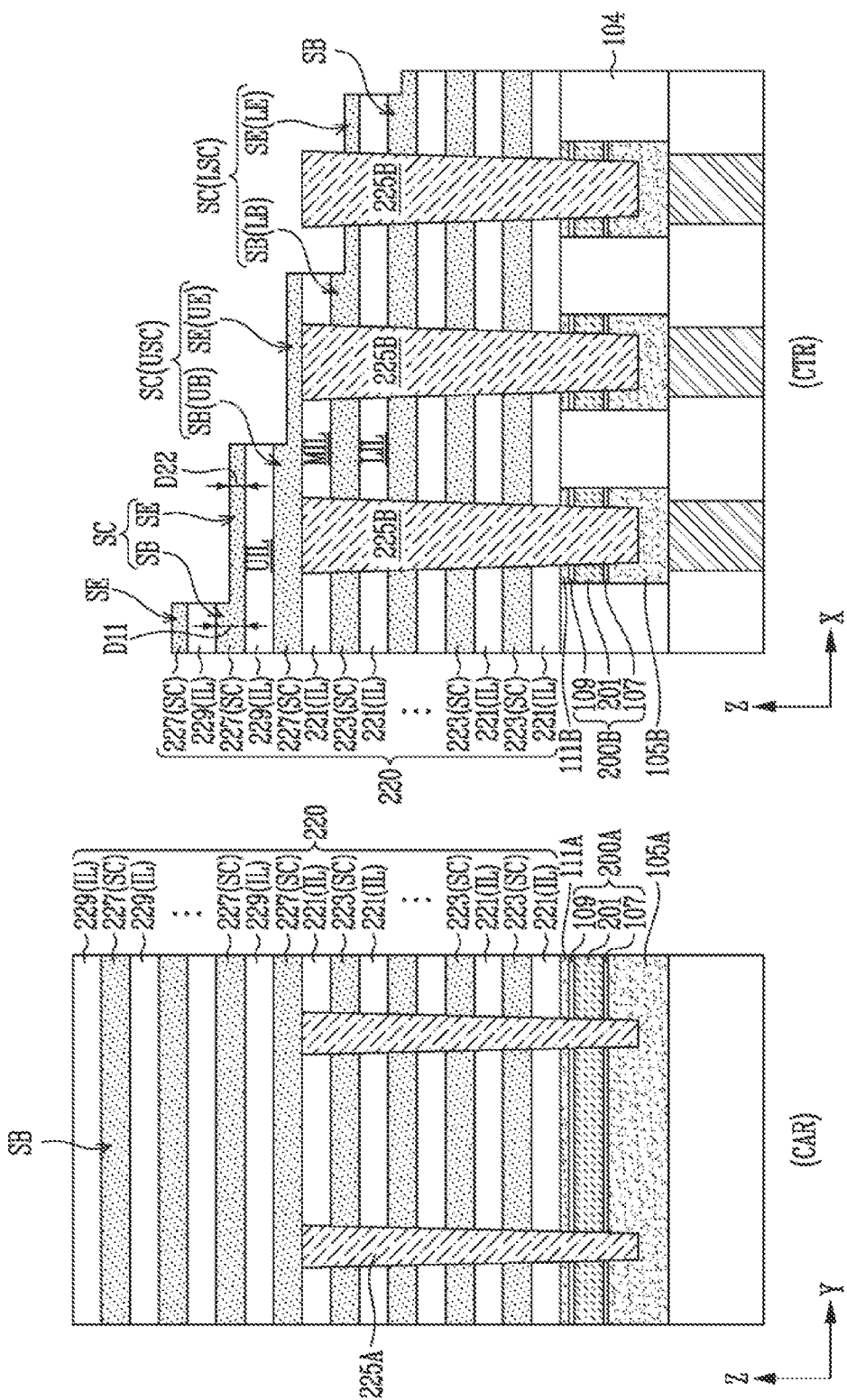
Figure 10B:
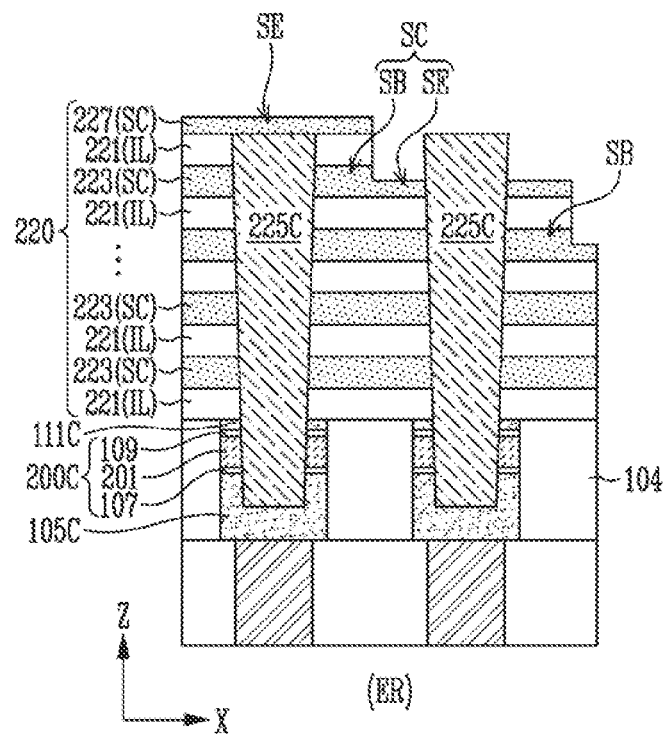

Referring to FIGS. 10A and 10B, the plurality of first material layers 221, the plurality of second material layers 223, the plurality of third material layers 227, and the plurality of fourth material layers 229 may be etched such that a preliminary stepped stack structure 220 is defined. The preliminary stepped stack structure 220 may be configured with a plurality of interlayer insulating layers IL and a plurality of sacrificial layers SC, which are alternately disposed in the Z-axis direction. The plurality of interlayer insulating layers IL may be configured with the plurality of remaining first material layers 221 and the plurality of remaining fourth material layers 229. The plurality of sacrificial layers SC may be configured with the plurality of remaining second material layers 223 and the plurality of remaining third material layers 227. Each of the plurality of interlayer insulating layers IL and the plurality of sacrificial layers SC may have a plate shape extending on an XY plane.

The preliminary stepped stack structure 220 may include a cell region CAR, a contact region CTR extending from the cell region CAR, and an extension region ER extending from the contact region CTR. The preliminary stepped stack structure 220 may form a stepped structure in the contact region CTR and the extension region ER. To this end, the plurality of sacrificial layers SC may be patterned to have a longer length as becoming closer to the second lower insulating layer 104 in the contact region CTR and the extension region ER. In an embodiment, the plurality of sacrificial layers SC may have a longer length in the X-axis direction as becoming closer to the second lower insulating layer 104 in the contact region CTR and the extension region ER.

Each sacrificial layer SC may include a base part SB and an edge part SE extending from the base part SB. The base part SB may be disposed between interlayer insulating layers IL adjacent to each other in the Z-axis direction, and a top surface of the edge part may be opened.

A plurality of base parts SB of the plurality of sacrificial layers SC may overlap with the preliminary horizontal pattern 200A in the cell region CAR.

A plurality of edge parts SE of the plurality of sacrificial layers SC may form the stepped structure in the contact region CTR and the extension region ER. For example, the plurality of interlayer insulating layers IL may include a lower interlayer insulating layer LIL, a middle interlayer insulating layer MIL, and an upper interlayer insulating layer UIL, which are stacked in the Z-axis direction. The plurality of sacrificial layers SC may include a lower sacrificial layer LSC between the lower interlayer insulating layer LIL and the middle interlayer insulating layer MIL and an upper sacrificial layer USC between the middle interlayer insulating layer MIL and the upper interlayer insulating layer UIL. The lower sacrificial layer LSC may include a lower base part LB between the lower interlayer insulating layer LIL and the middle interlayer insulating layer MIL and a lower edge part LE further protruding to a side portion than the middle interlayer insulating layer MIL from the lower base part LB. The upper sacrificial layer USC may include an upper base part UB between the middle interlayer insulating layer MIL and the upper interlayer insulating layer UIL and an upper edge part UE further protruding to a side portion than the upper interlayer insulating layer UIL from the upper base part UB.

The first sacrificial pillar 225A may be buried in the cell region CAR of the preliminary stepped stack structure 220. Some of the plurality of edge parts SE may overlap with some of the plurality of second sacrificial pillars 225B and the plurality of third sacrificial pillars 225C, and other some of the plurality of second sacrificial pillars 225B and the plurality of third sacrificial pillars 225C may further protrude in the Z-axis direction than other some of the plurality of edge parts SE.

Subsequently, a portion of each of the plurality of edge parts SE may be etched such that the plurality of edge parts SE have a thickness D22 thinner than that D11 of the plurality of base parts SB. Accordingly, each of the upper edge part UE and the lower edge part LE may have a thickness thinner than that of each of the upper base part UB and the lower base part LB.

FIGS. 11A, 11B, 12A, 12B, 13A, and 13B are sectional views illustrating a method of forming a contact hole and a dummy hole in accordance with an embodiment of the present disclosure.

Figure 11A:
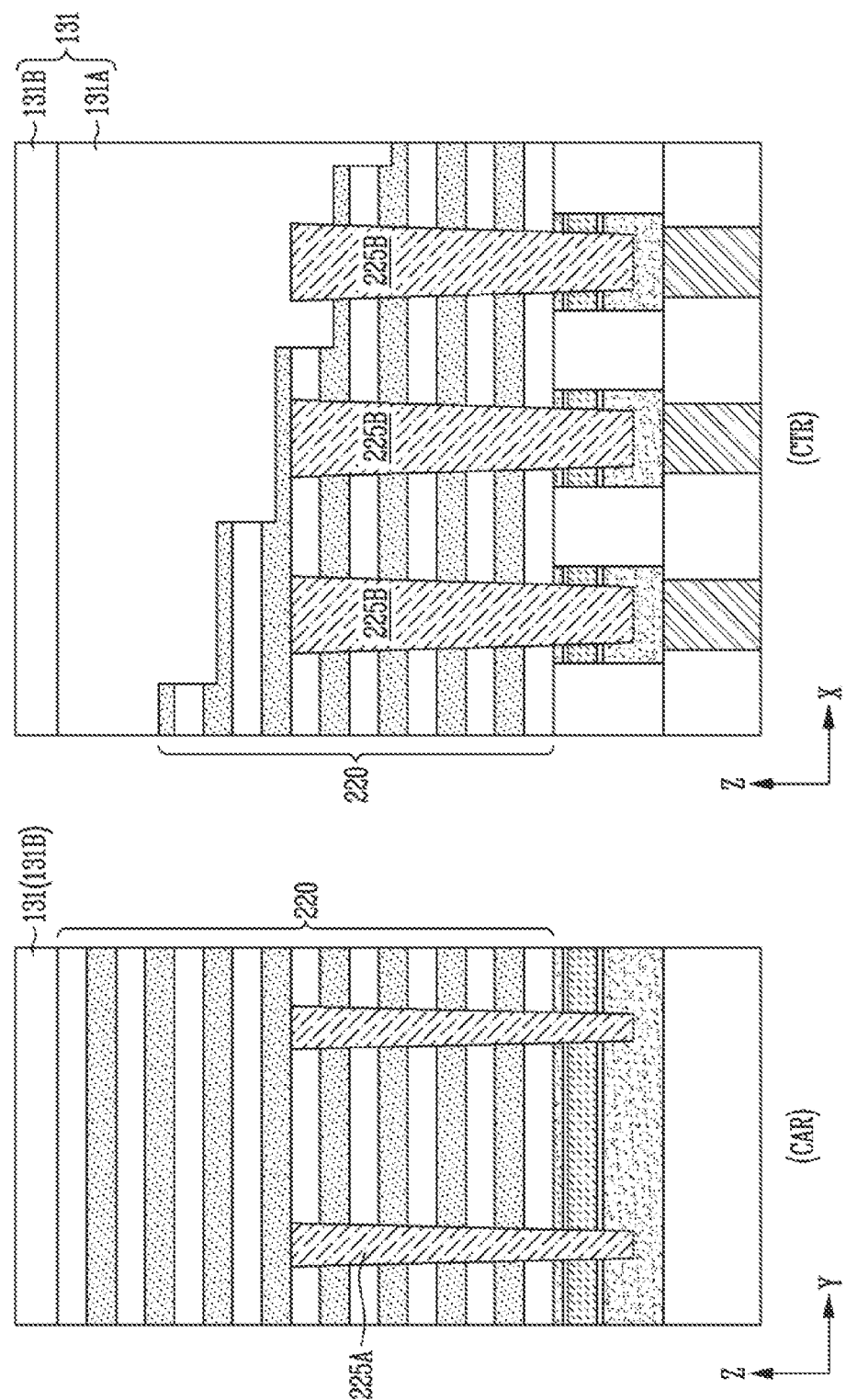
FIGS. 11A, 11B, 12A, 12B, 13A, and 13B are sectional views illustrating a method of forming a contact hole and a dummy hole in accordance with an embodiment of the present disclosure.
Figure 11B:
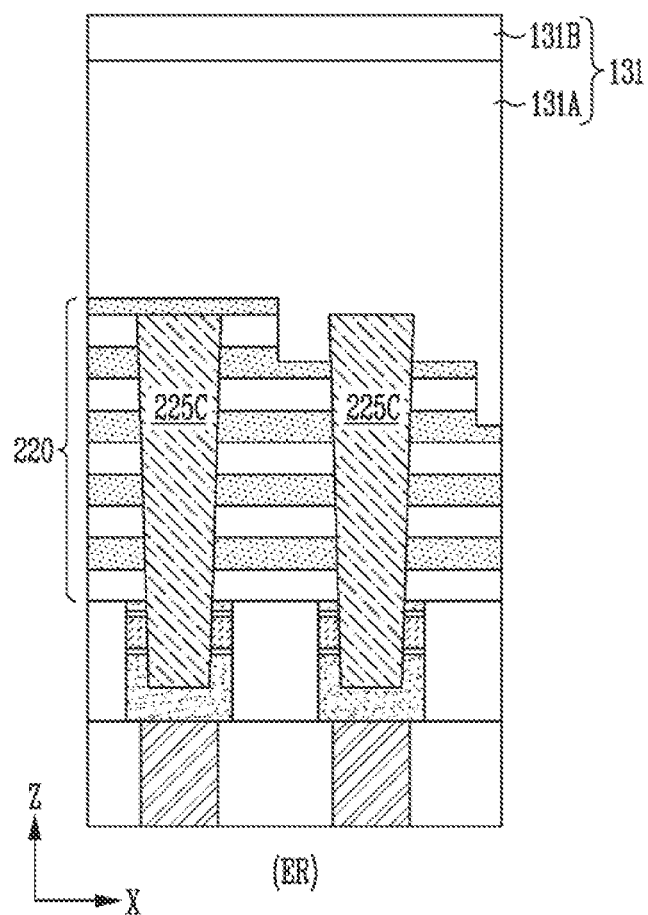

Referring to FIGS. 11A and 11B, a filling insulating layer 131 may be formed over the preliminary stepped stack structure 220. The filling insulating layer 131 may include a first filling insulating layer 131A covering the contact region CTR and the extension region ER of the preliminary stepped stack structure 220 and a second filling insulating layer 131B on the first filling insulating layer 131A. A surface of the first filling insulating layer 131A may be substantially planarized. The second filling insulating layer 131B may extend to cover the cell region CAR of the preliminary stepped stack structure 220.

Figure 12A:
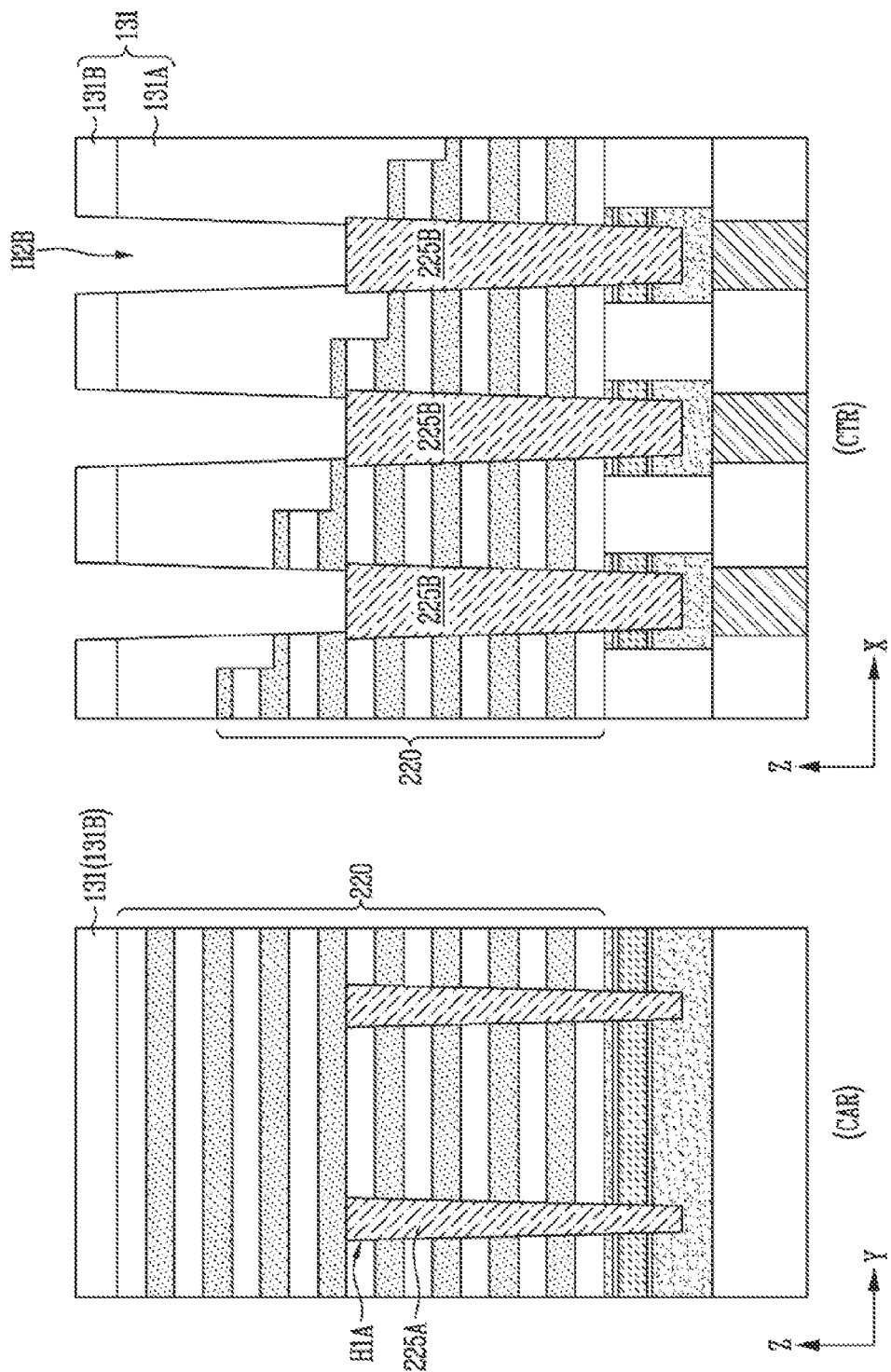
Figure 12B:
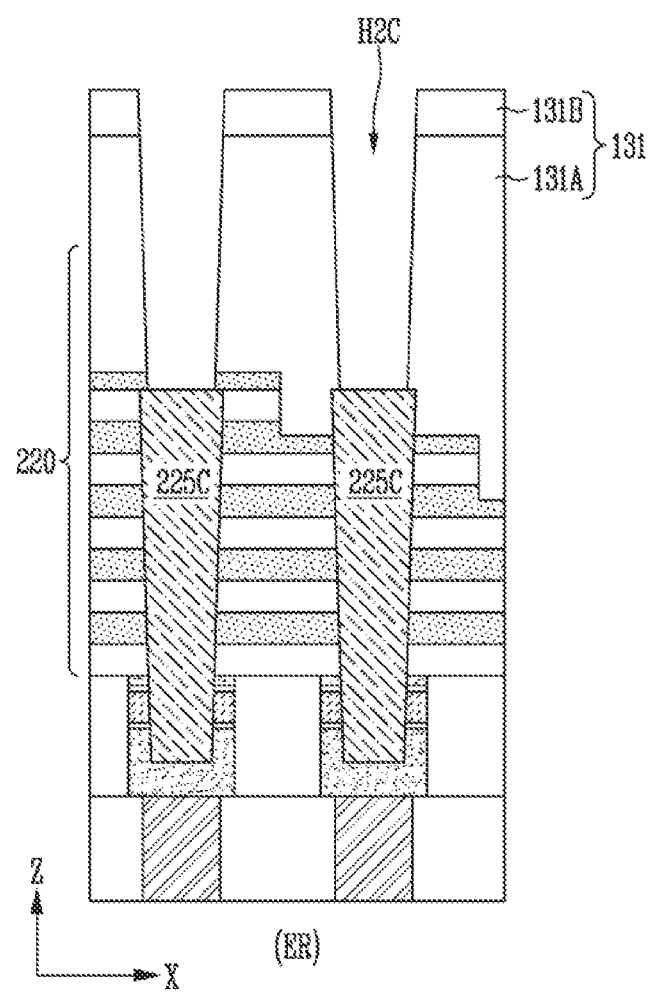

Referring to FIGS. 12A and 12B, the filling insulating layer 131 and the preliminary stepped stack structure 220, which overlap with the plurality of second sacrificial pillars 225B and the plurality of third sacrificial pillars 225C, may be etched. Accordingly, a plurality of second preliminary contact holes H2B and a plurality of second preliminary dummy holes H2C may be formed, which expose the plurality of second sacrificial pillars 225B and the plurality of third sacrificial pillars 225C.

Each second preliminary contact hole H2B may penetrate the filling insulating layer 131 and the contact region CTR of the preliminary stepped stack structure 200, which overlap with a second sacrificial pillar 225B corresponding thereto. Each second preliminary dummy hole H2C may penetrate the filling insulating layer 131 and the extension region ER of the preliminary stepped stack structure 220, which overlap with a third sacrificial pillar 225C corresponding thereto. A width of the second preliminary contact hole H2B may be equal to or different from that of the second preliminary dummy hole H2C. The width of each of the second preliminary contact hole H2B and the second preliminary dummy hole H2C may be formed greater than that of the first preliminary channel hole H1A.

Figure 13A:
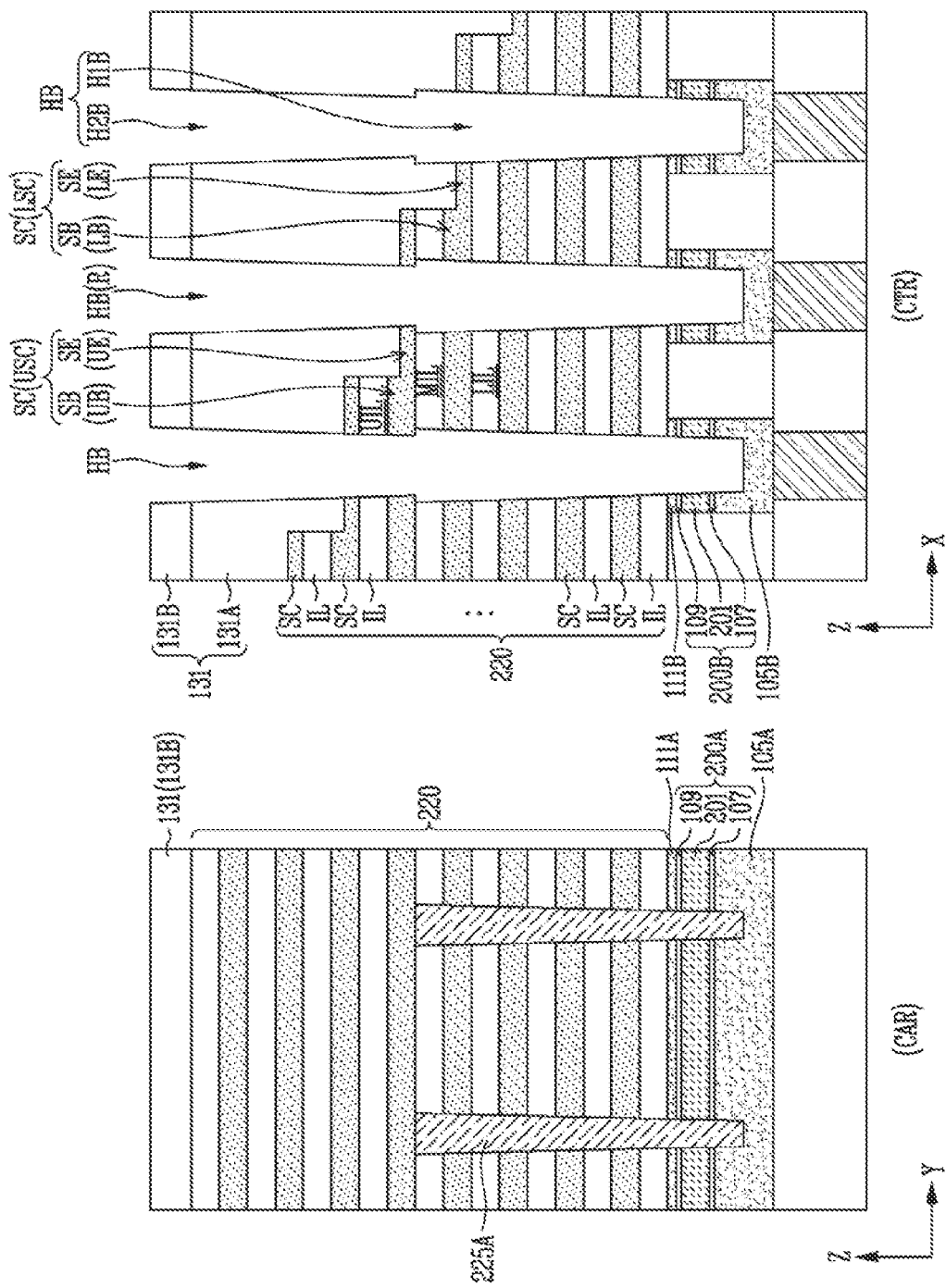
Figure 13B:
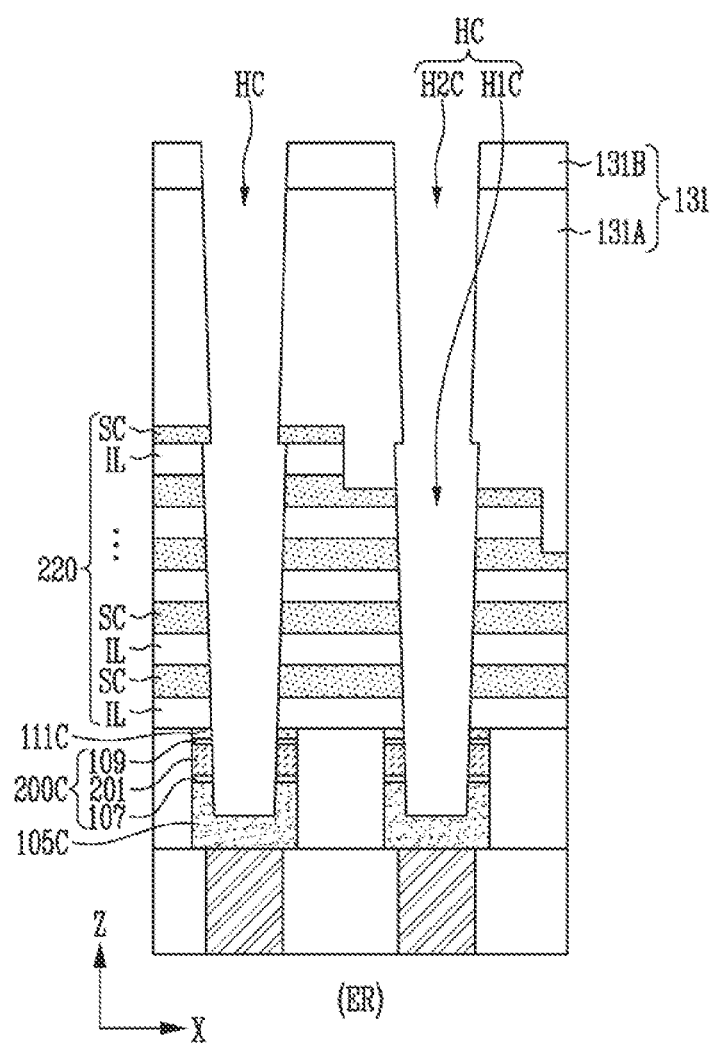

Referring to FIGS. 13A and 13B, the plurality of second sacrificial pillars 225B and the plurality of third sacrificial pillars 225C, which are shown in FIGS. 12A and 12B, may be removed through the plurality of second preliminary contact holes H2B and the plurality of second preliminary dummy holes H2C. Accordingly, the plurality of first preliminary contact holes H11B and the plurality of first preliminary dummy holes H1C may be opened. The plurality of first preliminary contact holes H1B may be respectively connected to the plurality of second preliminary contact holes H2B, and accordingly, a plurality of contact holes HB may be defined. The plurality of first preliminary dummy holes H1C may be connected to the plurality of second preliminary dummy holes H2C, and accordingly, a plurality of dummy holes HC may be defined.

The plurality of edge parts SE of the plurality of sacrificial layers SC may be respectively penetrated by the plurality of contact holes HB and the plurality of dummy holes HC.

Each contact hole HB may penetrate the contact region CTR of the preliminary stepped stack structure 220, a second semiconductor pattern 111B corresponding thereto, and a preliminary contact structure 200B corresponding thereto, and extend to the inside of a first semiconductor pattern 105B corresponding thereto. Each dummy hole HC may penetrate the extension region ER of the preliminary stepped stack structure 220, a second semiconductor pattern 111C corresponding thereto, and a preliminary dummy structure 200G corresponding thereto, and extend to the inside of a first semiconductor pattern 105C corresponding thereto. A width of the contact hole HB may be equal to or different from that WC of the dummy hole HC.

Hereinafter, the structure of a contact hole penetrating the upper sacrificial layer USC, the middle interlayer insulating layer MIL, the lower sacrificial layer LSC, and the lower interlayer insulating layer LIL, which are defined with reference to FIG. 10A, based on a reference hole R among the plurality of contact holes HB, will be described in more detail. The reference hole R may be spaced apart from the upper interlayer insulating layer UIL. The reference hole R may penetrate the upper edge part UE of the upper sacrificial layer USC and the lower base part LB of the lower sacrificial layer LSC.

FIGS. 14A, 14B, 15A, 15B, 16A, 16B, 17A, and 17B are sectional views illustrating a method of forming a sacrificial pad and a contact insulating pattern in accordance with an embodiment of the present disclosure.

Figure 14A:
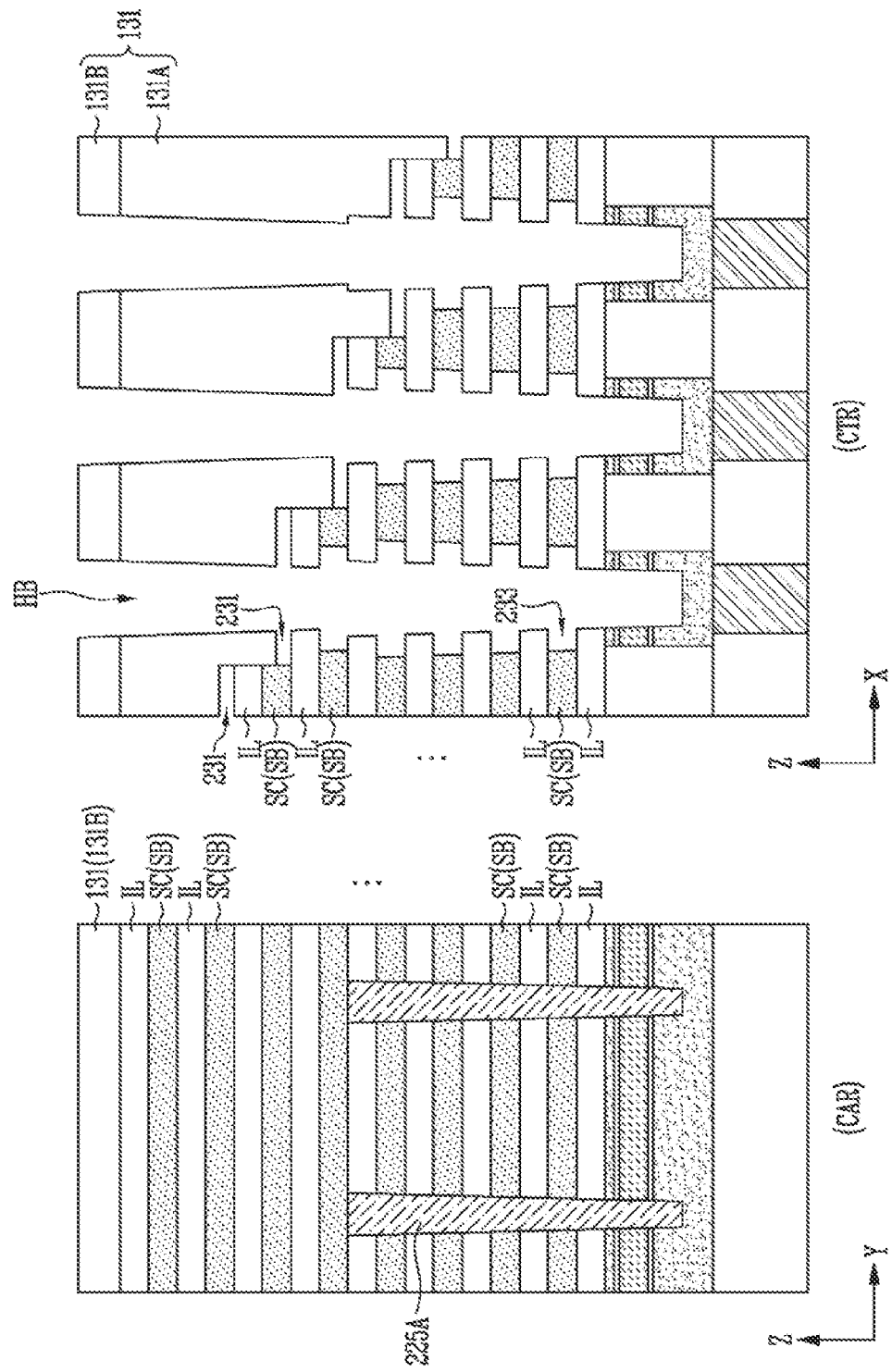
Figure 14B:
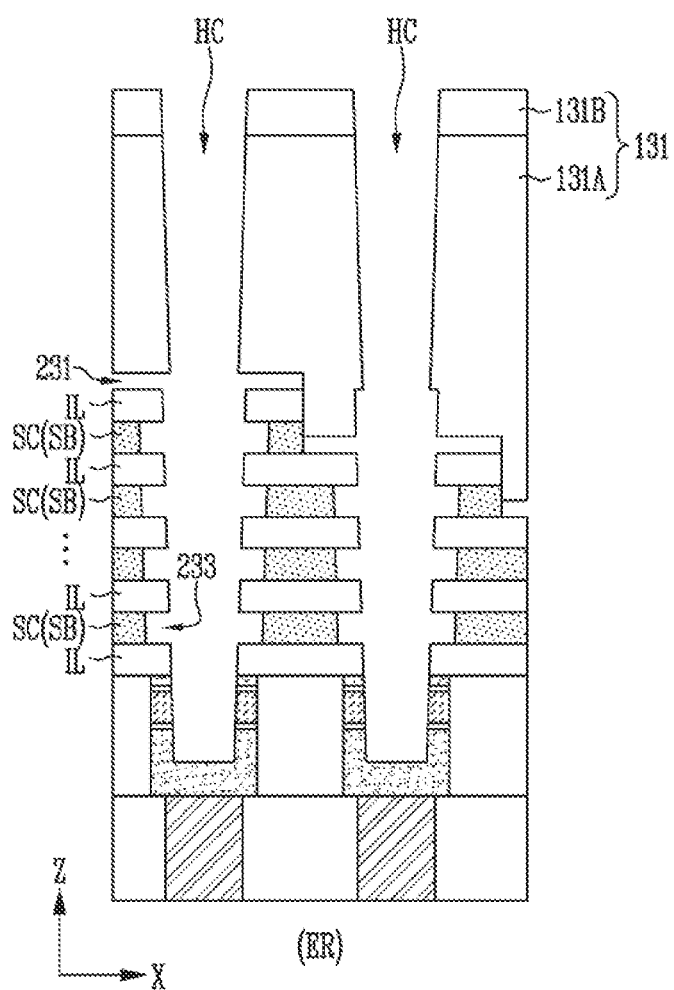

Referring to FIGS. 14A and 14B, the plurality of edge parts SE of the plurality of sacrificial layers SC shown in FIGS. 13A and 13B may be removed through the contact hole HB and the dummy hole HC. Accordingly, a plurality of first recess regions 231 may be defined in regions in which the plurality of edge parts SE are removed. While the plurality of edge parts SE are removed, the plurality of base parts SB may be etched through the contact hole HB and the dummy hole HC. Accordingly, a plurality of second recess regions 233 may be defined in regions in which the plurality of base parts SB are removed. Due to a thickness difference between the edge part SE and the base part SB, the first recess region 231 may be defined narrower in the Z-axis direction than the second recess region 233.

Figure 15B:
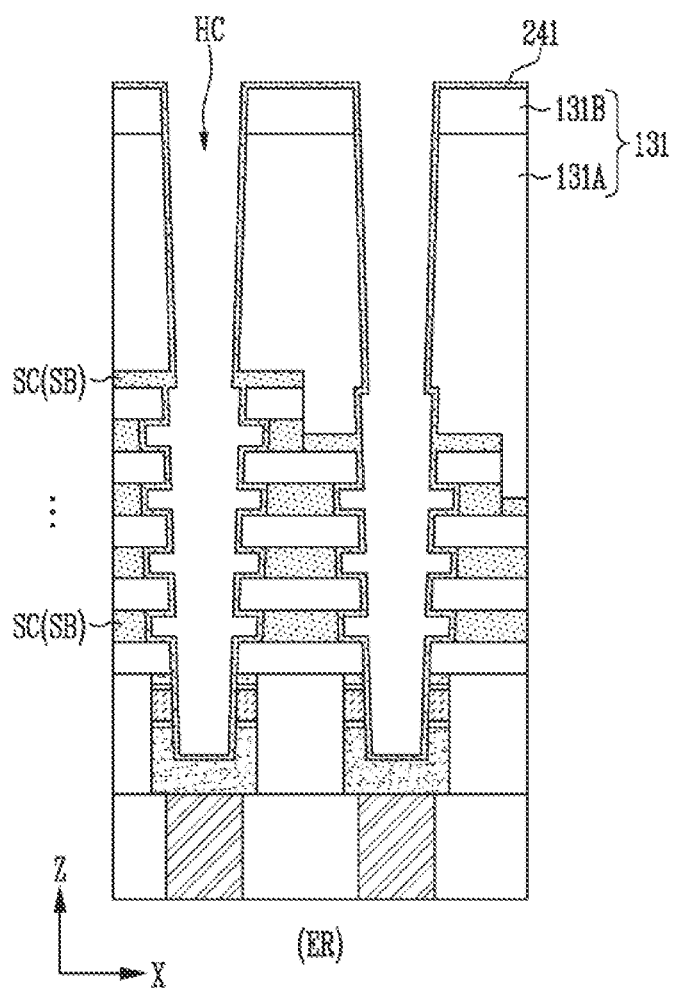

Referring to FIGS. 15A and 15B, a sacrificial pad layer 241 may be formed along surfaces of the first recess region 231, the second recess region 233, the contact hole HB, and the dummy hole HC. The sacrificial pad layer 241 may extend along a surface of the filling insulating layer 131.

The sacrificial pad layer 241 may be formed of the same material as the plurality of sacrificial layers SC. The sacrificial pad layer 241 may fill the plurality of first recess regions 231 having a relatively narrow width. The sacrificial pad layer 241 may extend along surfaces of the plurality of second recess regions 233. The second recess region 233 having a relatively wide width is not completely filled with the sacrificial pad layer 241, but a central region of the second recess region 233 may be opened.

Figure 16A:
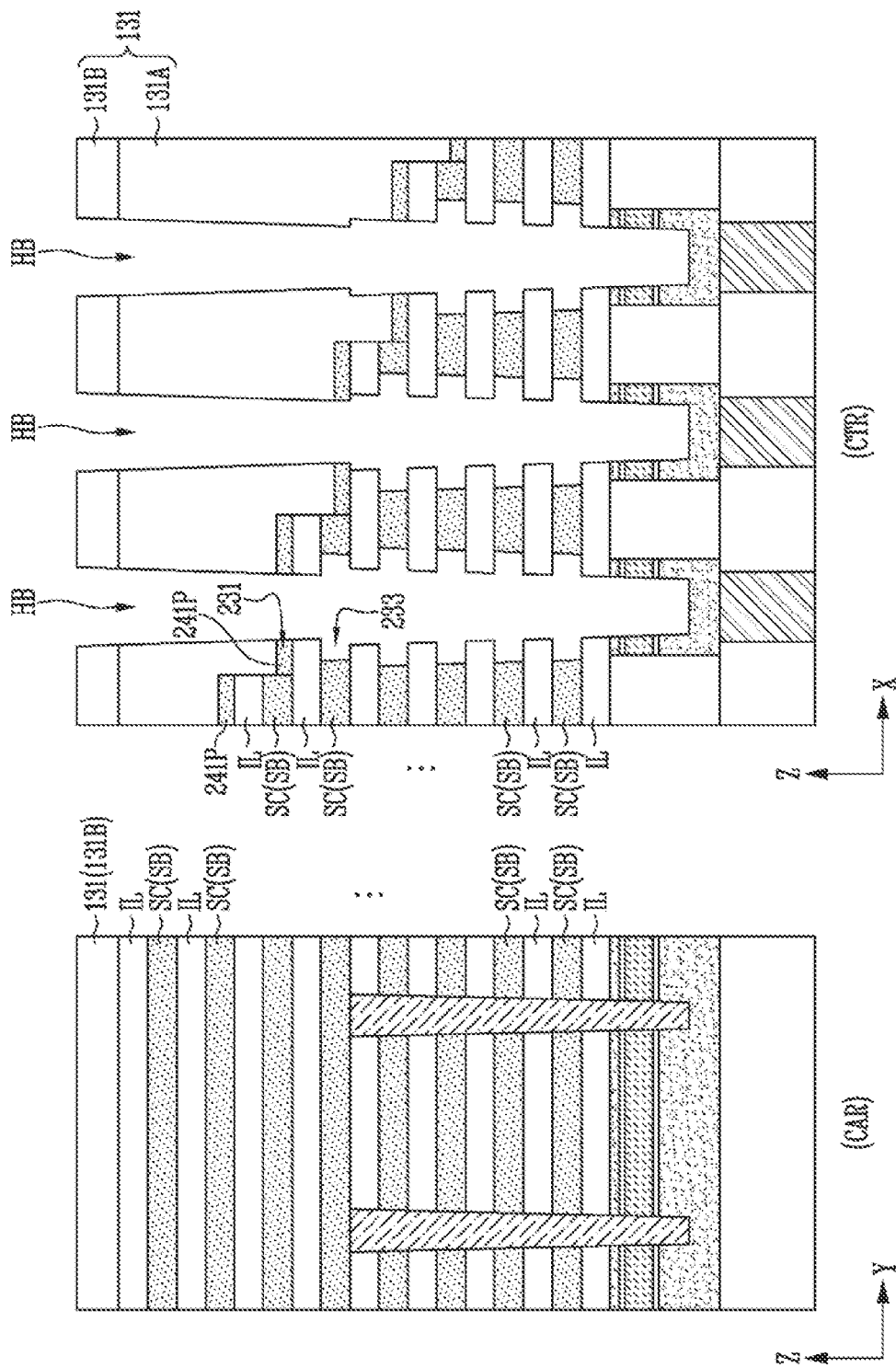
Figure 16B:
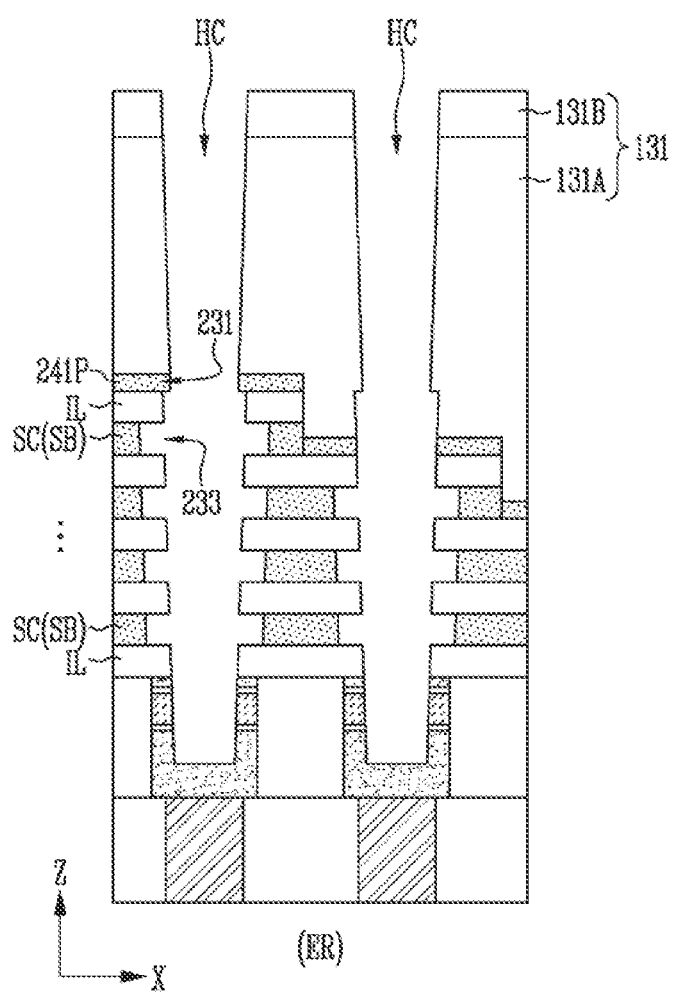

Referring to FIGS. 16A and 16B, the sacrificial pad layer 241 shown in FIGS. 15A and 15B may be etched to be isolated into a plurality of sacrificial pads 241P. Each sacrificial pad 241P may remain in a first recess region 231 corresponding thereto. The plurality of second recess regions 233 may be opened through an etching process of the sacrificial pad layer 241.

Figure 17B:
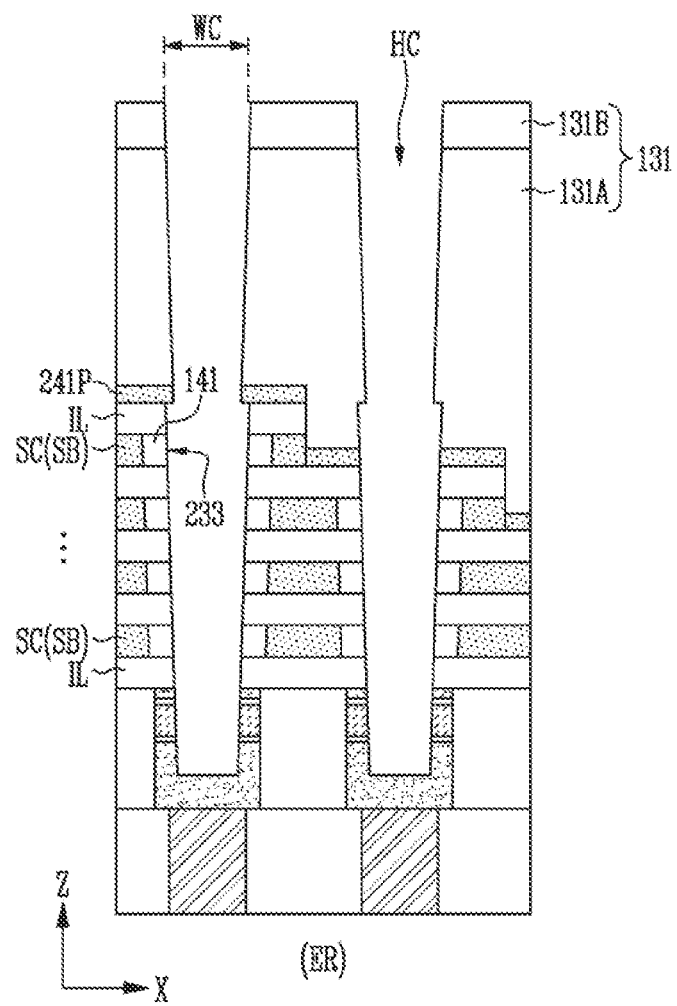

Referring to FIGS. 17A and 17B, the plurality of second recess regions 233 may be respectively filled with a plurality of contact insulating patterns 141 through the contact hole HB and the dummy hole HC. The plurality of contact insulating patterns 141 may include a material having an etch selectivity with respect to the plurality of sacrificial layers SC and the plurality of sacrificial pads 241P.

As described above, the edge part SE of the sacrificial layer SC shown in FIGS. 13A and 13B may be replaced with the sacrificial pad 241P as shown in FIGS. 17A and 17B, and a portion of the base part SB of the sacrificial layer SC shown in FIGS. 13A and 13B may be replaced with the contact insulating pattern 141. The contact insulating pattern 141 may be automatically aligned at a target position by using a thickness difference between the base part SB and the edge part SE of the sacrificial layer SC shown in FIGS. 13A and 13B. More specifically, the contact insulating pattern 141 may be automatically aligned to overlap with the sacrificial pad 241P. Also, the contact insulating pattern 141 may be automatically aligned between the interlayer insulating layers IL. Also, the contact insulating pattern 141 may be automatically aligned on a sidewall of the base part SB of the sacrificial layer SC, which faces each of the contact hole HB and the dummy hole HC.

Figure 18:
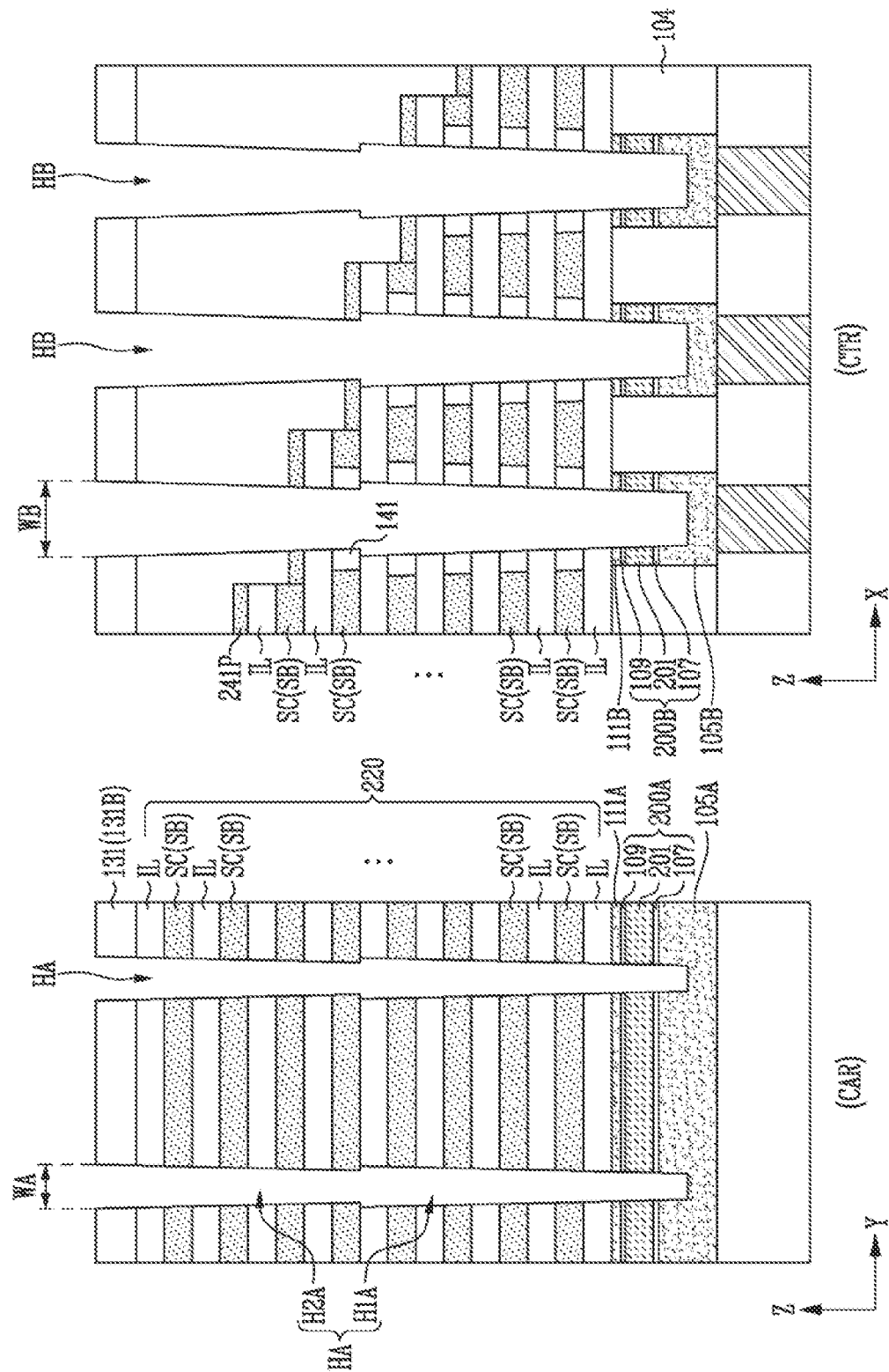
FIG. 18 is a sectional view illustrating a method of forming a channel hole in accordance with an embodiment of the present disclosure.

FIG. 18 is a sectional view illustrating a method of forming a channel hole in accordance with an embodiment of the present disclosure.

Referring to FIG. 18, the filling insulating layer 131 and the cell region CAR of the preliminary stepped stack structure 220, which overlap with the first sacrificial pillar 225A shown in FIG. 17A, may be etched. Accordingly, a second preliminary channel hole H2A may be formed, which exposes the first sacrificial pillar 225A shown in FIG. 17A.

Subsequently, the first sacrificial pillar 225A shown in FIG. 17A may be removed through the second preliminary channel hole H2A. Accordingly, the first preliminary channel hole H1A may be opened. The second preliminary channel hole H2A may be connected to the first preliminary channel hole H1A, and accordingly, a channel hole HA may be defined. The channel hole HA might not only penetrate the plurality of base parts SB of the plurality of sacrificial layers SC and the plurality of interlayer insulating layers IL but also penetrate a second semiconductor pattern 111A corresponding thereto. Also, the channel hole HA may penetrate the preliminary horizontal pattern 200A, and extend to the inside of a first semiconductor pattern 105A corresponding thereto. A width WA of the channel hole HA may be narrower than that WB of the contact hole HB and that WC of the dummy hole shown in FIG. 17B.

FIGS. 19A, 19B, 20A, 20B, 21, 22A, and 22B are sectional views illustrating a method of forming a preliminary memory pattern, a channel structure, a first support structure, and a second support structure in accordance with an embodiment of the present disclosure.

Figure 19A:
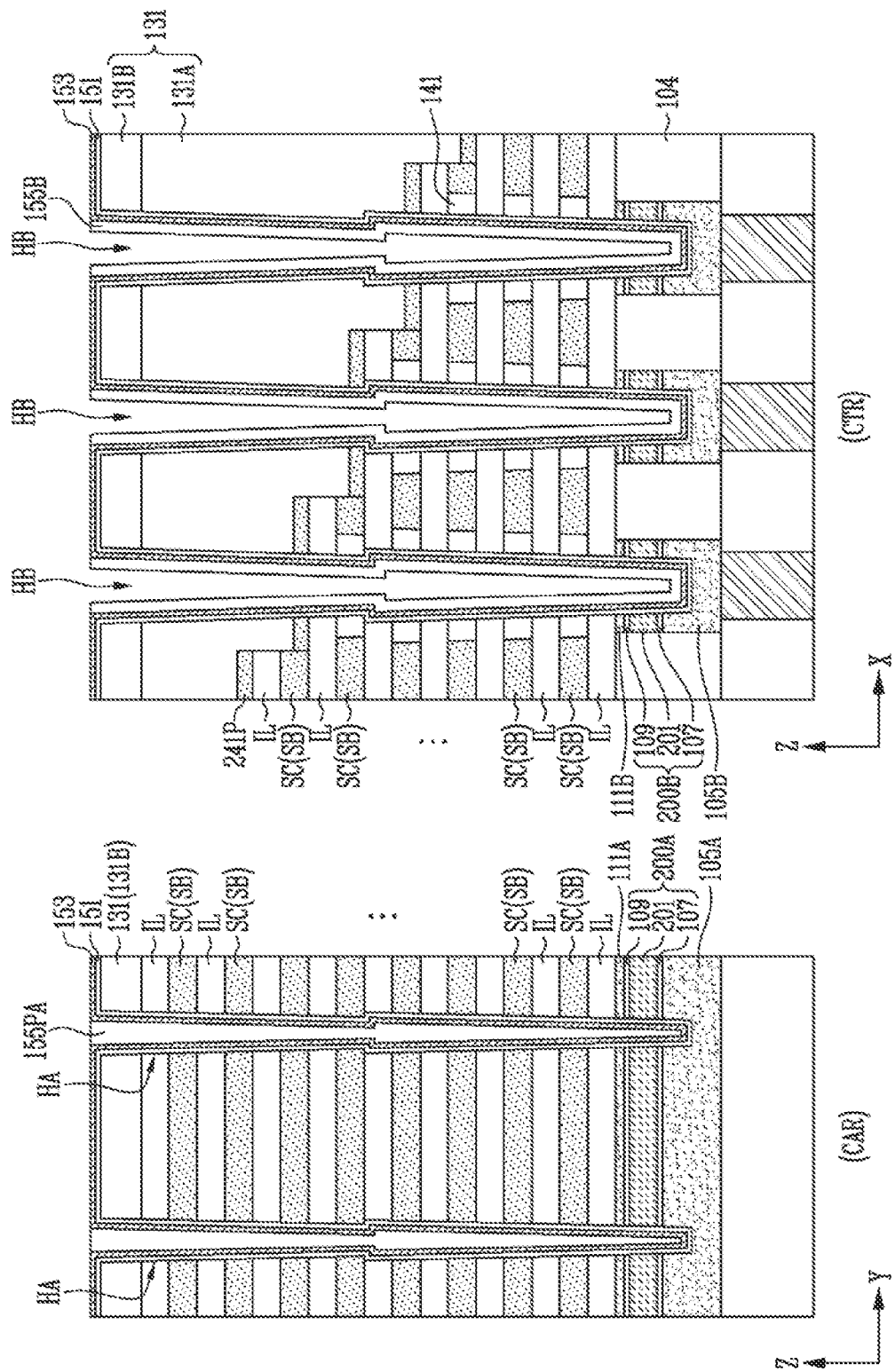
FIGS. 19A, 19B, 20A, 20B, 21, 22A, and 22B are sectional views illustrating a method of forming a preliminary memory pattern, a channel structure, a first support structure, and a second support structure in accordance with an embodiment of the present disclosure.
Figure 19B:
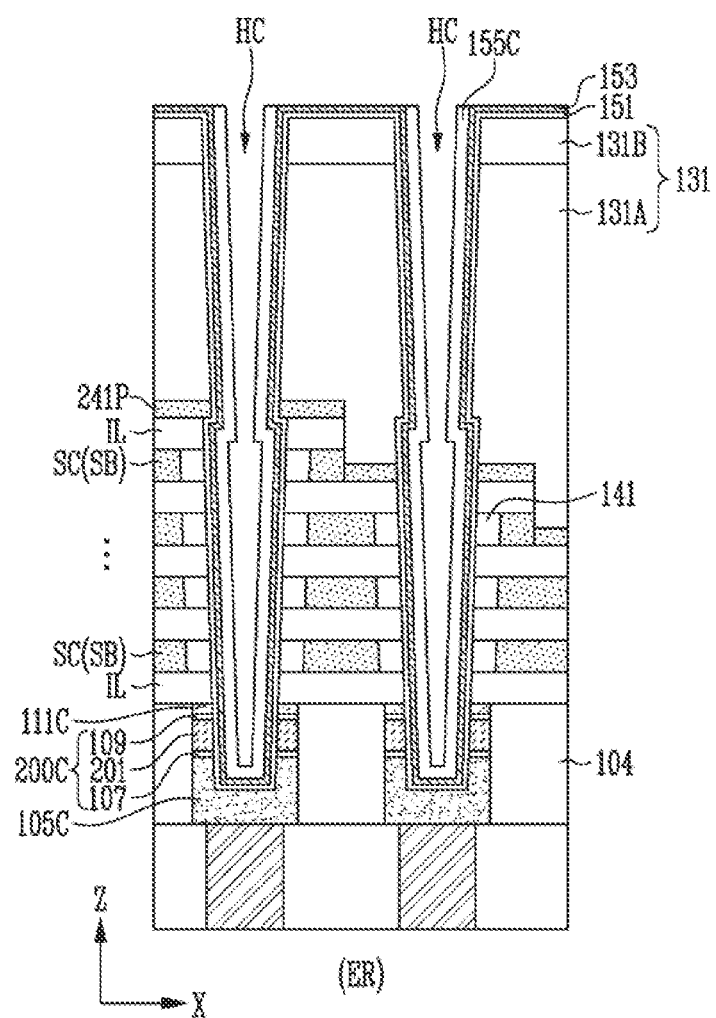

Referring to FIGS. 19A and 19B, a memory layer 151 may be formed along a surface of each of the channel hole HA, the plurality of contact holes HB, and the plurality of dummy holes HC. A first blocking insulating layer, a data storage layer, and a tunnel insulating layer may be sequentially stacked, thereby forming the memory layer 151. A sidewall of the contact insulating pattern 141 and a sidewall of the sacrificial pad 241P may be covered by the memory layer 151.

Subsequently, a channel layer 153 may be formed along a surface of the memory layer 151. A central region of each of the channel hole HA, the plurality of contact holes HB, and the plurality of dummy holes HC is not completely filled with the channel layer 153, but a portion of the central region may be opened.

Subsequently, a process of forming an insulating material on a surface of the channel layer 153 and a process of planarizing the insulating material to expose the channel layer 153 may be performed. Accordingly, the insulating material may be isolated into a preliminary core insulating pattern 155PA in the channel hole HA, a plurality of first dummy core insulating patterns 155B in the plurality of contact holes HB, and a plurality of second dummy core insulating patterns 155C in the plurality of dummy holes HC. The central region of the channel hole HA may be filled with the preliminary core insulating pattern 155PA. Since the contact hole HB is formed wider than the channel hole HA, the central region of the contact hole HB is not completely filled with the first dummy core insulating pattern 155B, but a portion of the central region may be opened. Since the dummy hole HC is formed wider than the channel hole HA, the central region of the dummy hole HC is not completely filled with the second dummy core insulating pattern 155C, but a portion of the central region may be opened.

Figure 20A:
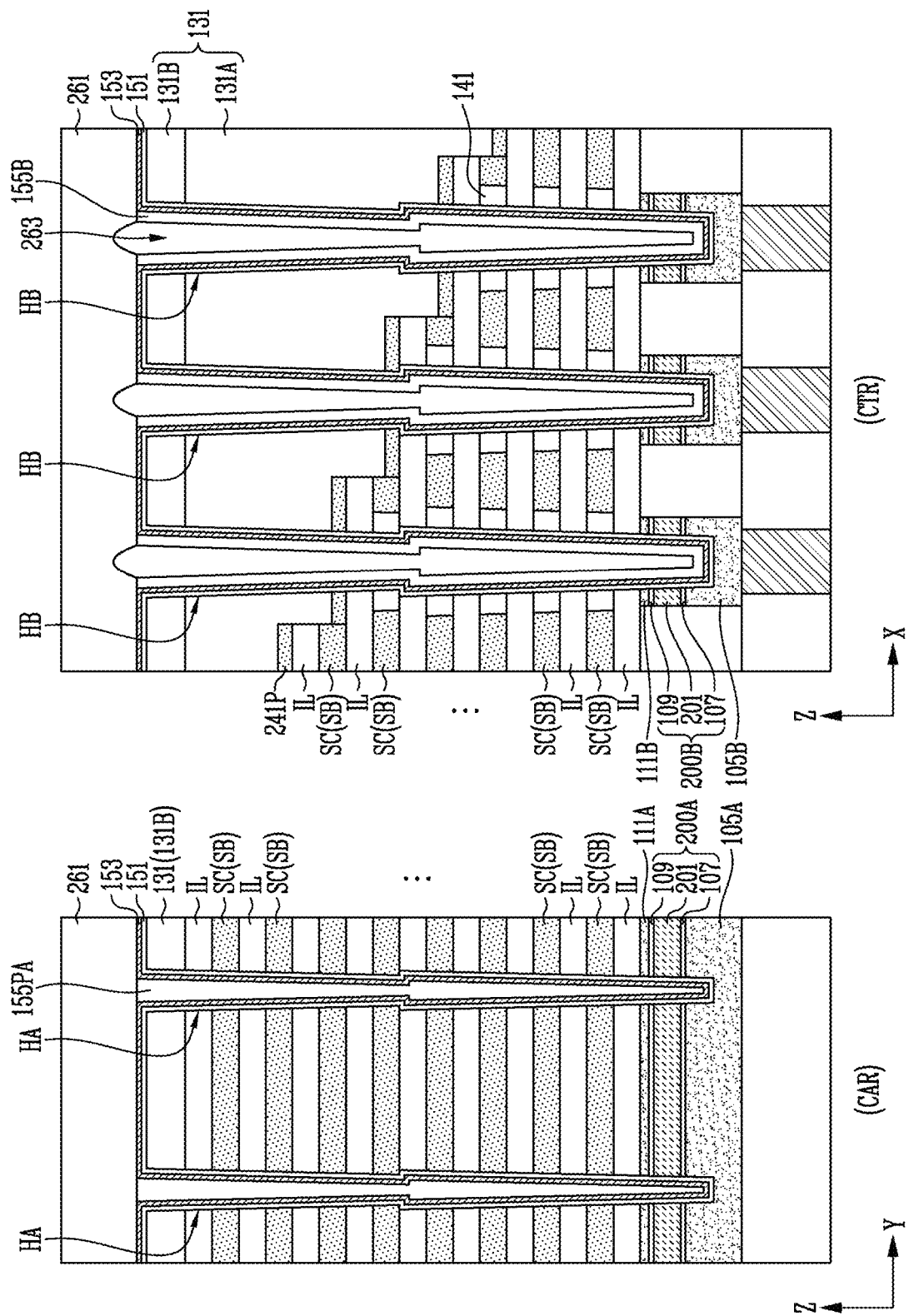
Figure 20B:
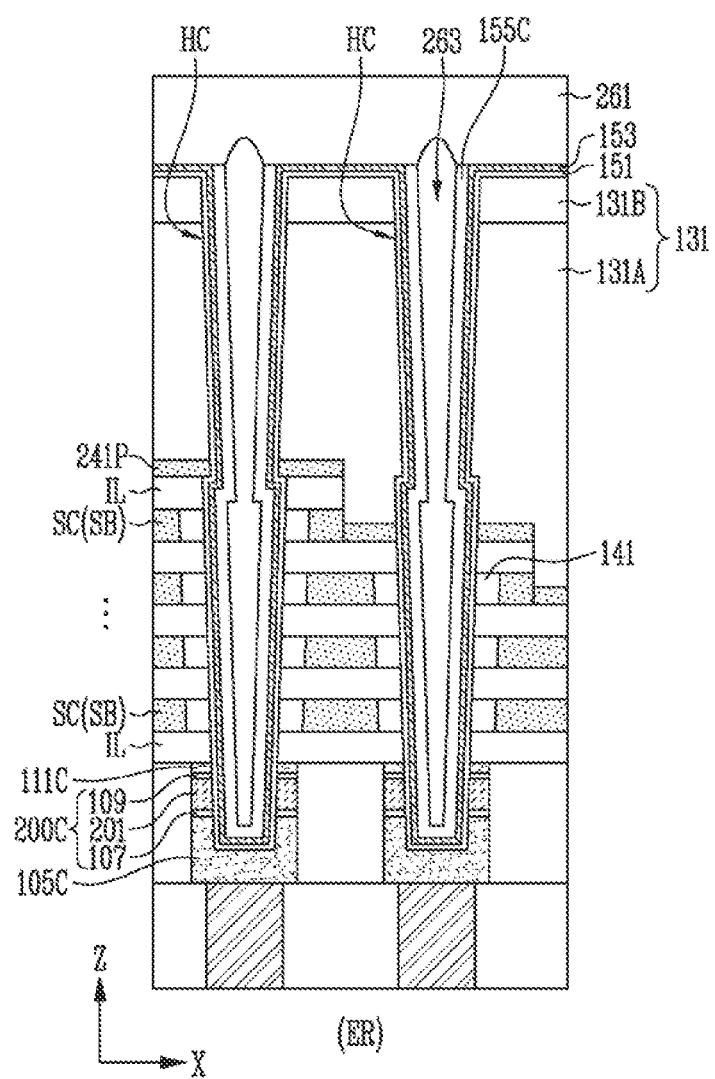

Referring to FIGS. 20A and 20B, a first upper protective layer 261 may be formed on the channel layer 153. The first upper protective layer 261 may be formed by using a deposition process having a low step coverage such that a void 263 can be defined in the central region of each of the contact hole HB and the dummy hole HC. In an embodiment, the first upper protective layer 261 may be formed through plasma-enhanced chemical vapor deposition (PECVD). For example, the first upper protective layer 261 may be formed through plasma-enhanced tetraethyl orthosilicate (PETEOS). The embodiment of the present disclosure is not limited thereto.

Figure 21:
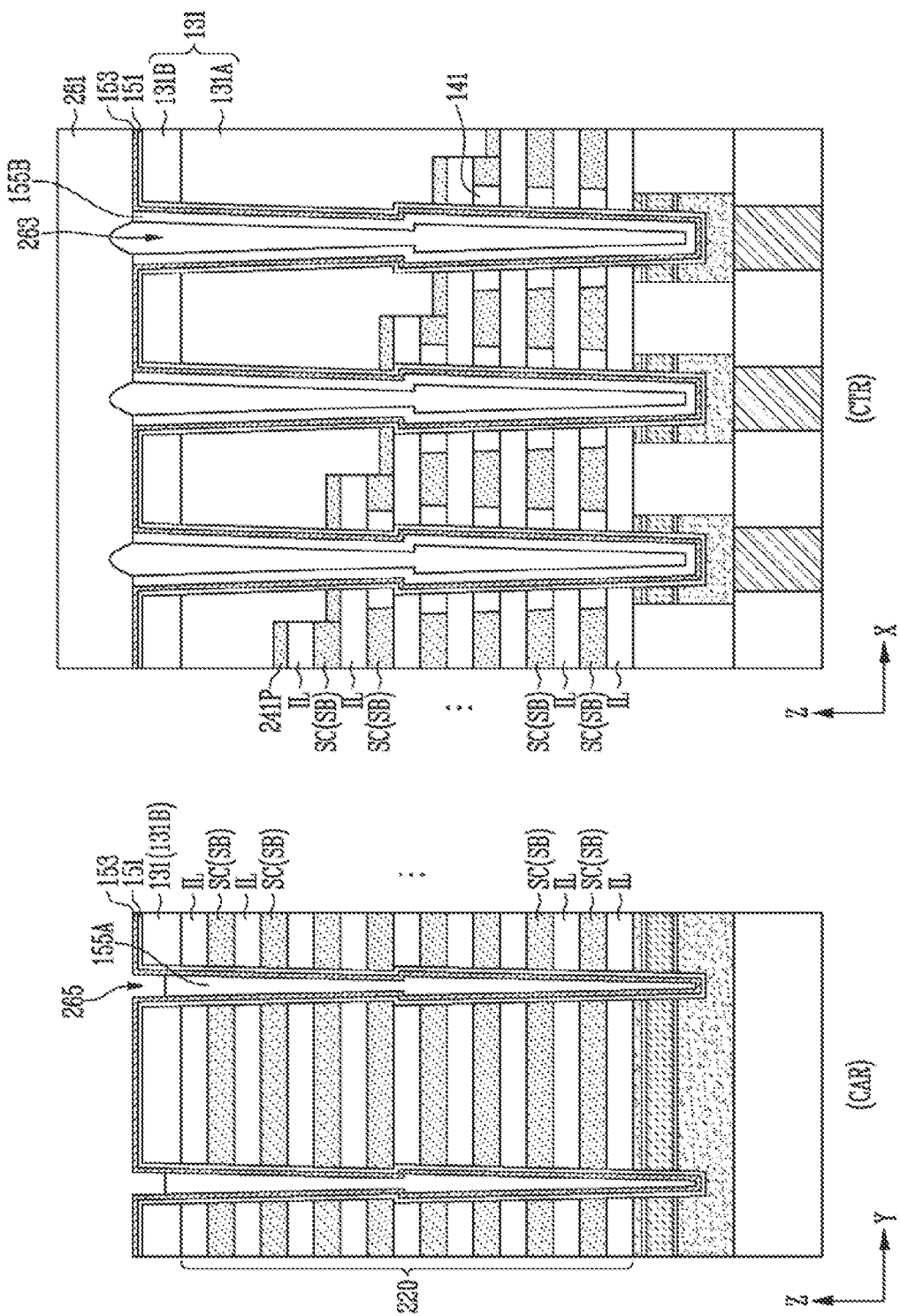

Referring to FIG. 21, a portion of the first upper protective layer 261, which overlaps with the cell region CAR of the preliminary stepped stack structure 220, may be removed. To this end, a mask pattern (not shown) which opens the cell region CAR of the preliminary stepped stack structure 220 and blocks the contact region CTR and the extension region of the preliminary stepped stack structure 220 may be used as an etching barrier. Accordingly, a portion of the preliminary core insulating pattern 155PA shown in FIG. 20A may be exposed. Subsequently, the exposed portion of the preliminary core insulating pattern may be removed, thereby defining a core insulating pattern 155A and a core groove 265. The mask pattern may be removed after the core insulating pattern 155A is formed.

The first dummy core insulating pattern 155B penetrating the contact region CTR of the preliminary stepped stack structure 220 and the second dummy core insulating pattern 155C penetrating the extension region ER of the preliminary stepped stack structure 220 shown in FIG. 20B may be protected by the first upper protective layer.

Figure 22A:
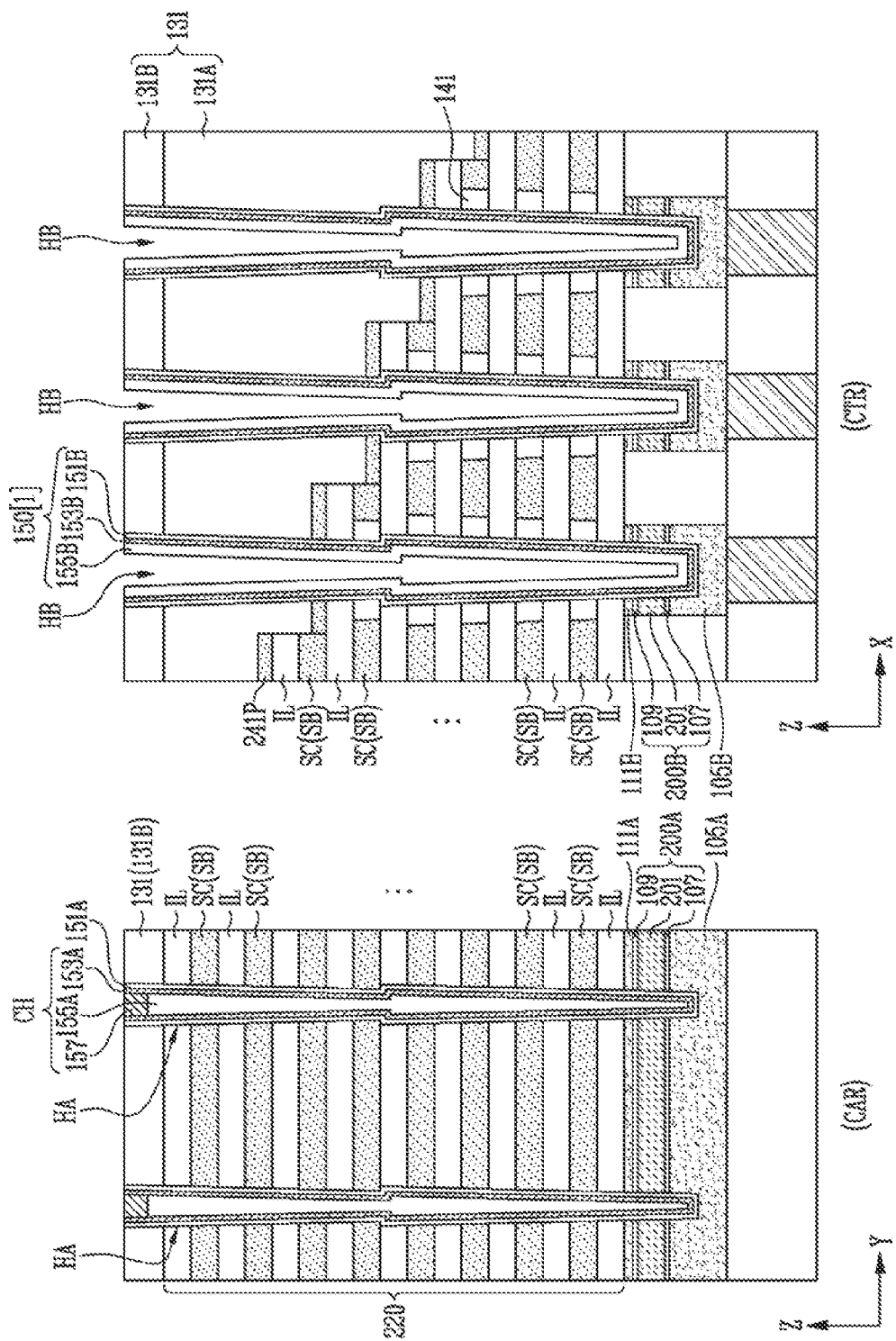
Figure 22B:
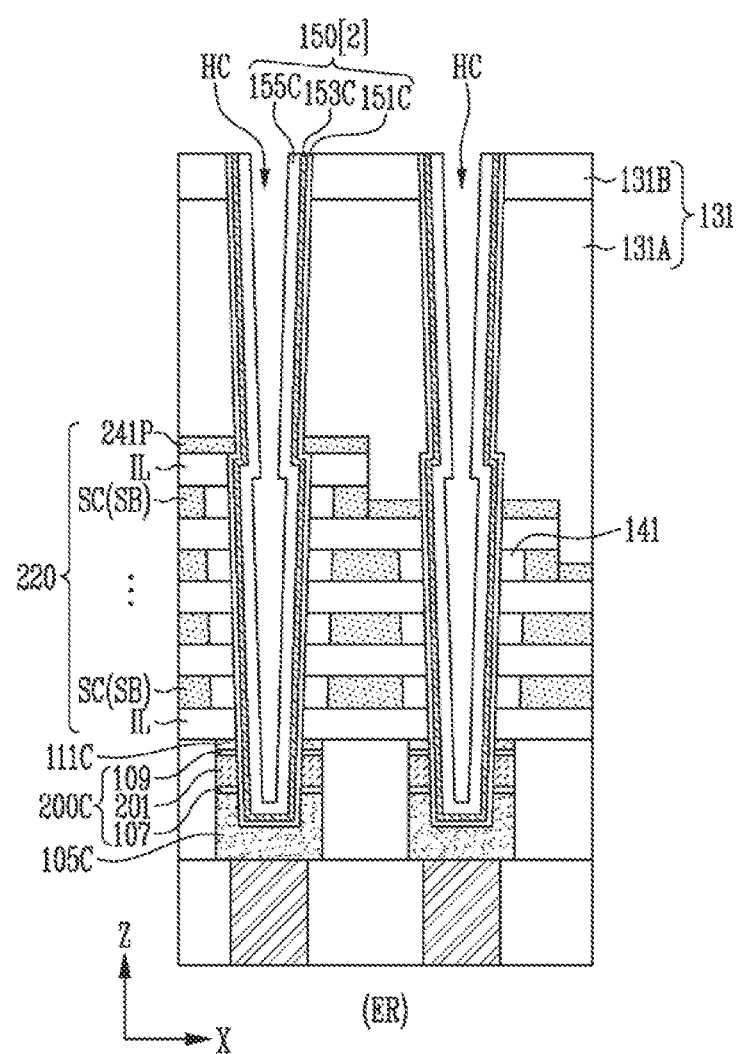

Referring to FIGS. 22A and 22B, a capping pattern 157 may be formed to fill the core groove 265 shown in FIG. 21. The process of forming the capping pattern 157 may include a process of filling the core groove 265 shown in FIG. 21 with a doped semiconductor material and a process of planarizing the doped semiconductor material to expose the filling insulating layer 131. The first upper protective layer 261 shown in FIG. 21 is removed through planarization, so that the central region of each of the contact hole HB and the dummy hole HC can be opened.

Through planarization, the channel layer 153 shown in FIG. 21 may be isolated into a cell channel layer 153A, a plurality of first dummy channel layers 153B, and a plurality of second dummy channel layers 153C. Through planarization, the memory layer 151 shown in FIG. 21 may be isolated into a memory pattern 151A, a plurality of first dummy memory patterns 151B, and a plurality of second dummy memory patterns 151C.

Through the above-described processes, the channel hole HA may be filled with the memory pattern 151A and a channel structure CH. The channel structure CH may include the cell channel layer 153A, the core insulating pattern 155A, and the capping pattern 157. In addition, a first support structure 150[1] may be formed in the contact hole HB. The first support structure 150[1] may include a first dummy memory pattern 151B, a first dummy channel layer 153B, and a first dummy core insulating pattern 155B. In addition, a second support structure 150[2] may be formed in the dummy hole HC. The second support structure 150[2] may include a second dummy memory pattern 151C, a second dummy channel layer 153C, and a second dummy core insulating pattern 155C.

The first support structure 150[1] may penetrate the contact region CTR of the preliminary stepped stack structure 220, and extend to the inside of a preliminary contact structure 200B corresponding thereto. The second support structure 150[2] may penetrate the extension region ER of the preliminary stepped stack structure 220, and extend to the inside of a preliminary dummy structure 200G corresponding thereto. Each of the first support structure 150[1] and the second support structure 150[2] may be surrounded by the contact insulating pattern 141 and the sacrificial pad 241P. The first support structure 150[1] and the second support structure 150[2] are formed by using a process of forming the memory pattern 151A and the channel structure CH, and thus manufacturing processes of the semiconductor memory device can be simplified.

FIGS. 23A, 23B, 24A, 24B, 25A, and 25B are sectional views illustrating a method of forming a blocking insulating layer and a conductive pattern in accordance with an embodiment of the present disclosure.

Figure 23A:
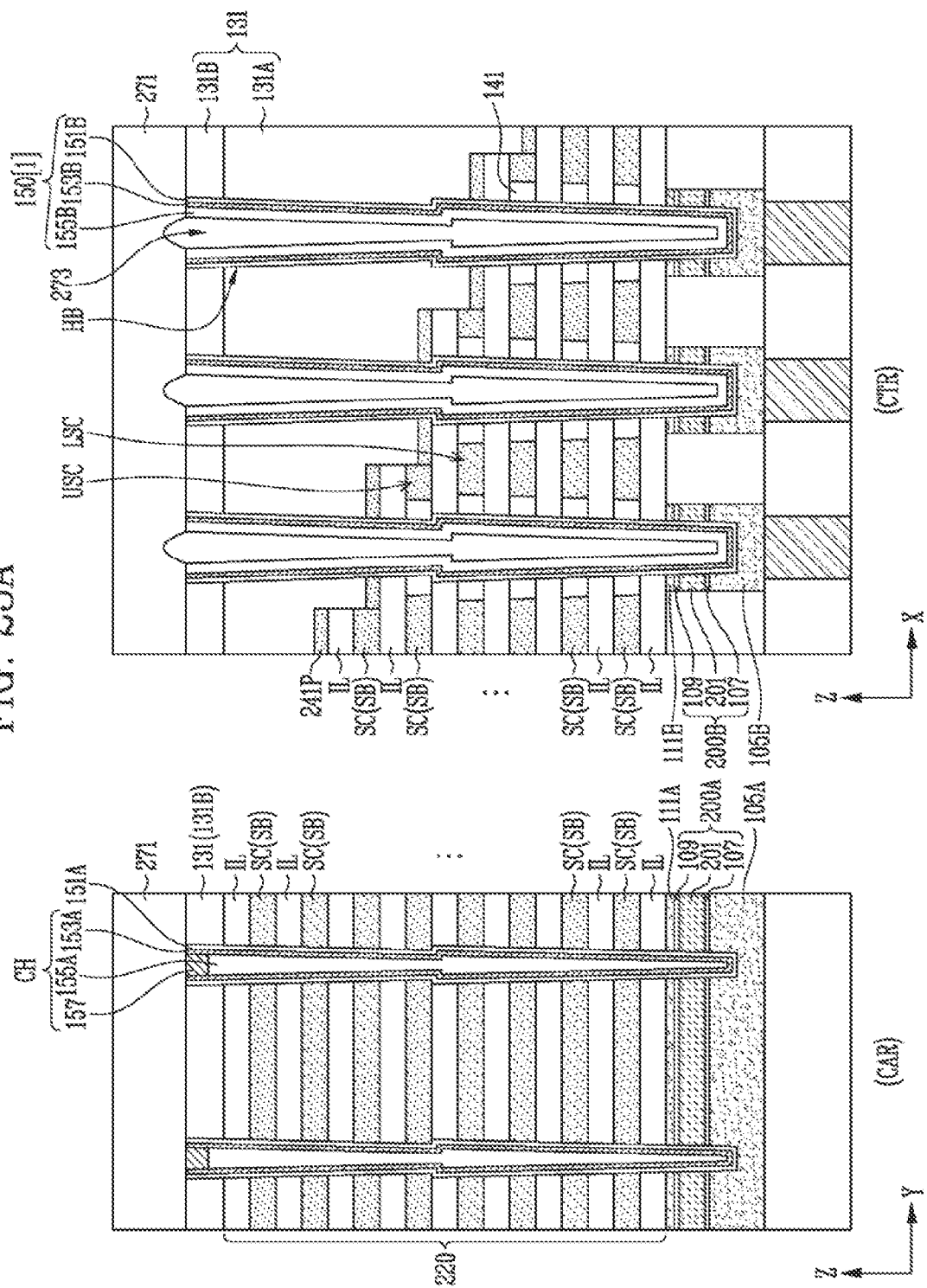
FIGS. 23A, 23B, 24A, 24B, 25A, and 25B are sectional views illustrating a method of forming a blocking insulating layer and a conductive pattern in accordance with an embodiment of the present disclosure.
Figure 23B:
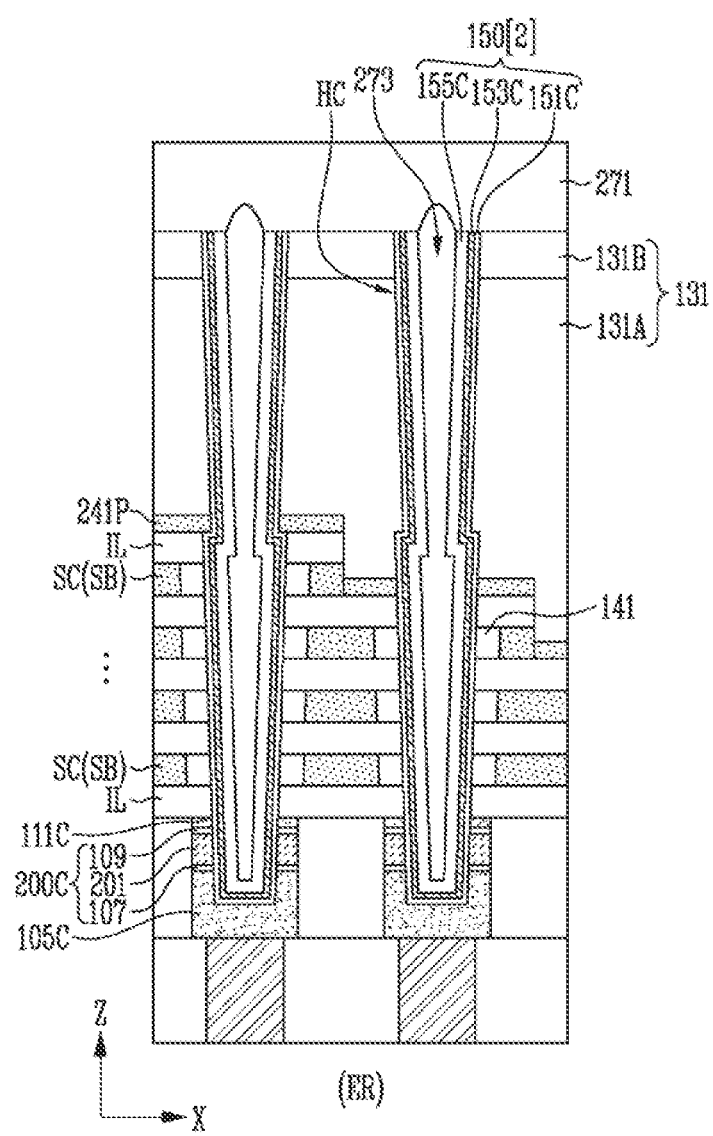

Referring to FIGS. 23A and 23B, a second upper protective layer 271 may be formed over the filling insulating layer 131. The second upper protective layer 271 may be formed through a deposition process having a low step coverage such that a void 273 can be defined in the central region of each of the contact hole HB and the dummy hole HC. The second upper protective layer 271 may cover the channel structure CH, the memory pattern 151A, the first support structure 150[1], and the second support structure 150[2].

Figure 24A:
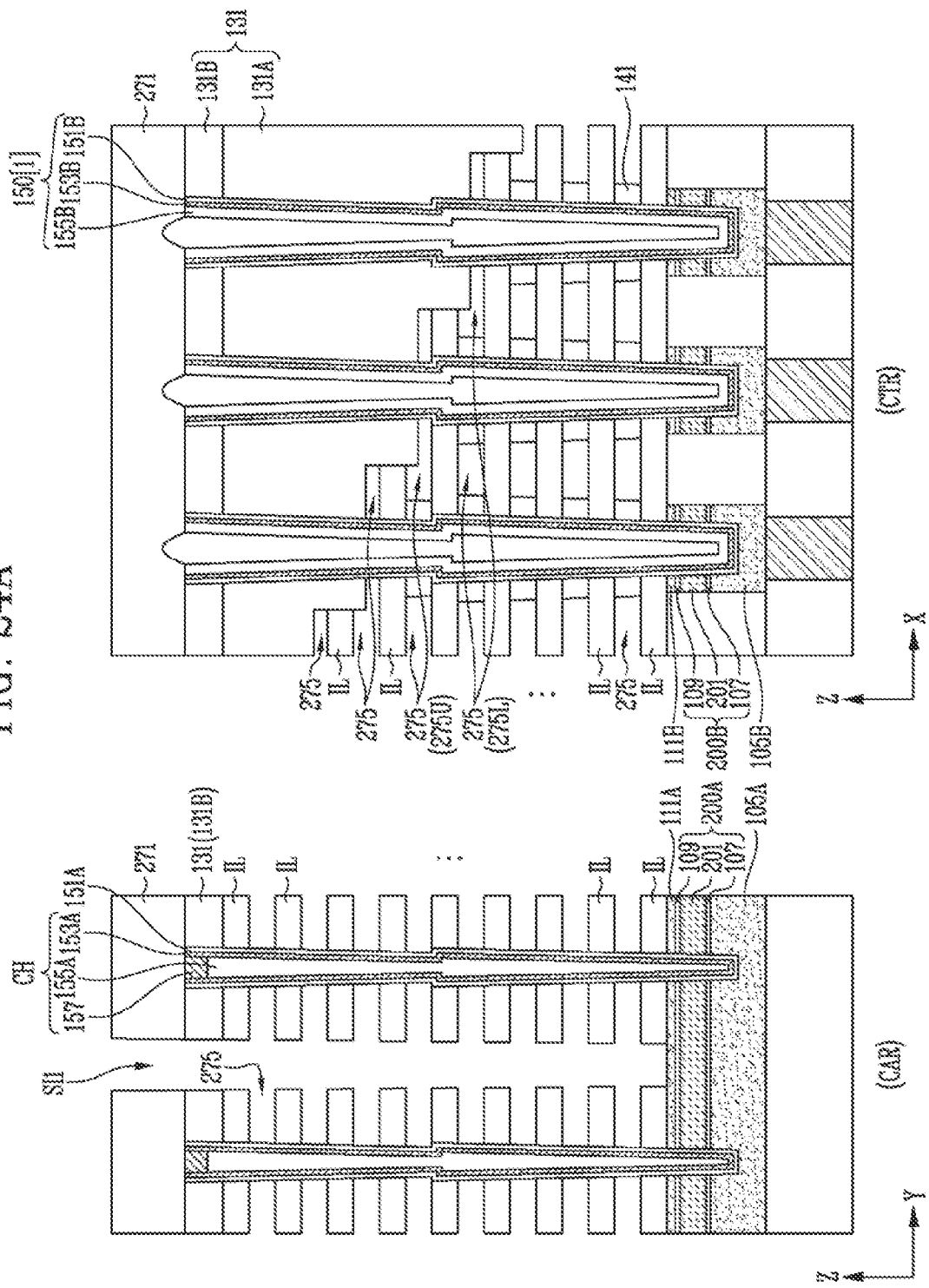
Figure 24B:
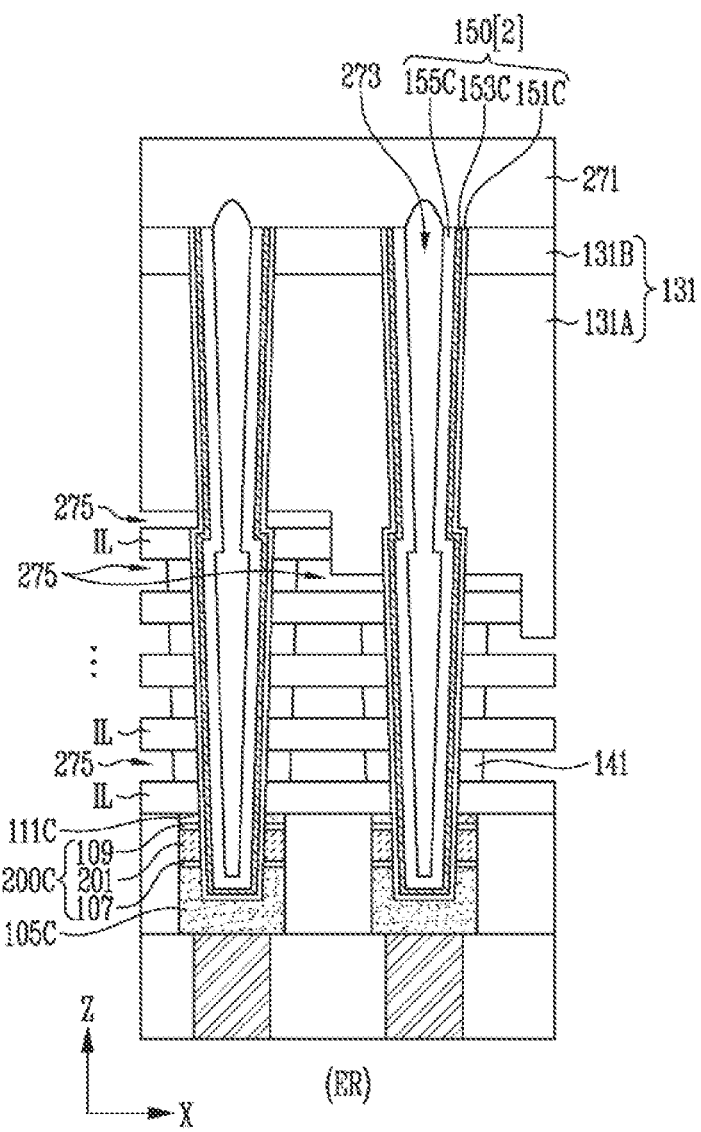

Referring to FIGS. 24A and 24B, the plurality of interlayer insulating layers IL and the plurality of sacrificial layers SC may be etched in the cell region CAR of the preliminary stepped stack structure 220 shown in FIG. 23A, thereby forming a first preliminary slit SI1. Subsequently, the plurality of sacrificial layers SC and the plurality of sacrificial pads 241P, which are shown in FIGS. 23A and 23B, may be selectively removed through the first preliminary slit SI1. Accordingly, a plurality of gate regions 275 may be opened. Each gate region 275 may be defined between interlayer insulating layers IL adjacent to each other in the Z-axis direction, and extend between the filling insulating layer 131 and an interlayer insulating layer IL, which are adjacent to each other in the Z-axis direction. The contact insulating pattern 141, the first support structure 150[1], and the second support structure 150[2] may be exposed by the plurality of gate regions 275.

The plurality of gate regions 275 may include an upper gate region 275U and a lower gate region 275L. The upper gate region 275U may be defined in a region in which the upper sacrificial layer USC shown in FIG. 23A and a sacrificial pad 241P at the same level thereas are removed, and the lower gate region 275L may be defined in a region in which the lower sacrificial layer LSC shown in FIG. 23A, and a sacrificial pad 241P at the same level thereas are removed.

Figure 25A:
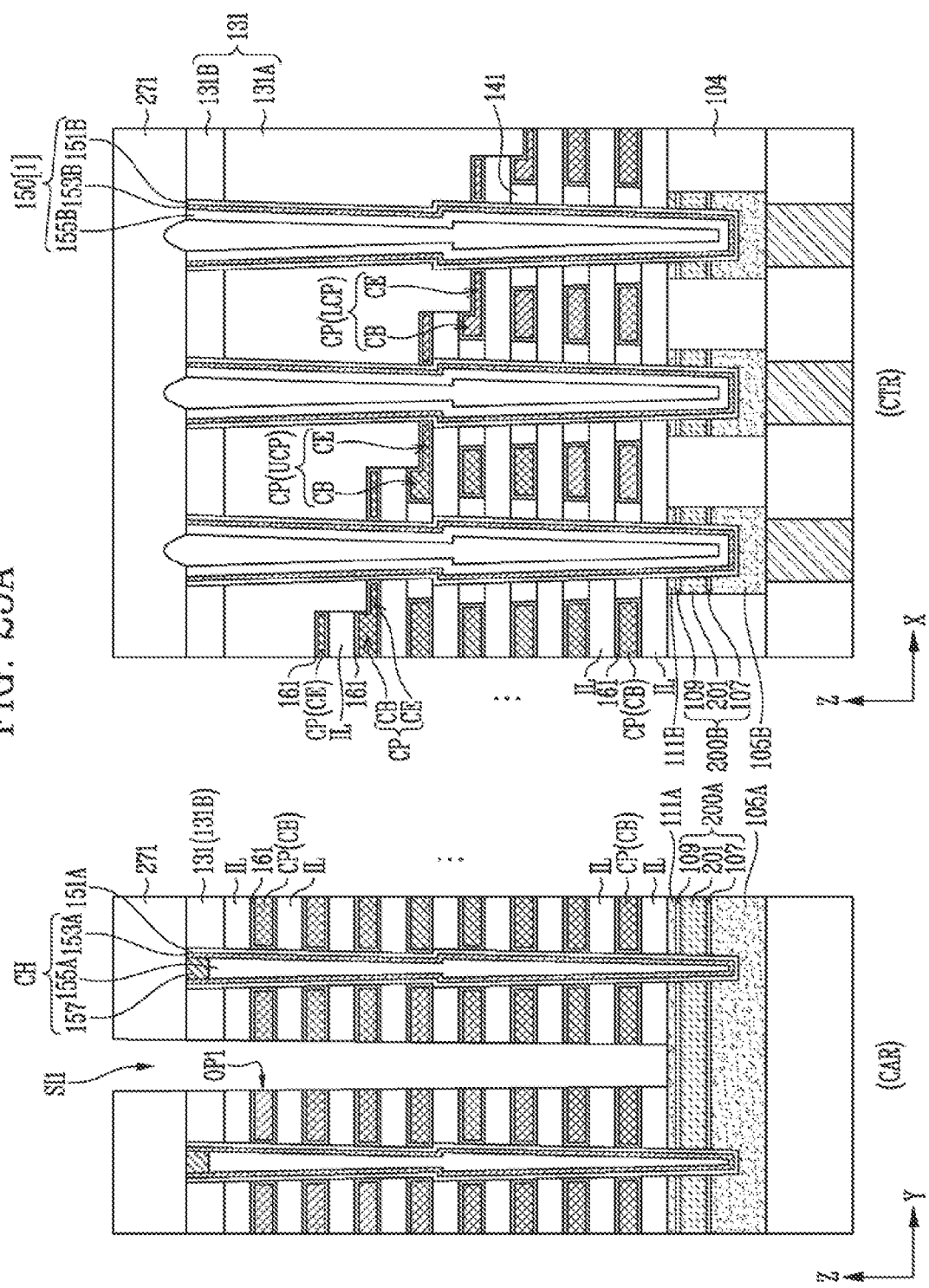
Figure 25B:
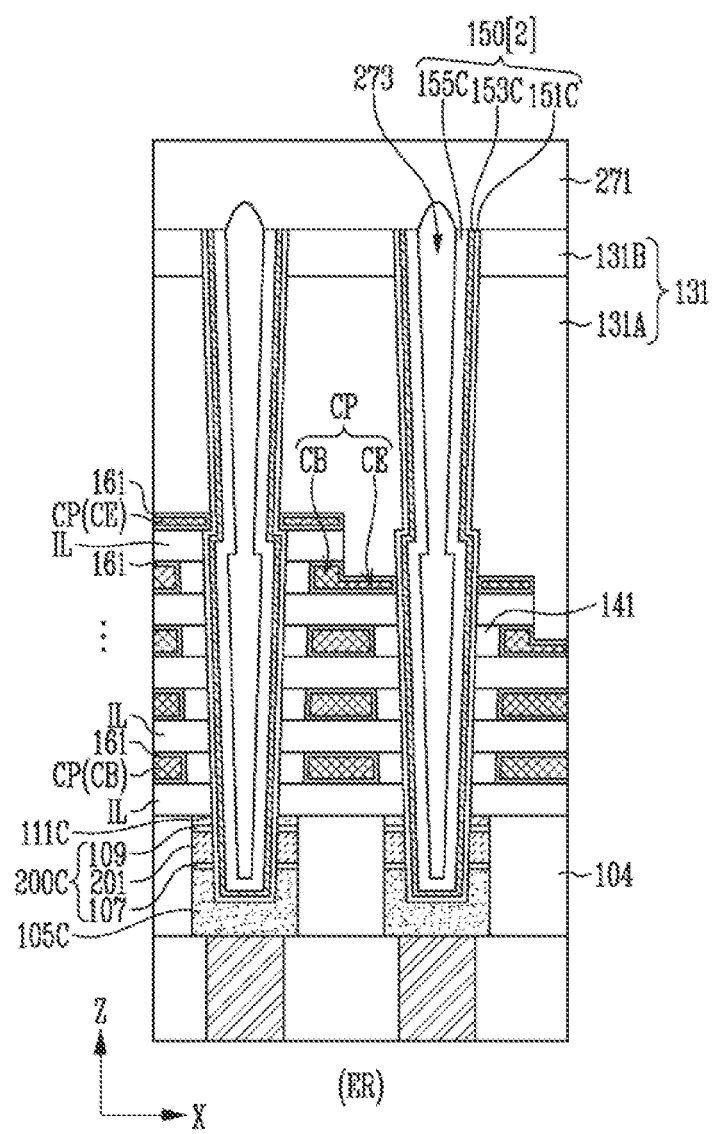

Referring to FIGS. 25A and 25B, a second blocking insulating layer 161 may be formed along a surface of the gate region 275 shown in FIGS. 24A and 24B. The second blocking insulating layer 161 may have a first opening OP1 facing the first preliminary slit SI1. The second blocking insulating layer 161 may extend along a sidewall of each of the first support structure 150[1] and the second support structure 150[2]. The second blocking insulating layer 161 may extend along a sidewall of the contact insulating pattern 141.

Subsequently, a central region of the gate region 275, which is opened by the second blocking insulating layer 161, may be filled with a first conductive material. The first conductive material may be introduced into the gate region 275 shown in FIGS. 24A and 24B through the first opening OP1. Subsequently, the first conductive material in the first preliminary slit SI1 may be removed, thereby forming a plurality of conductive patterns CP which are disposed in the plurality of gate regions 275 and are isolated from each other in the Z-axis direction. The plurality of conductive patterns CP may include an upper conductive pattern UCP in the upper gate region 275U shown in FIG. 24A and a lower conductive pattern LCP in the lower gate region 275L shown in FIG. 24A.

Each conductive pattern CP may include a base part CB and an edge part CE having a thickness thinner than that of the base part CB. The base part CB may surround the channel structure CH and the memory pattern 151A. The edge part CE may surround a first support structure 150[1] and a second support structure 150[2], which correspond thereto.

A gap between interlayer insulating layers IL adjacent to each other in the Z-axis direction can be stably maintained by the first support structure 150[1] and the second support structure 150[2].

FIGS. 26, 27, 28A, 28B, 29A, 29B, 30A, 30B, 31A, 31B, 32A, and 32B are sectional views illustrating a method of forming a common source pattern, a conductive gate contact, and a dummy contact in accordance with an embodiment of the present disclosure.

Figure 26:
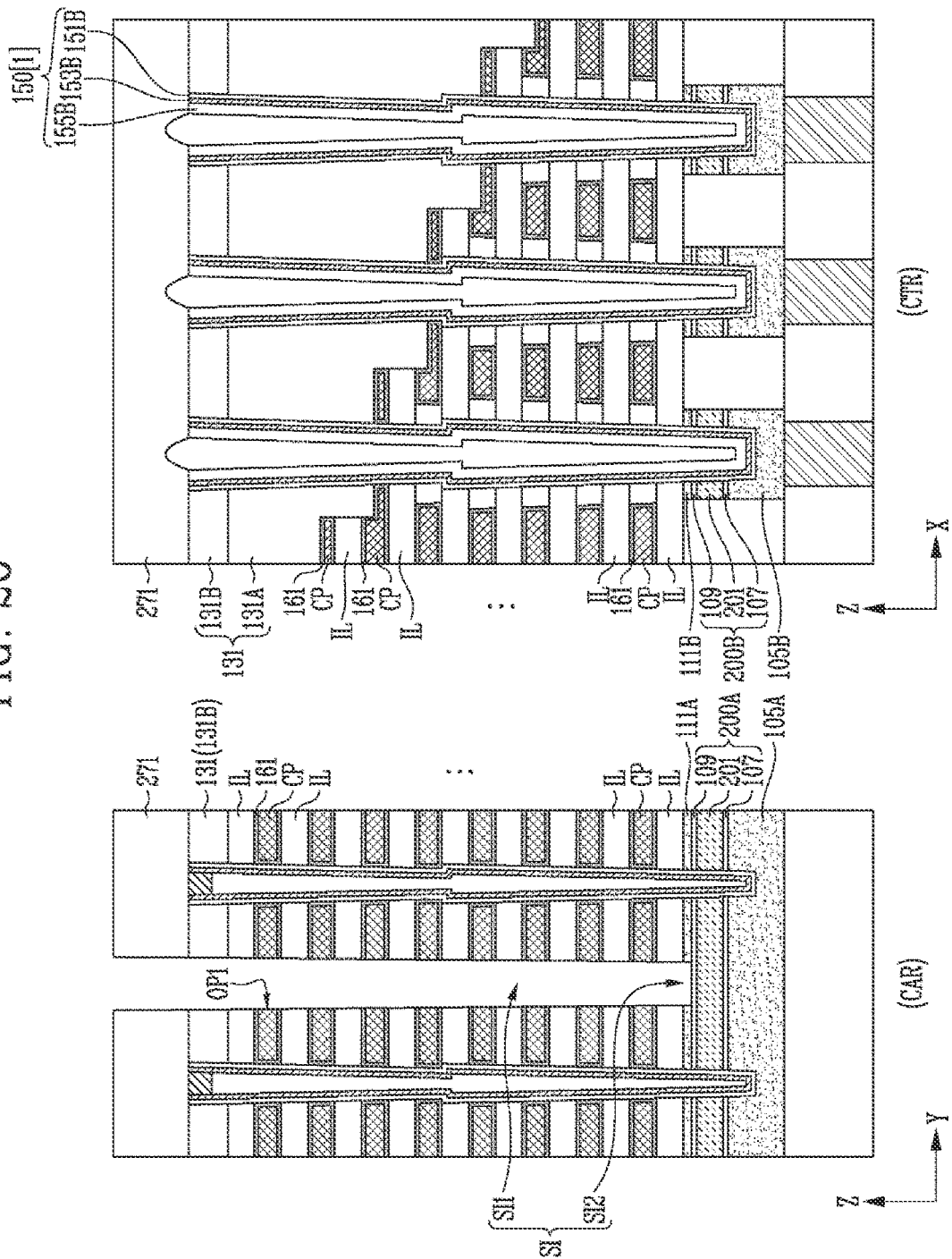
FIGS. 26, 27, 28A, 28B, 29A, 29B, 30A, 30B, 31A, 31B, 32A, and 32B are sectional views illustrating a method of forming a common source pattern, a conductive gate contact, and a dummy contact in accordance with an embodiment of the present disclosure.

Referring to FIG. 26, a second preliminary slit SI2 may be formed, which is connected to the first preliminary slit SI1. The second preliminary slit SI2 may extend to penetrate the second semiconductor pattern 111A. A slit SI may be defined by the first preliminary slit SI1 and the second preliminary slit SI2, which are connected to each other.

Figure 27:
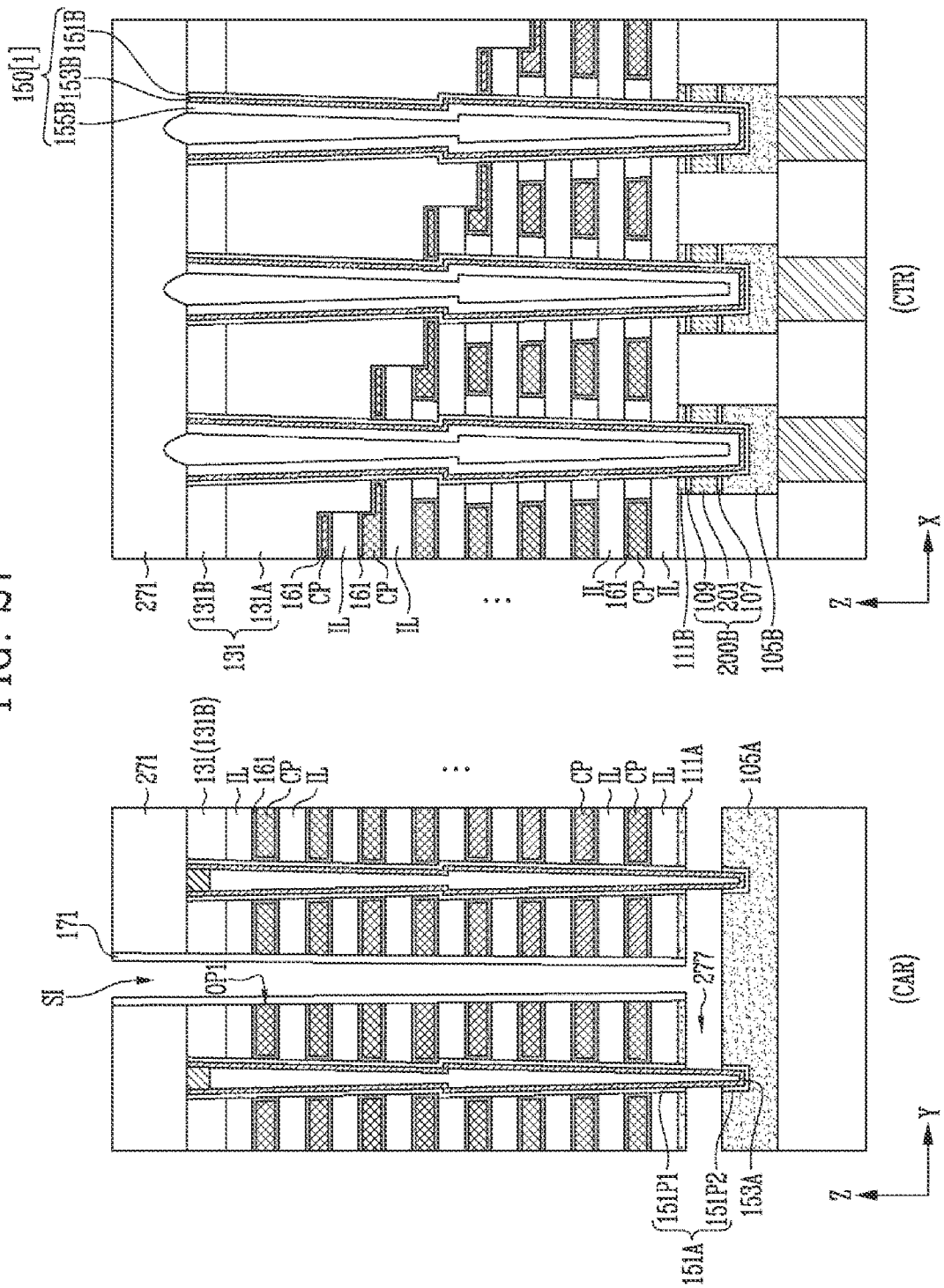

Referring to FIG. 27, a sidewall insulating layer 171 may be formed on a sidewall of the slit SI. While the sidewall insulating layer 171 is etched to expose a bottom surface of the slit SI, a portion of the second protective layer 109 of the preliminary horizontal pattern 200A shown in FIG. 26 may be removed. Accordingly, the horizontal layer 201 of the preliminary horizontal pattern 200A shown in FIG. 26 may be exposed.

Subsequently, the horizontal layer 201 of the preliminary horizontal pattern 200A shown in FIG. 26 may be selectively removed through the slit SI. Accordingly, the first protective layer 107 and the second protective layer 109 of the preliminary horizontal pattern 200A shown in FIG. 26 may be exposed. Subsequently, a portion of the memory pattern 151A may be removed through a region in which the preliminary horizontal pattern 200A is removed, thereby exposing the cell channel layer 153A.

While the portion of the memory pattern 151A is removed, the first protective layer 107 and the second protective layer 109 of the preliminary horizontal pattern 200A shown in FIG. 26 may be removed. Accordingly, the first semiconductor pattern 105A and the second semiconductor pattern 111A may be exposed.

Through the above-described processes, a horizontal space 277 between the first semiconductor pattern 105A and the second semiconductor pattern 111A may be opened. In addition, the memory pattern 151A may be isolated into a first memory pattern 151P1 and a second memory pattern 151P2 by the horizontal space 277.

Figure 28A:
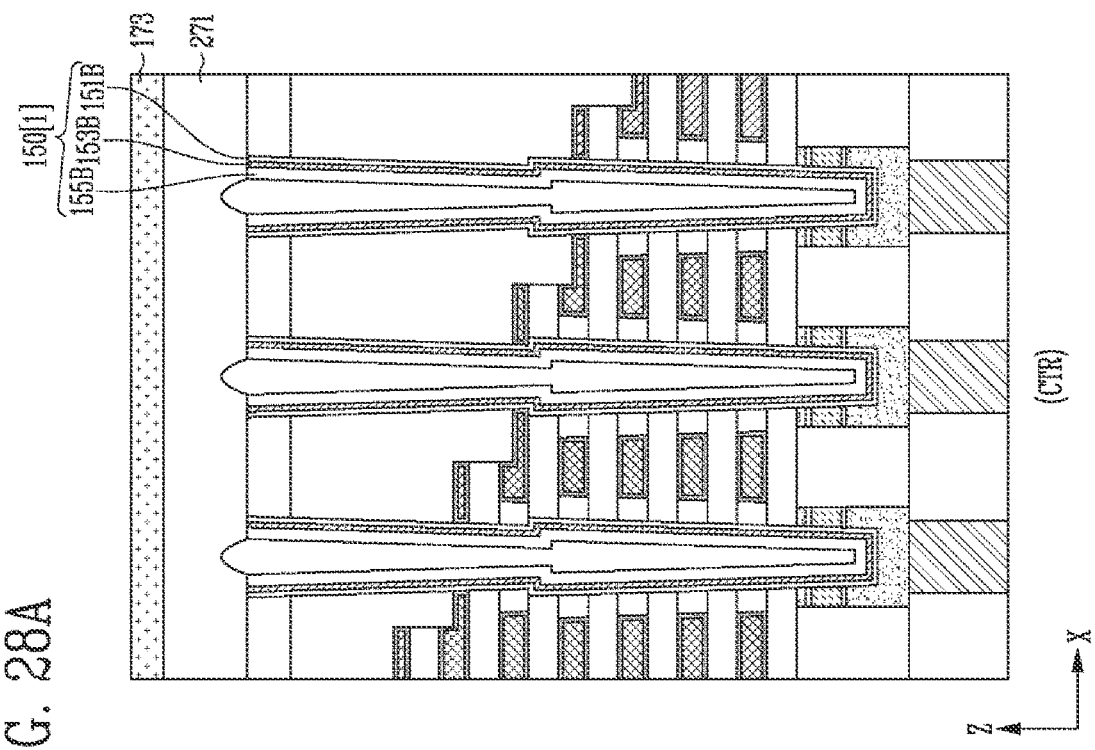
Figure 28A:
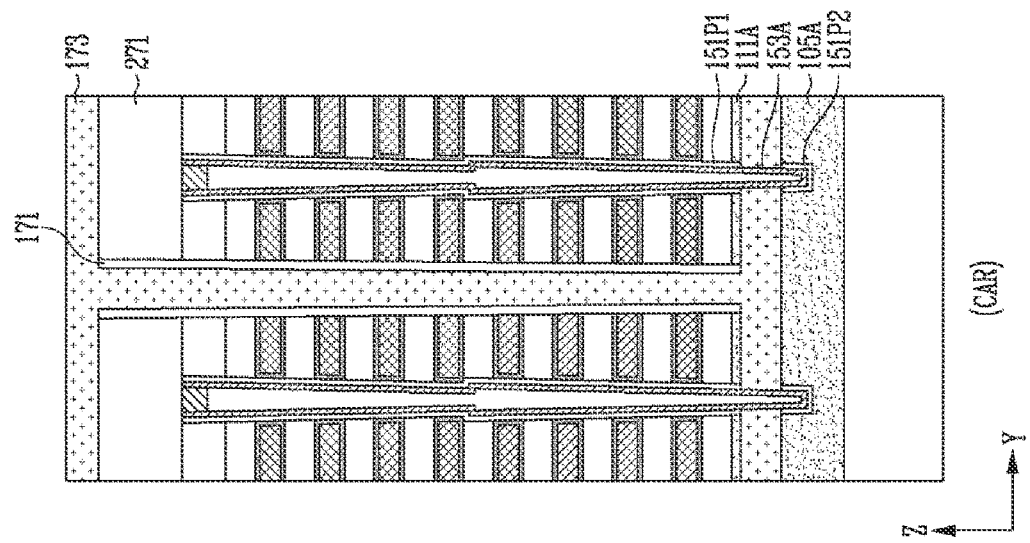
Figure 28B:
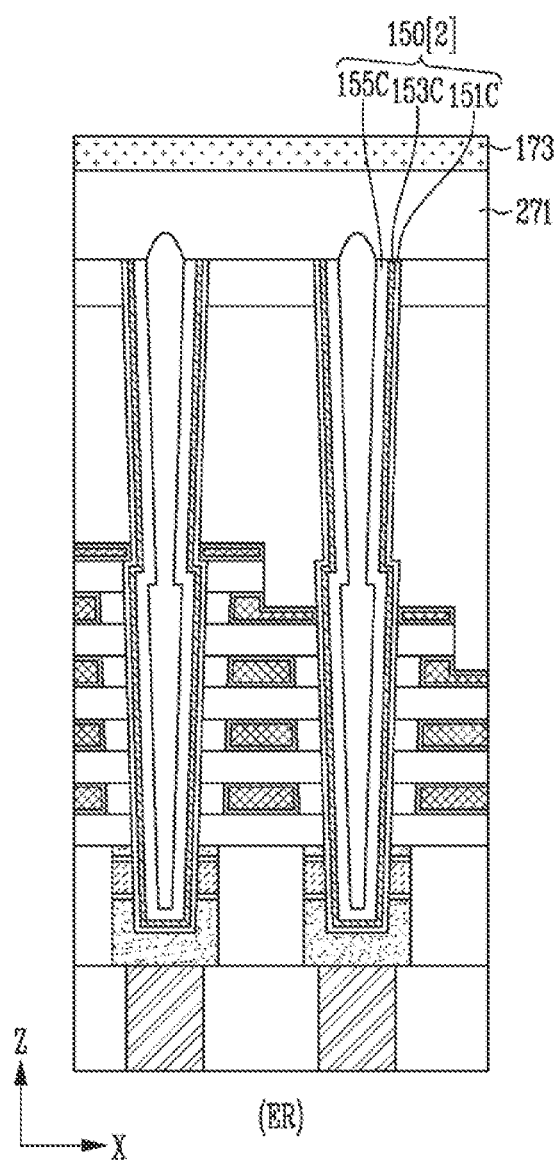

Referring to FIGS. 28A and 28B, a doped semiconductor layer 173 may be formed to fill the horizontal space 277 and the slit SI, which are shown in FIG. 27. The doped semiconductor layer 173 may include an n-type impurity. The doped semiconductor layer 173 may extend to overlap with the second upper protective layer 271, and be in contact with the cell channel layer 153A.

Figure 29A:
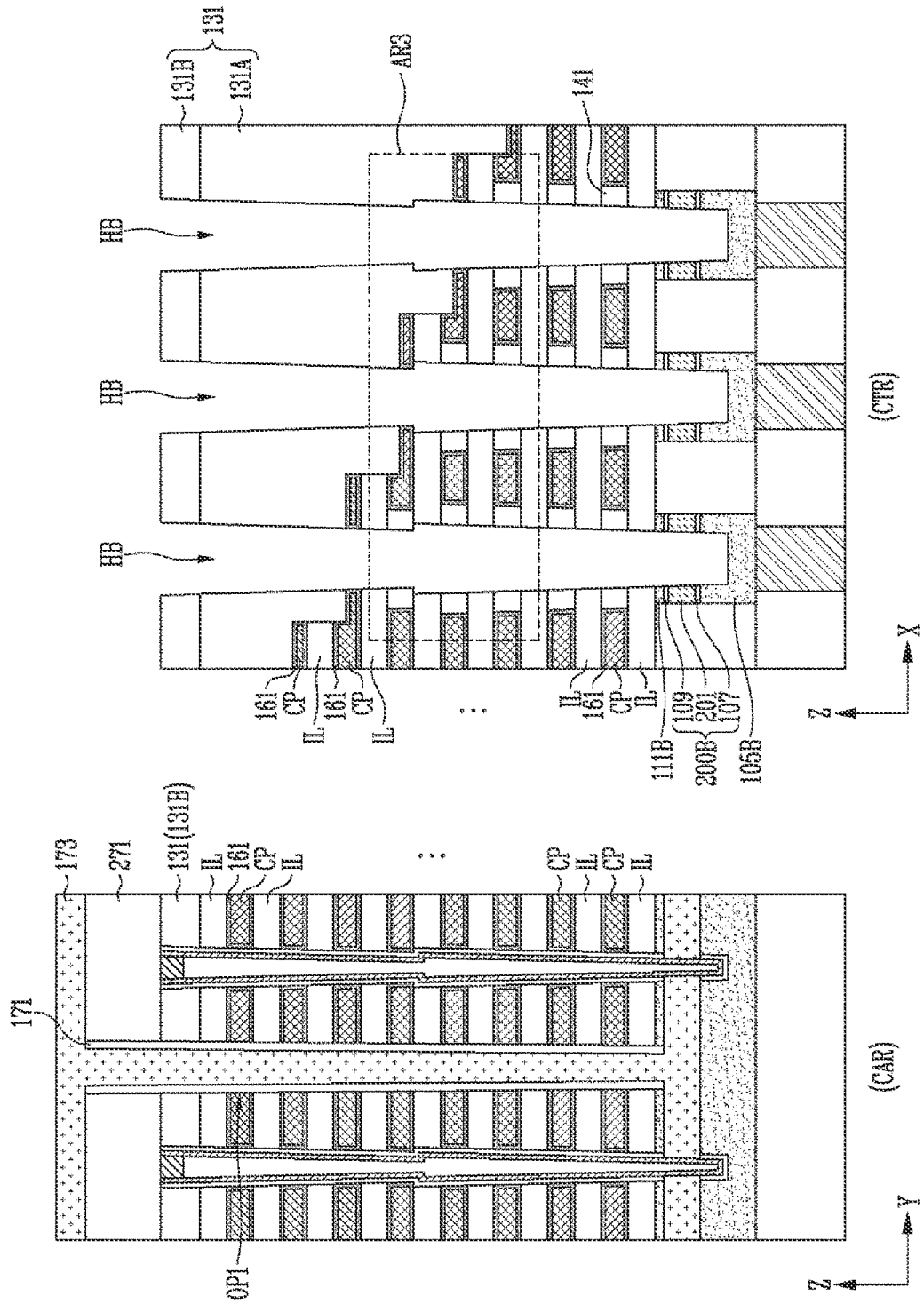
Figure 29B:
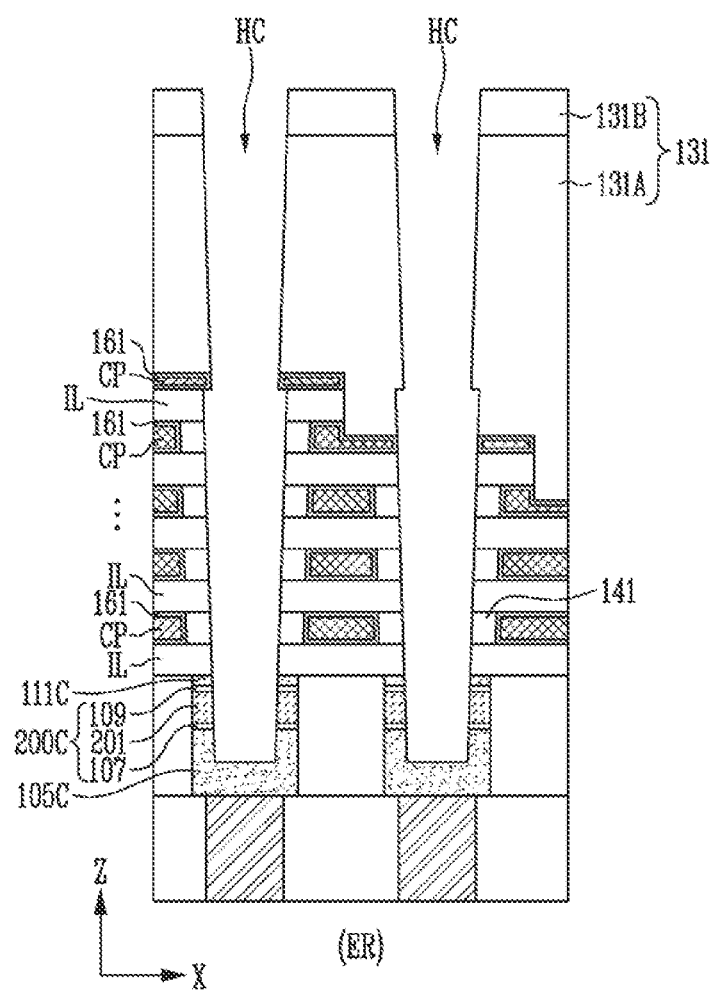

Referring to FIGS. 29A and 29B, a portion of the doped semiconductor layer 173 over the first support structure 150[1] and the second support structure 150[2], which are shown in FIGS. 28A and 28B, and a portion of the second upper protective layer 271 may be removed. To this end, the doped semiconductor layer 173 may be blocked in the cell region CAR, and a mask pattern (not shown) exposing the doped semiconductor layer 173 in the contact region CTR and the extension region ER may be used as an etching barrier. The doped semiconductor layer 173 and the second upper protective layer 271 may be etched, thereby exposing the first support structure 150[1] and the second support structure 150[2], which are shown in FIGS. 28A and 28B. The mask pattern may be removed after the doped semiconductor layer 173 and the second upper protective layer 271 are etched.

Subsequently, the first support structure 150[1] and the second support structure 150[2], which are shown in FIGS. 28A and 28B, may be removed. Accordingly, the contact hole HB and the dummy hole HC may be opened. The second blocking insulating layer 161 and the contact insulating pattern 141 may be exposed through the contact hole HB and the dummy hole HC.

Figure 30A:
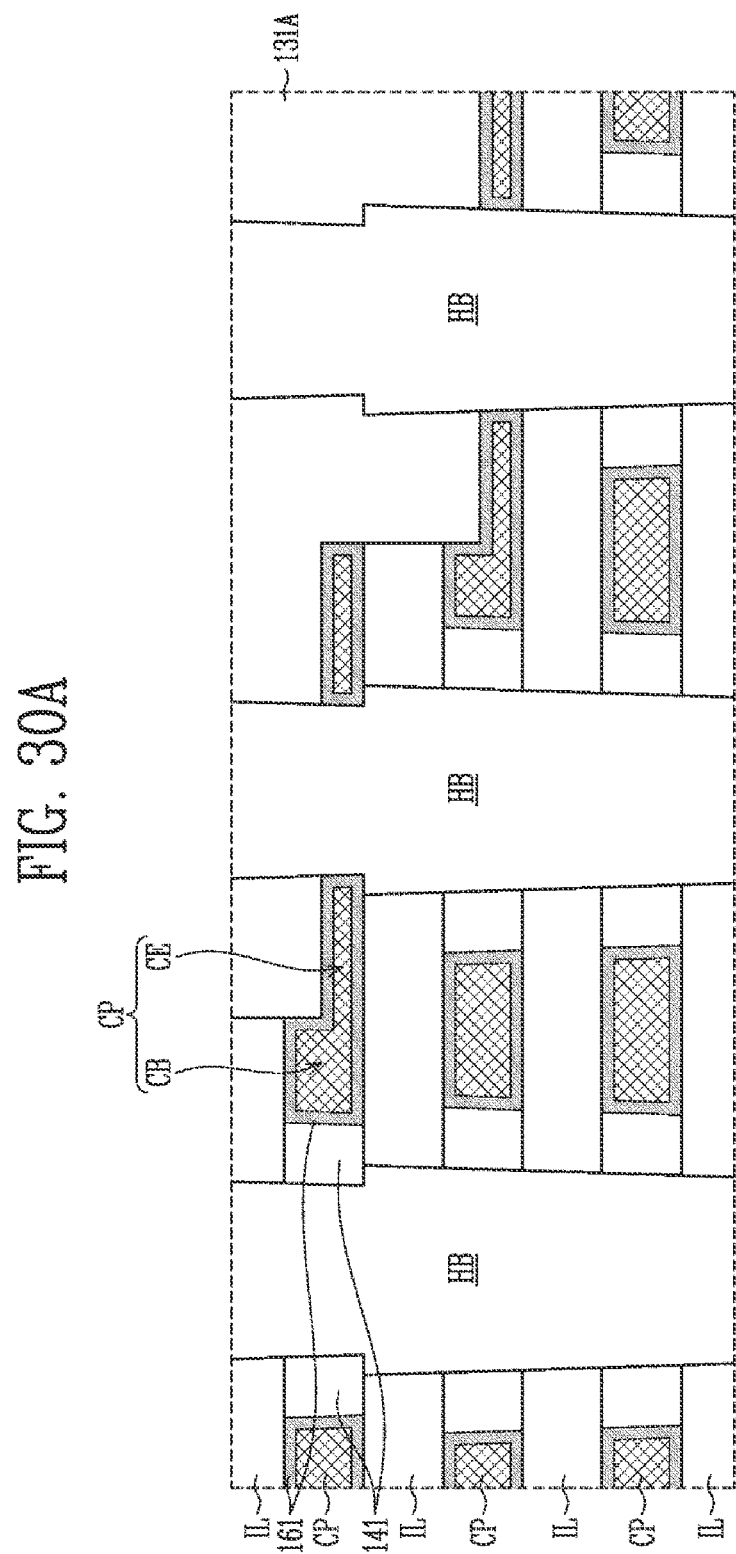

FIG. 30A is an enlarged sectional view of region AR3 shown in FIG. 29A.

Referring to FIG. 30A, when the first support structure 150[1] shown in FIG. 28A is removed, the second blocking insulating layer 161 and the contact insulating pattern 141 may be exposed through the contact hole HB.

Although not shown in the enlarged sectional view, when the second support structure 150[2] shown in FIG. 28B is removed, the second blocking insulating layer 161 and the contact insulating pattern 141 may be exposed through the dummy hole HC shown in FIG. 29B.

Figure 30B:
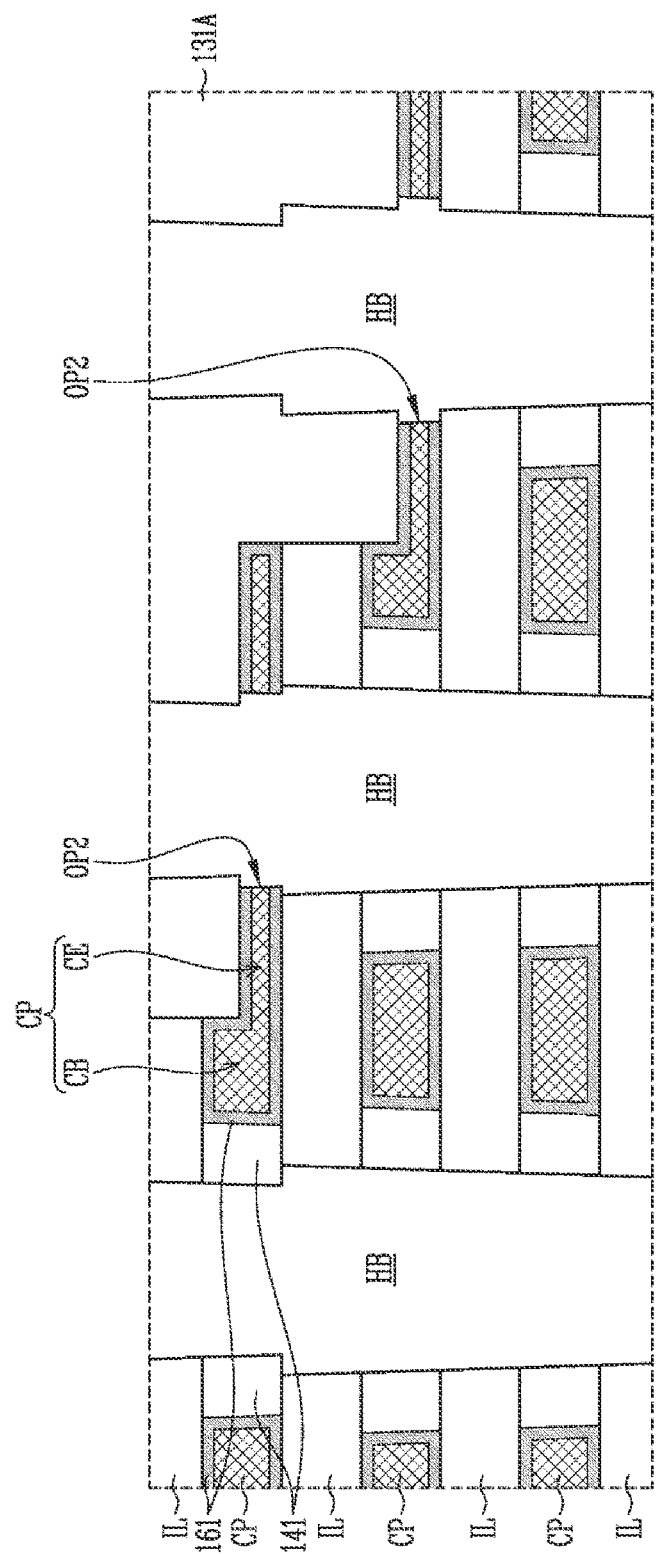

FIG. 30B illustrates an embodiment of a subsequent process continued after the processes described with reference to FIGS. 29A, 29B, and 30A.

Referring to FIG. 30B, a region in which the second blocking insulating layer 161 is exposed may be removed through the contact hole HB. Accordingly, a second opening OP2 may be defined. The edge part CE of the conductive pattern CP may be exposed by the second opening OP2.

Although not shown in the enlarged sectional view, the region in which the second blocking insulating layer 161 is exposed may be removed through the dummy hole HC shown in FIG. 29B. Accordingly, a third opening OP3 may be defined as shown in FIG. 31B, and an edge part CE of a conductive pattern CP corresponding to the third opening OP3 may be exposed through the third opening OP3.

Although a portion of the second blocking insulating layer 161 is removed, the contact insulating pattern 141 may remain to overlap the edge part CE of the conductive pattern CP.

Figure 31A:
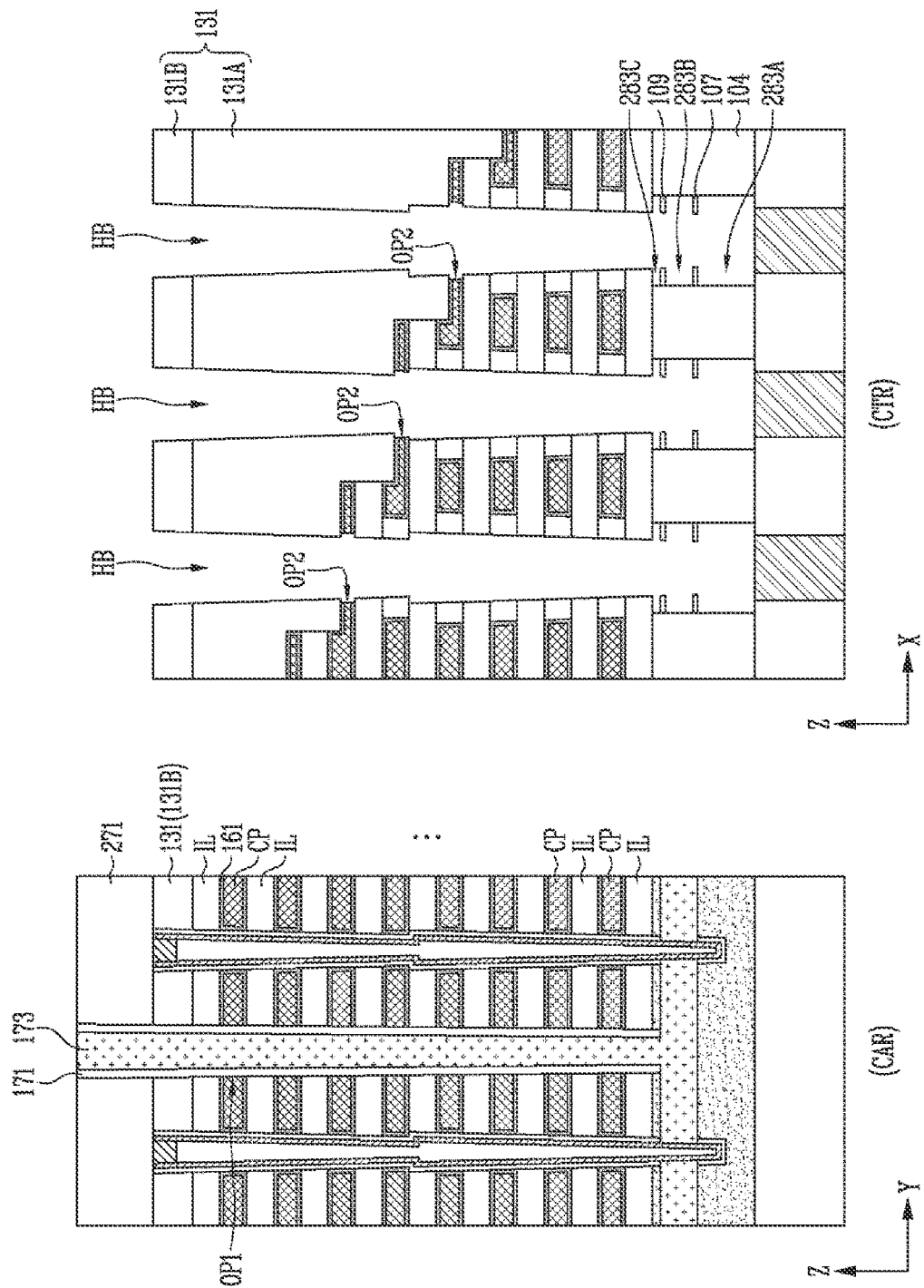
Figure 31B:
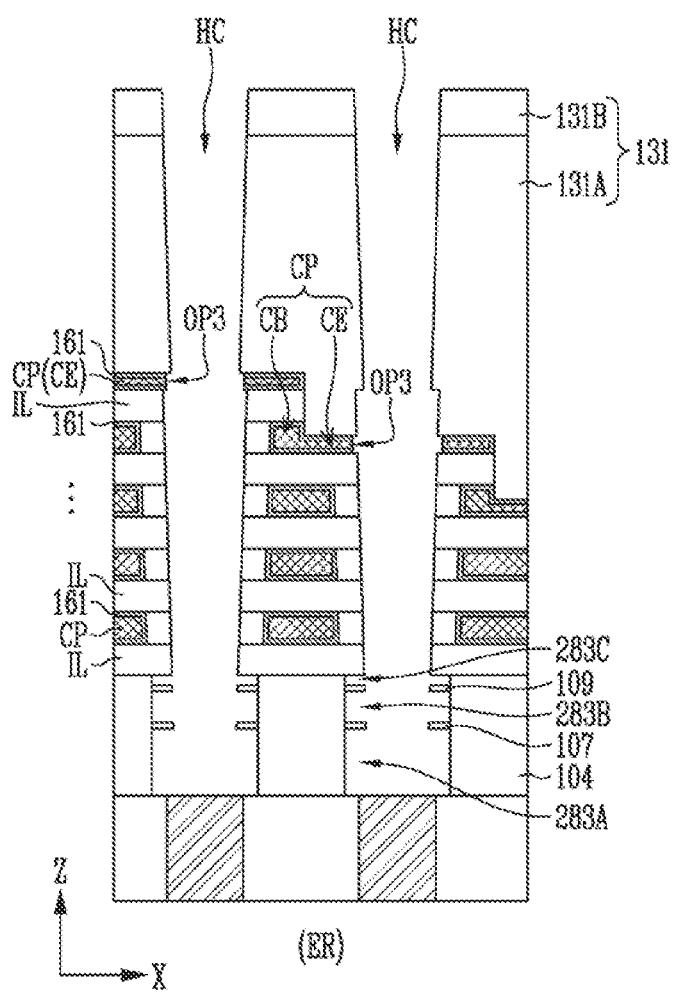

Referring to FIGS. 31A and 31B, the horizontal layer 201 of the preliminary contact structure 200B shown in FIG. 29A and the horizontal layer 201 of the preliminary dummy structure 200C shown in FIG. 29B may be removed through the contact hole HB and the dummy hole HC. In addition, the first semiconductor pattern 105B and the second semiconductor pattern 111B, which overlap with the preliminary contact structure 200B shown in FIG. 29A, and the first semiconductor pattern 105C and the second semiconductor pattern 111C, which overlap with the preliminary dummy structure 200G shown in FIG. 29B, may be removed.

A first lower recess region 283A may be defined in a region in which each of the first semiconductor patterns 105B and 105C shown in FIGS. 29A and 29B is removed, a second lower recess region 283B may be defined in a region in which the horizontal layer 201 shown in FIGS. 29A and 29B removed, and a third lower recess region 283C may be defined in a region in which each of the second semiconductor patterns 111B and 111C shown in FIGS. 29A and 29B is removed. While the first semiconductor patterns 105B and 105C, the horizontal layer 201, and the second semiconductor patterns 111B and 111C, which are shown in FIGS. 29A and 29B, are removed, a portion of the doped semiconductor layer 173 disposed over the second upper protective layer 271 may be removed.

The first protective layer 107 and the second protective layer 109 may remain at boundaries between the first lower recess region 283A, the second lower recess region 283B, and the third lower recess region 283C.

Figure 32A:
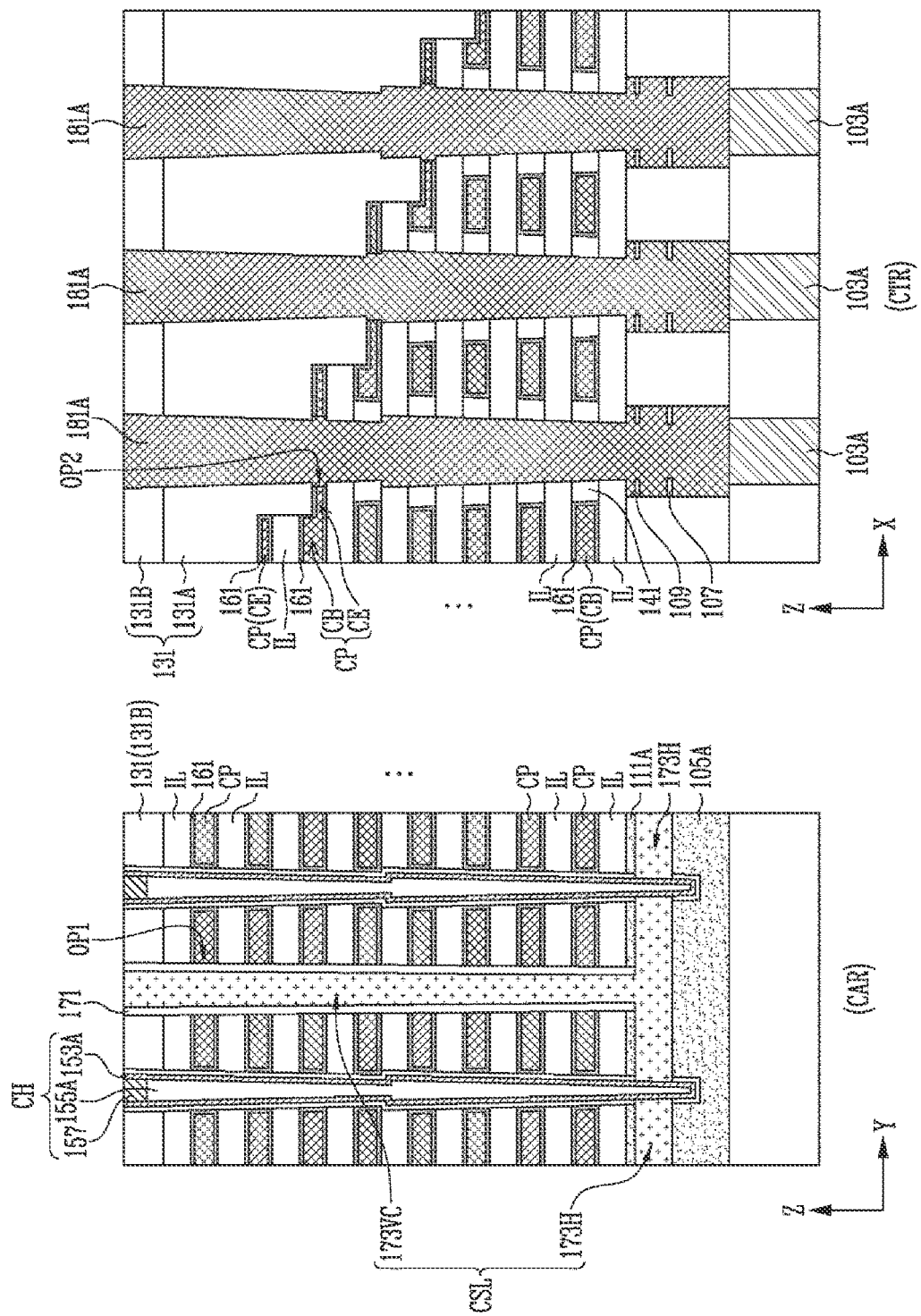
Figure 32B:
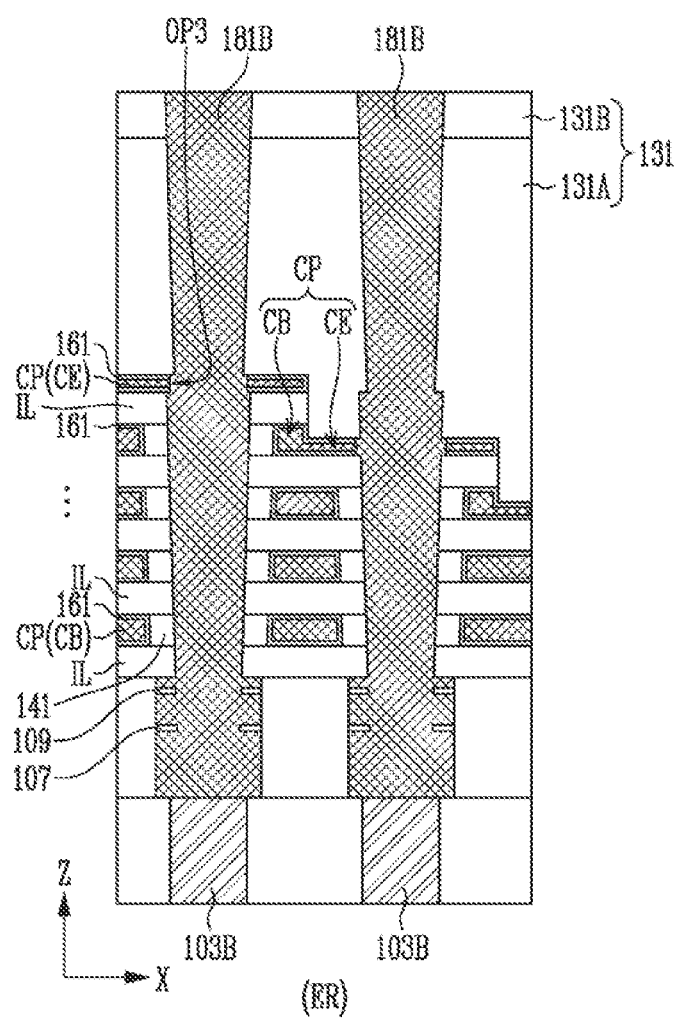

Referring to FIGS. 32A and 32B, the contact hole HB, the dummy hole HC, the first lower recess region 283A, the second lower recess region 283B, and the third lower recess region 283C, which are shown in FIGS. 31A and 31B, may be filled with a second conductive material. Subsequently, the second conductive material may be etched such that the filling insulating layer 131 is exposed. Accordingly, a conductive gate contact 181A and a dummy contact 181B may be defined.

The doped semiconductor layer 173 shown in FIG. 31A may be planarized through a planarization process for forming the conductive gate contact 181A and the dummy contact 181B. Accordingly, the doped semiconductor layer 173 shown in FIG. 31A may remain as a common source pattern CSL. The common source pattern CSL may include a horizontal doped semiconductor pattern 173H and a conductive vertical contact 173VC. The horizontal doped semiconductor pattern 173H may be in contact with the cell channel layer 153A of the channel structure CH, and be disposed between the first doped semiconductor pattern 105A and the second doped semiconductor pattern 111A. The conductive vertical contact 173VC may extend in the Z-axis direction from the horizontal doped semiconductor pattern 173H. The conductive vertical contact 173VC may be insulated from the plurality of conductive patterns CP by the sidewall insulating layer 171.

The conductive gate contact 181A might not only fill the contact hole HB shown in FIG. 31A but also fill the first lower recess region 283A, the second lower recess region 283B, and the third lower recess region 283C, which are connected to the contact hole HB shown in FIG. 31A. The conductive gate contact 181A may be in contact with an edge part CE of a conductive pattern CP corresponding thereto through the second opening OP2. A base part CB of the conductive pattern CP may be spaced apart from the conductive gate contact 181A by the remaining contact insulating pattern 141.

The dummy contact 181B might not only fill the dummy hole HC shown in FIG. 31B but also fill the first lower recess region 283A, the second lower recess region 283B, and the third lower recess region 283C, which are connected to the dummy hole HC shown in FIG. 31B. The dummy contact 181B may be in contact with an edge part CE of a conductive pattern CP corresponding thereto through the third opening OP3. A base part CB of the conductive pattern CP may be spaced apart from the dummy contact 181B by the remaining contact insulating pattern 141.

The first protective layer 107 and the second protective layer 109 are not removed but may remain, in a process of replacing the first support structure 150[1] shown in FIG. 28A and the horizontal layer 201 of the preliminary contact structure 200B shown in FIG. 29A with the conductive gate contact 181A and replacing the second support structure 150[2] shown in FIG. 28B and the horizontal layer 201 of the preliminary dummy structure 200G shown in FIG. 29A with the dummy contact 181B.

Subsequently, subsequent processes for forming the upper insulating layer UI, the bit line contact 193A, the upper contact 193B, the bit line BL, and the upper line UL, which are shown in FIGS. 3A, 3B, and 3C, may be performed.

FIGS. 33A to 33J are sectional views illustrating a manufacturing method of a semiconductor memory device in accordance with an embodiment of the present disclosure. FIGS. 33A to 33J are sectional views illustrating a modified embodiment of a process of forming sacrificial pads. FIGS. 33A to 33J illustrate a contact region CTR' of a preliminary stepped stack structure 320. Although not shown in the drawings, the preliminary stepped stack structure 320 may include an extension region extending from the contact region CTR, and a process for the extension region may be performed similarly to that for the contact region CTR', which will be described later.

Figure 33A:
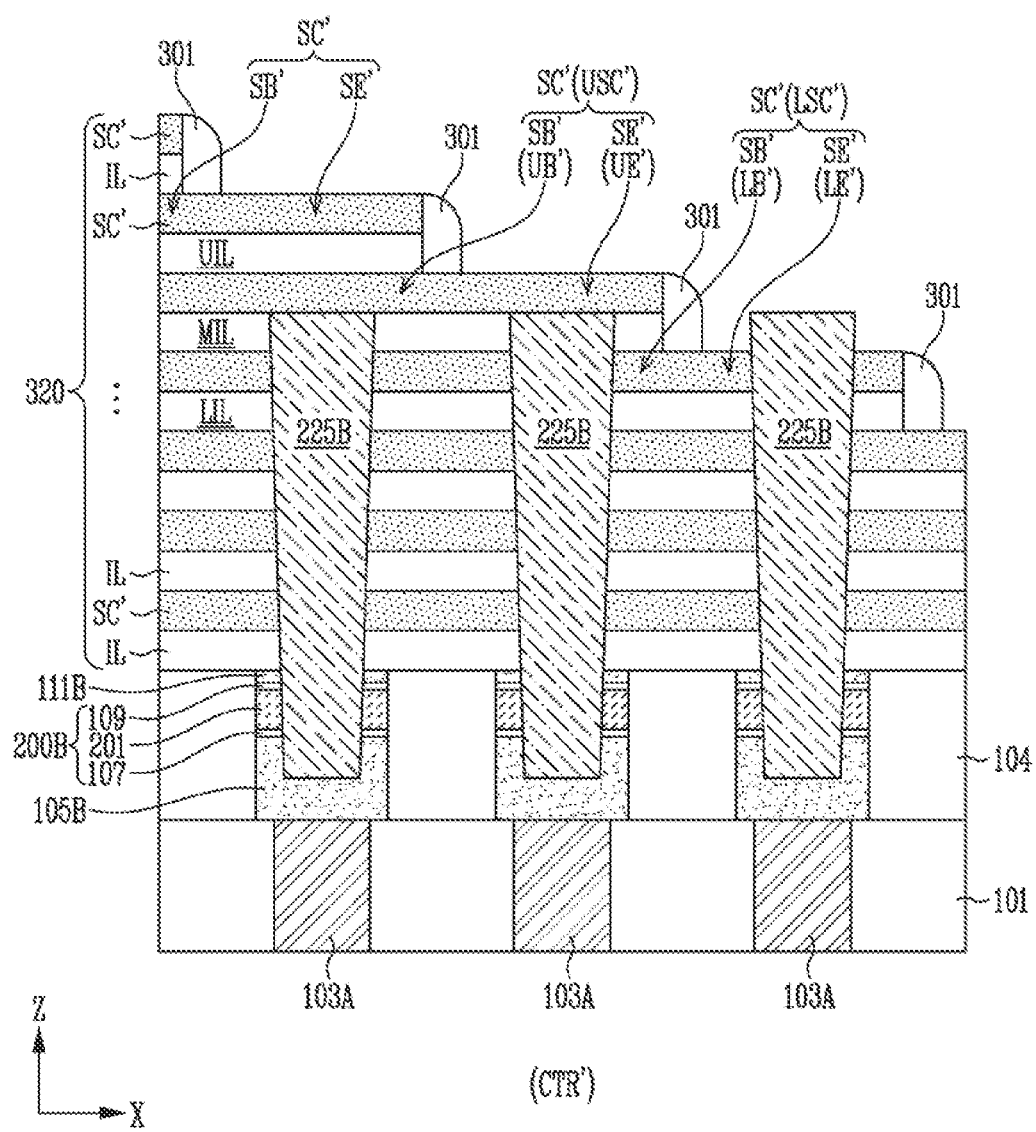
FIGS. 33A, 33B, 33C, 33D, 33E, 33F, 33G, 33H, 33I, and 33J are sectional views illustrating a manufacturing method of a semiconductor memory device in accordance with an embodiment of the present disclosure.

Referring to FIG. 33A, a first lower insulating layer 101, which are penetrated by a plurality of lower contacts 103A as described with reference to FIGS. 7A and 7B, a plurality of preliminary contact structures 200B, and a second lower insulating layer 104 may be formed.

Subsequently, as described with reference to FIGS. 8A, 8B, 9A, 9B, 10A, and 10B, the preliminary stepped stack structure 320 is formed over the second lower insulating layer 104. The preliminary stepped stack structure 320 may be configured with a plurality of interlayer insulating layers IL and a plurality of sacrificial layers SC', which are alternately disposed over the second lower insulating layer 104. A plurality of sacrificial pillars 225B may be buried in a portion of the contact region CTR' of the preliminary stepped stack structure 320. The plurality of sacrificial pillars 225B may extend to the inside of each of the plurality of preliminary contact structure 200B.

The plurality of sacrificial layers SC' may be patterned to have a length longer toward a side portion as becoming closer to the second lower insulating layer 104 in the contact region CTR'. Each sacrificial layer SC' may include a base part SB' and an edge part SE' extending from the base part SB'. The base part SB' may be disposed between interlayer insulating layers IL adjacent to each other in the Z-axis direction, and a top surface of the edge part SE' may be opened. A plurality of edge parts SE' of the plurality of sacrificial layers SC' may form a stepped structure in the contact region CTR'. The sacrificial layer SC' may be configured with a material having an etch selectivity with respect to the interlayer insulating layer IL.

Subsequently, spacer patterns 301 may be formed. The spacer patterns 301 may be disposed on sidewalls of an edge part SE' and an interlayer insulating layer IL, which constitute each of steps of the preliminary stepped stack structure 320. The spacer pattern 301 may be configured with a material having an etch selectivity with respect to the sacrificial layer SC'. Each of the plurality of edge parts SE' may include a region overlapping with a spacer pattern 301 on the top thereof and a region which does not overlap with the spacer pattern 301 but is exposed.

For example, the plurality of interlayer insulating layers IL may include a lower interlayer insulating layer LIL, a middle interlayer insulating layer MIL, and an upper interlayer insulating layer UIL, which are stacked in the Z-axis direction. The plurality of sacrificial layers SC' may include a lower sacrificial layer LSC' between the lower interlayer insulating layer LIL and the middle interlayer insulating layer MIL and an upper sacrificial layer USC' between the middle interlayer insulating layer MIL and the upper interlayer insulating layer UIL. The lower sacrificial layer LSC' may include a lower base part LB' between the lower interlayer insulating layer LIL and the middle interlayer insulating layer MIL and a lower edge part LE' further protruding toward a side portion than the middle interlayer insulating layer MIL from the lower base part LB'. The upper sacrificial layer USC' may include an upper base part UB' between the middle interlayer insulating layer MIL and the upper interlayer insulating layer UIL and an upper edge part UE' further protruding toward a side portion than the upper interlayer insulating layer UIL from the upper base part UB'. At least one of a plurality of spacer patterns may be disposed on the lower edge part LE'. A portion of a top surface of the lower edge part LE' may overlap with the spacer pattern 301, and another portion of the top surface of the lower edge part LE' does not overlap with the spacer pattern 301 but may be exposed. The spacer pattern 301 overlapping with a portion of the top surface of the lower edge part LE' may extend along a sidewall of the middle interlayer insulating layer MIL and a sidewall of the upper edge part UE'.

Figure 33B:
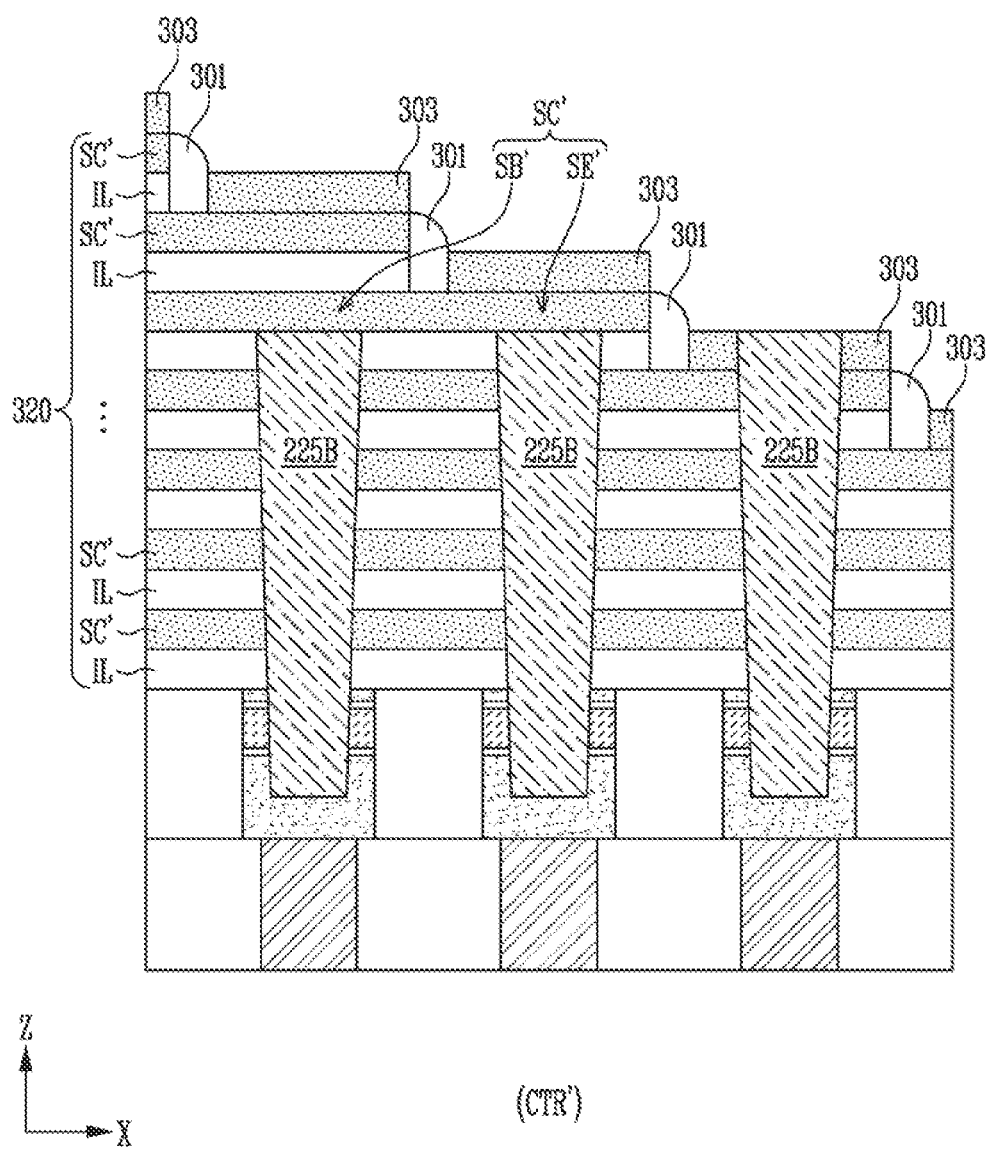

Referring to FIG. 33B, first sacrificial pads 303 may be respectively formed on the plurality of edge parts SE'. The first sacrificial pad 303 may be configured with the same material as the sacrificial layer SC'.

The first sacrificial pad 303 may overlap with a portion of the top surface of the edge part SE' of the sacrificial layer SC', which is exposed by the spacer pattern 301. The first sacrificial pad 303 may be spaced apart from the sacrificial layer SC' by the spacer pattern 301.

The process of forming the first sacrificial pad 303 is not limited to the above-described example, and may be various.

Figure 33C:
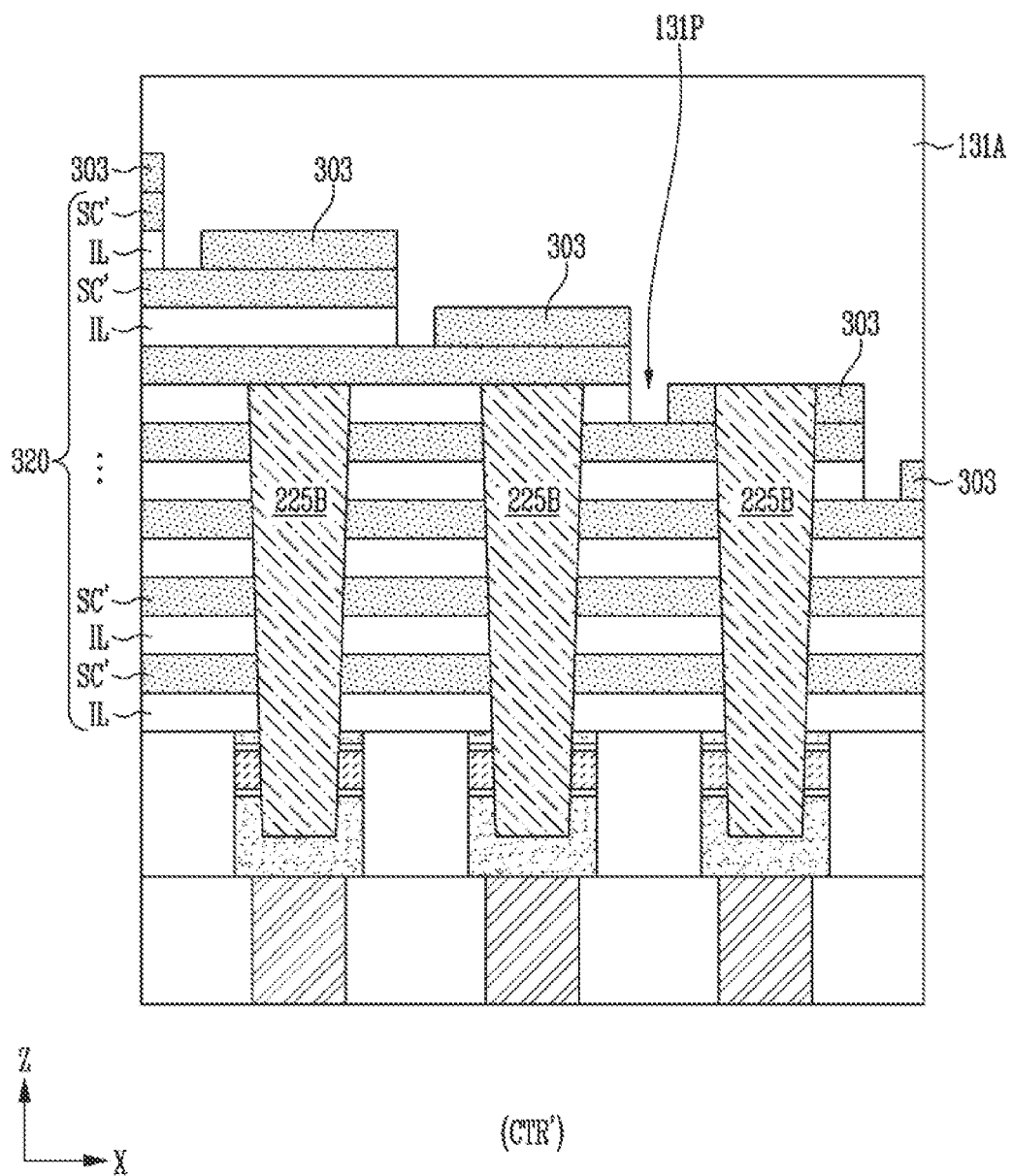

Referring to FIG. 33C, the spacer pattern 301 shown in FIG. 33B may be removed. Subsequently, a first filling insulating layer 131A may be formed as described with reference to FIGS. 11A and 11B. The first filling insulating layer 131A may cover the preliminary stepped stack structure 320, and include a protrusion part 131P filling a region in which the spacer pattern 301 shown in FIG. 33B is removed. However, the present disclosure is not limited thereto. In an embodiment, the spacer pattern 301 configured with an insulating material may remain, and the first filling insulating layer 131A may cover the remaining spacer pattern 301.

Figure 33D:
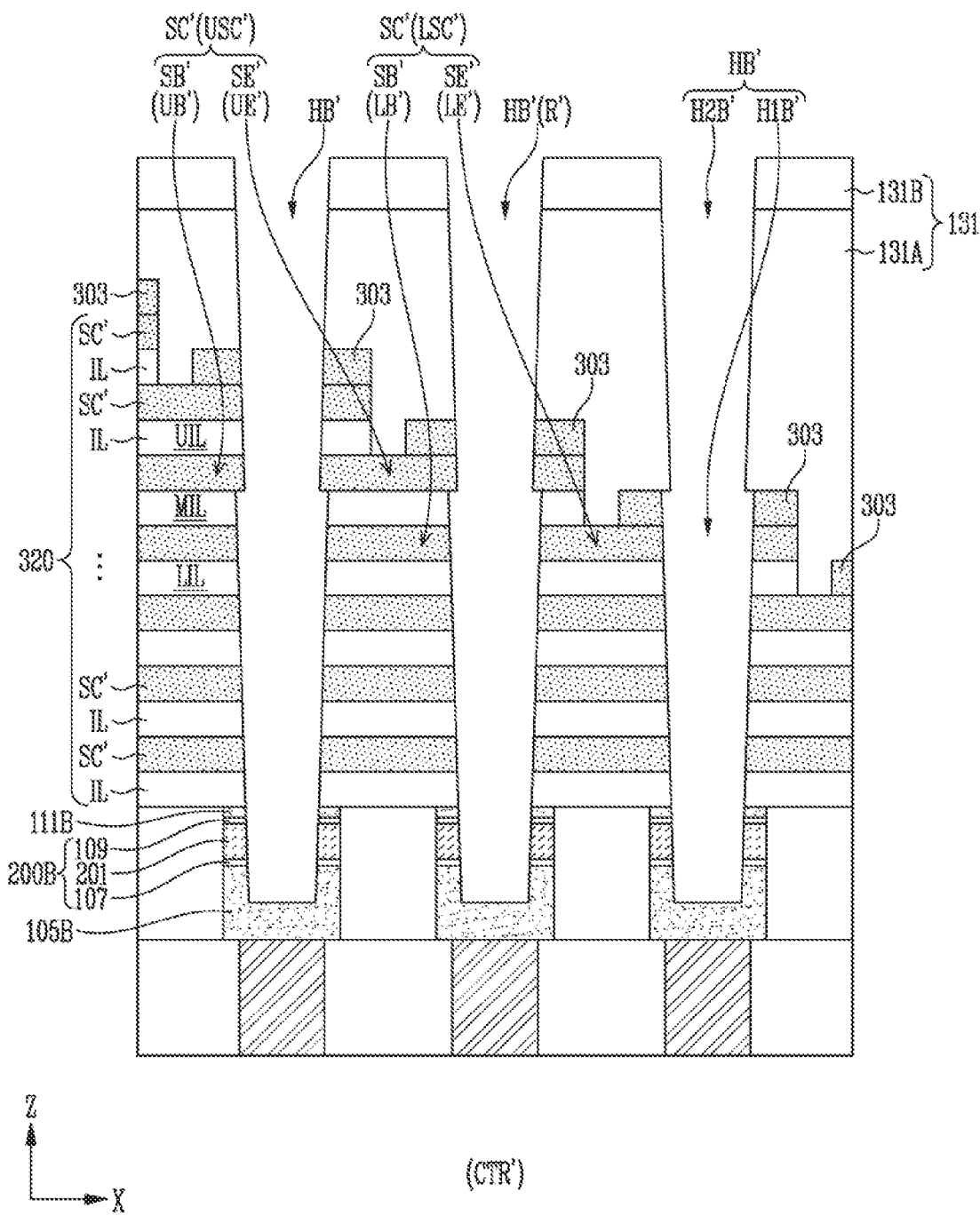

Referring to FIG. 33D, a second filling insulating layer 131B may be formed on the first filling insulating layer 131A as described with reference to FIGS. 11A and 11B. Accordingly, a filling insulating layer 131 including the first filling insulating layer 131A and the second filling insulating layer 131B may be formed over the preliminary stepped stack structure 320.

Subsequently, the filling insulating layer 131 and the preliminary stepped stack structure 320, which overlap with the plurality of sacrificial pillars 225B shown in FIG. 33C, may be etched. Subsequently, the plurality of sacrificial pillars 225B shown in FIG. 33C may be removed. Accordingly, a plurality of contact holes HB' may be formed.

The plurality of edge parts SE' of the plurality of sacrificial layers SC' may be respectively penetrated by the plurality of contact holes HB'. Each contact hole HB' may penetrate the contact region CTR' of the preliminary stepped structure 320, and a second semiconductor pattern 111B and a preliminary contact structure 200B, which correspond thereto, and extend to the inside of a first semiconductor pattern 105B corresponding thereto. The first sacrificial pads 303 may be respectively penetrated by the plurality of contact holes HB'.

As described with reference to FIG. 13A, a reference hole R' among the plurality of contact holes HB' may be spaced apart from the upper interlayer insulating layer UIL, and penetrate the middle interlayer insulating layer MIL, the upper sacrificial layer USC', the lower sacrificial layer LSC', and the lower interlayer insulating layer LIL. For example, the reference hole R' may penetrate the upper edge part UE' of the upper sacrificial layer USC' and the lower base part LB' of the lower sacrificial layer LSC'.

Figure 33E:
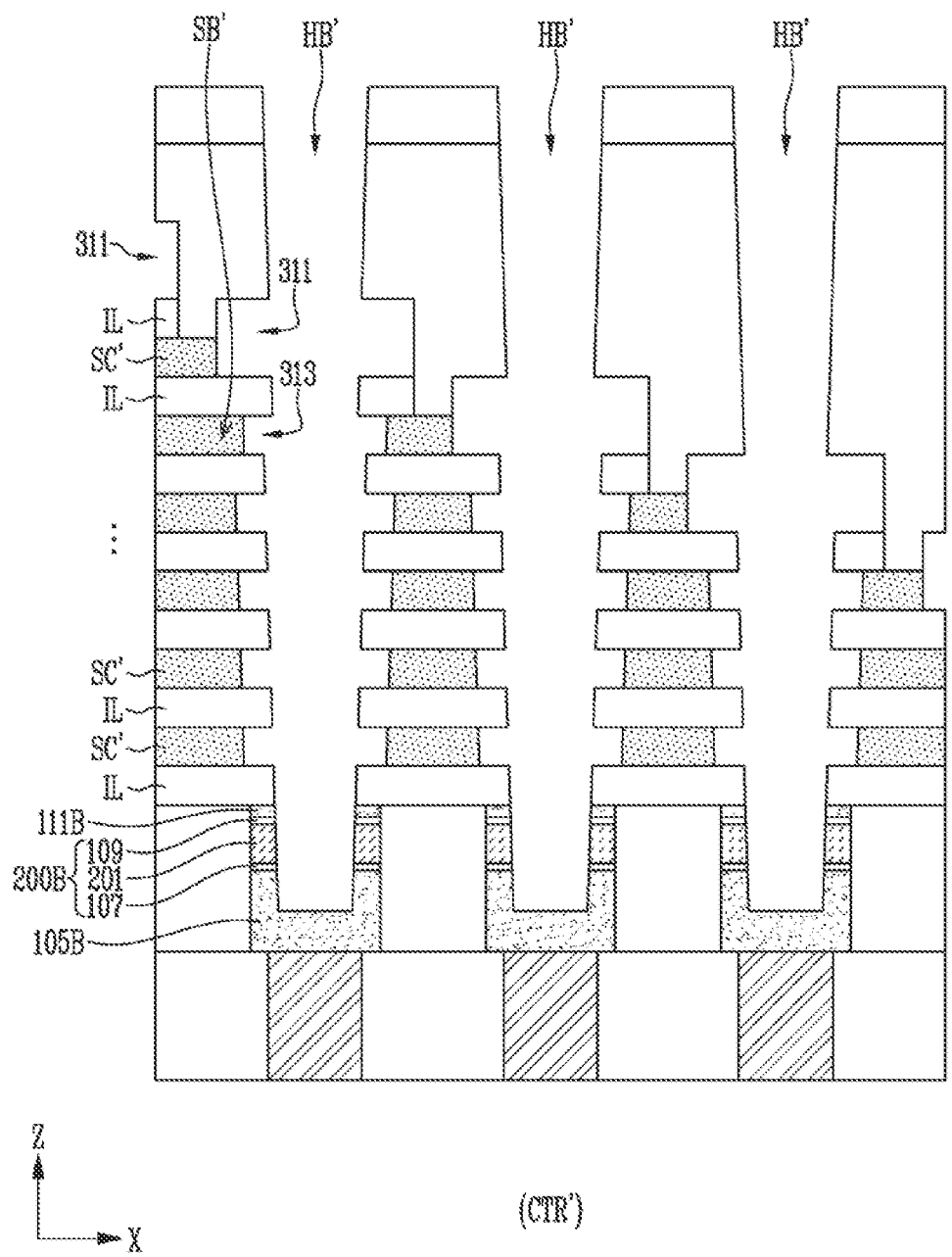

Referring to FIG. 33E, the plurality of edge parts SE' of the plurality of sacrificial layers SC' and the plurality of first sacrificial pads 303, which are shown in FIG. 33D, may be removed through the plurality of contact holes HB'. Accordingly, a plurality of first recess regions 311 may be defined. While the plurality of first sacrificial pads 303 and the plurality of edge parts SE', which are shown in FIG. 33D, are removed, the plurality of base parts SB' may be etched through the plurality of contact holes HB'. Accordingly, a plurality of second recess regions 313 may be defined in regions in which the plurality of base parts SB' are removed. Due to the removal of the first sacrificial pad 303, the first recess region 311 may be defined to have a width wider in the Z-axis direction than that of the second recess region 313.

Figure 33F:
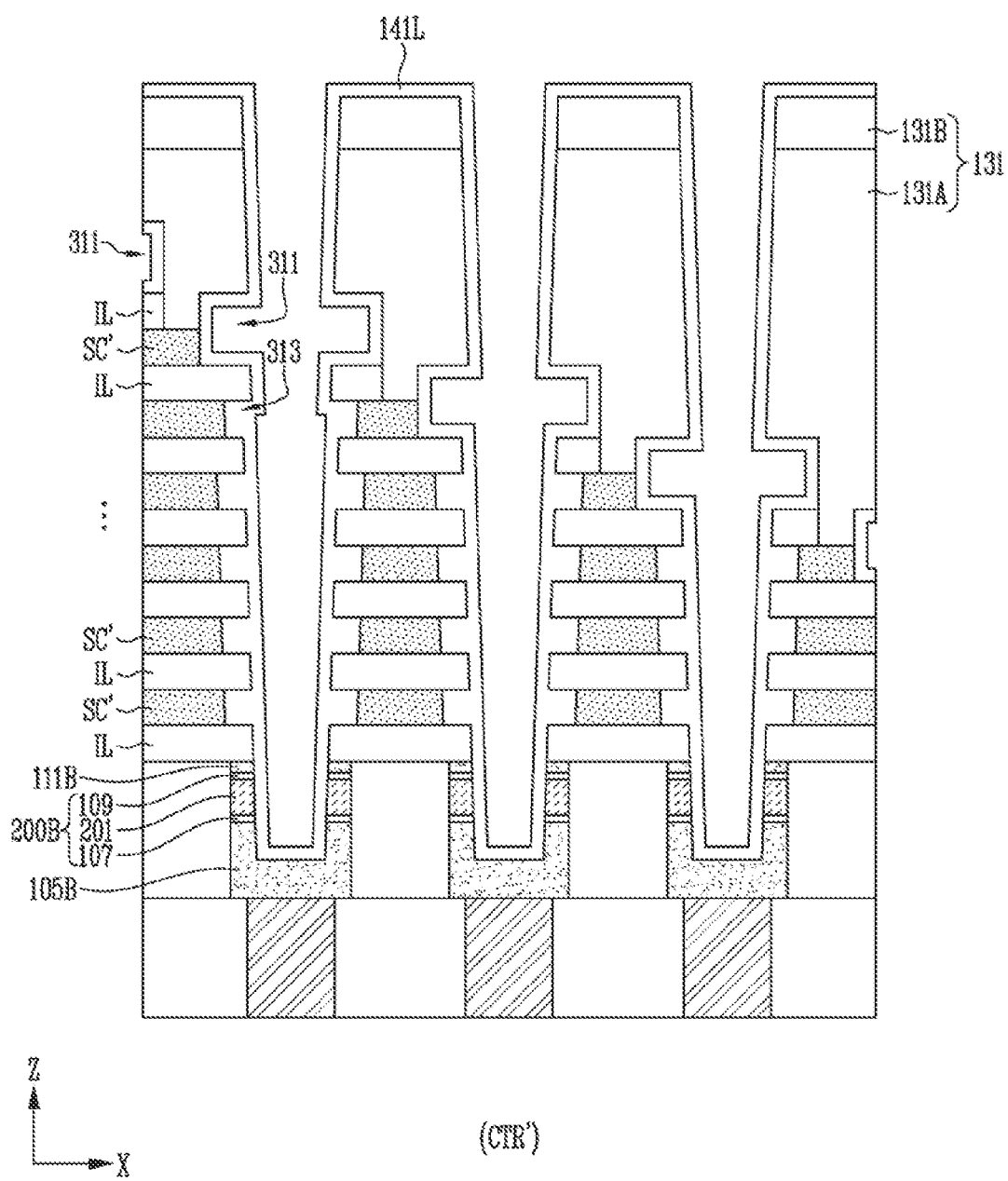

Referring to FIG. 33F, a contact insulating layer 141L may be formed along surfaces of the first recess region 311, the second recess region 313, and the contact hole HB'. The contact insulating layer 141L may extend along a surface of the filling insulating layer 131. The contact insulating layer 141L may be formed of a material having an etch selectivity with respect to the sacrificial layer SC'.

The contact insulating layer 141L may fill the second recess region 313 having a relatively narrow width. The first recess region 311 having a relatively wide width is not completely filled with the contact insulating layer 141L, but a central region of the first recess region 311 may be opened.

Figure 33G:
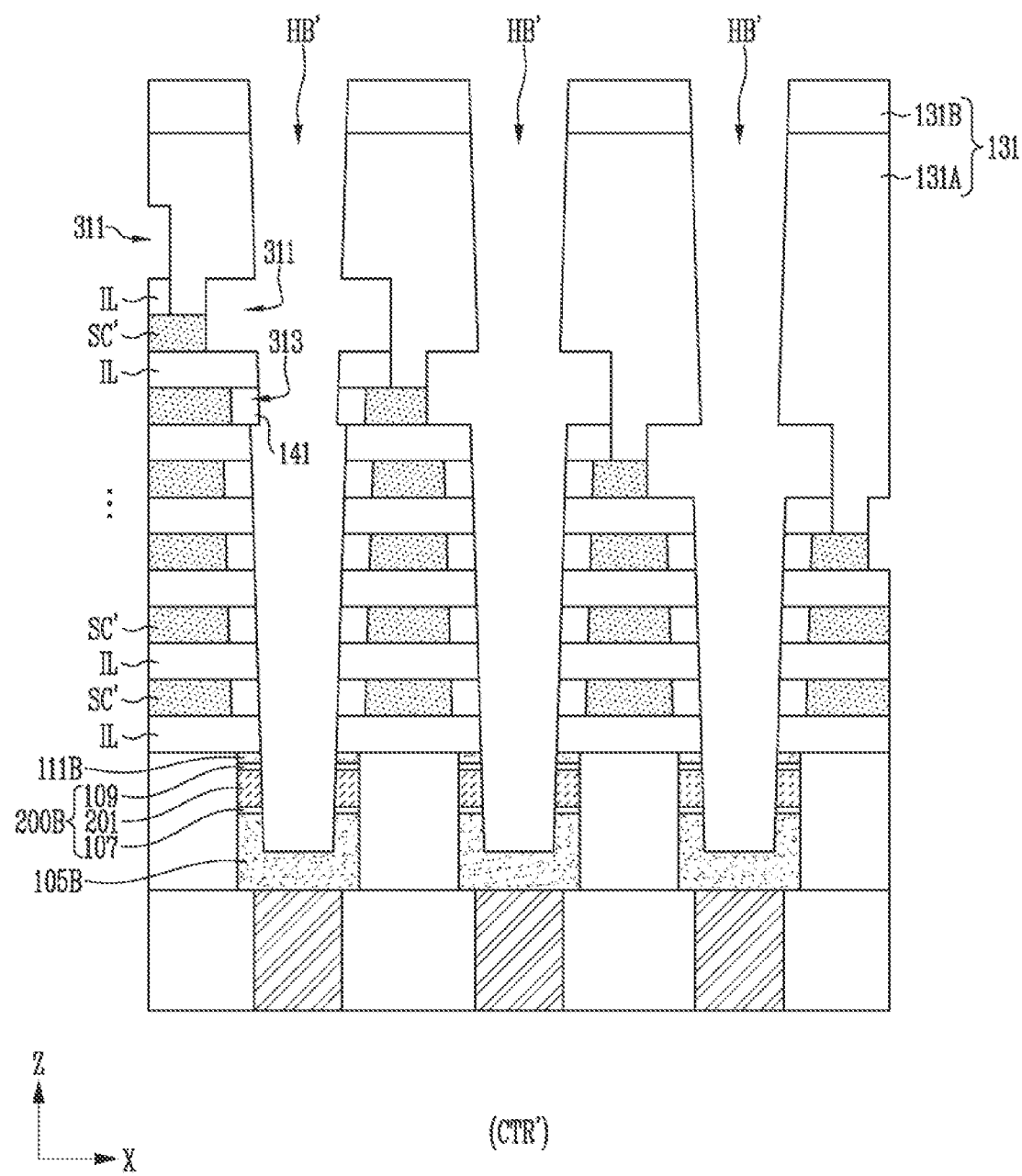

Referring to FIG. 33G, the contact insulating layer 141L shown in FIG. 33F may be etched, to be isolated into a plurality of contact insulating patterns 141. Each contact insulating pattern 141 may remain in a second recess region 313 corresponding thereto. The plurality of first recess regions 311 may be opened through the process of etching the contact insulating layer 141L.

Figure 33H:
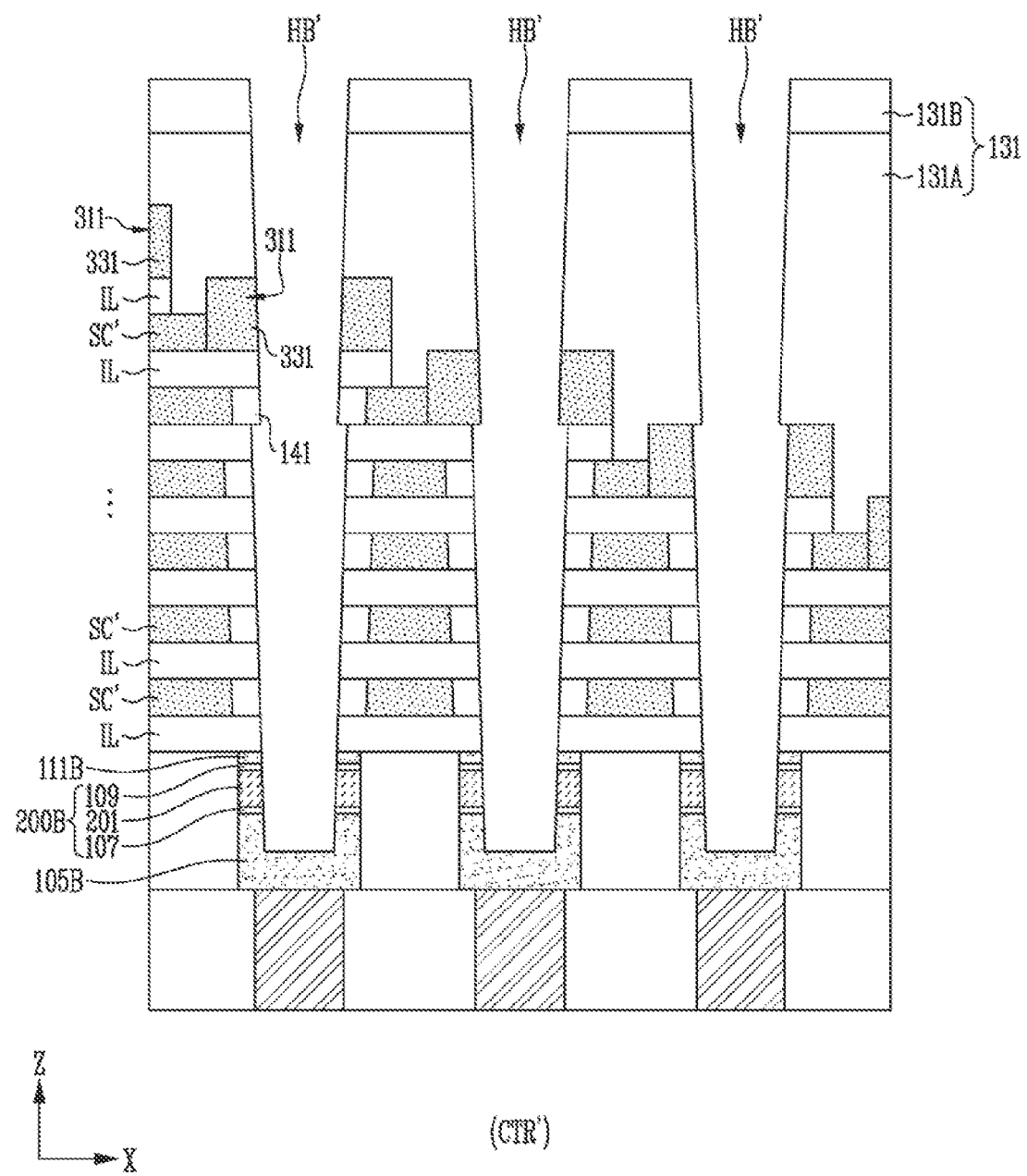

Referring to FIG. 33H, the plurality of first recess regions 311 may be respectively filled with a plurality of second sacrificial pads 331 through the plurality of contact holes HB'. The second sacrificial pad 331 may be formed of the same material as the sacrificial layer SC'. The second sacrificial pad 331 may be formed thicker in the Z-axis direction than the sacrificial layer SC'.

As described above, a portion of the base part SB' of the sacrificial layer SC' shown in FIG. 33D may be replaced with the contact insulating pattern 141, the edge part SE' of the sacrificial layer SC' shown in FIG. 33D and the first sacrificial pad 303 may be replaced with the second sacrificial pad 331. The contact insulating pattern 141 may be automatically aligned at a target position by a difference between a total thickness of the edge part SE' of the sacrificial layer SC' shown in FIG. 33D and the first sacrificial pad 303 and a thickness of the base part SB' of the sacrificial layer SC'.

Figure 33I:
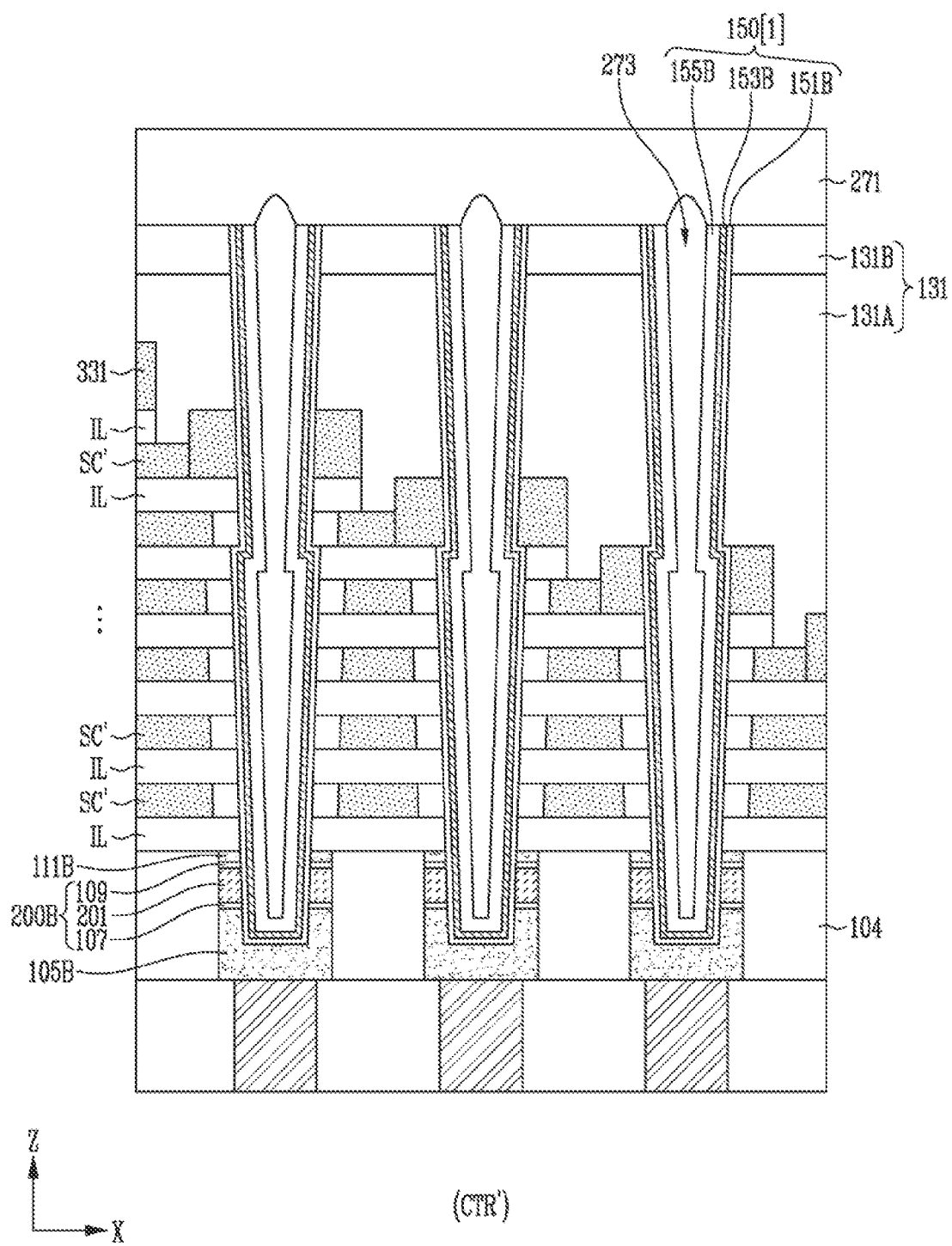

Referring to FIG. 33I, a support structure 150[1] may be formed in the contact hole HB' by using the processes described above with reference to FIGS. 19A, 19B, 20A, 20B, 21, 22A, and 22B. The support structure 150[1] may include a dummy memory pattern 151B, a dummy channel layer 153B, and a dummy core insulating pattern 155B.

Subsequently, as described with reference to FIGS. 23A and 23B, an upper protective layer 271 may be formed over the filling insulating layer 131 such that a void 273 can be defined in the contact hole HB'.

Figure 33J:
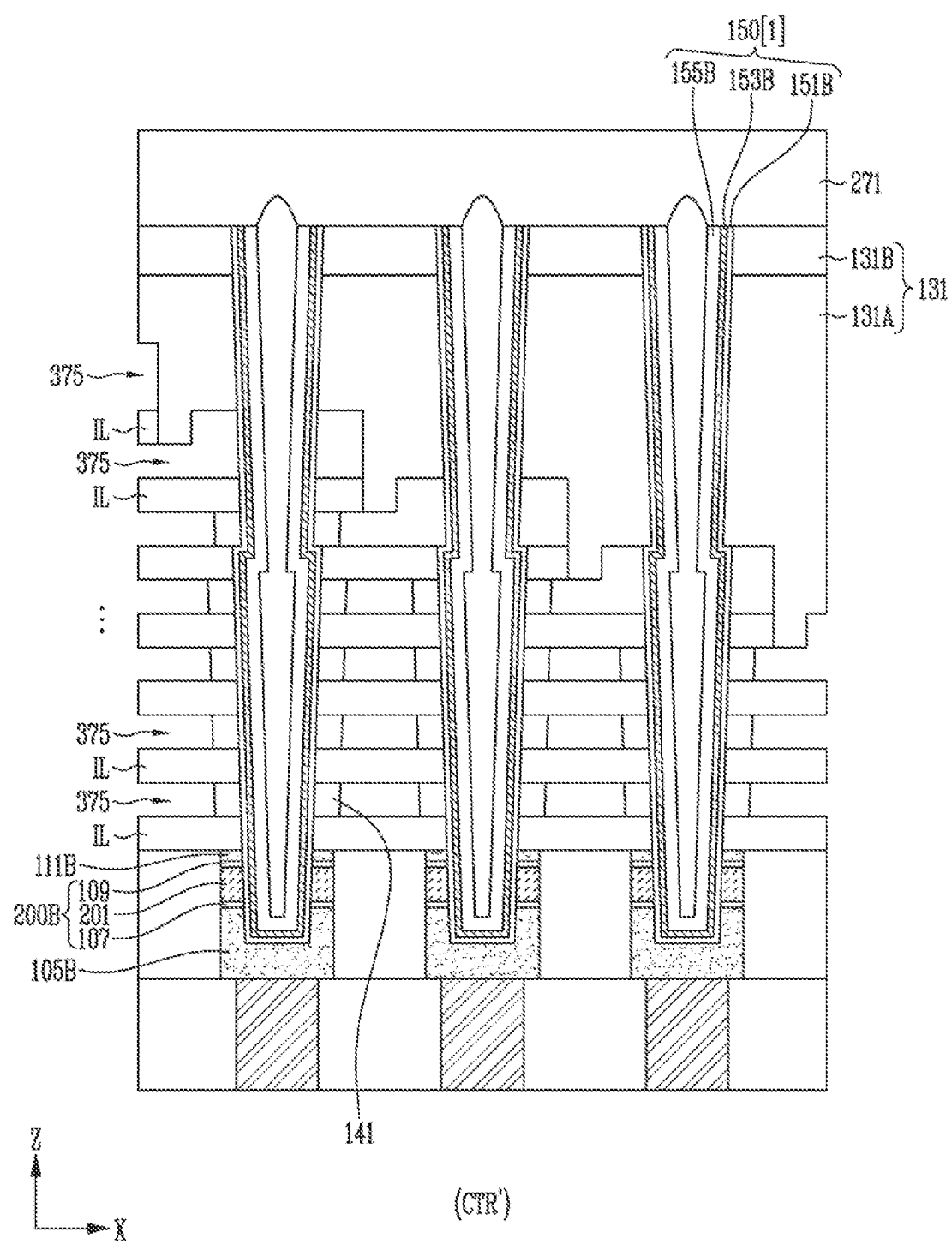

Referring to FIG. 33J, the plurality of sacrificial layers SC' and the plurality of second sacrificial pads 331, which are shown in FIG. 33I, may be removed by using the processes described with reference to FIGS. 24A and 24B. Accordingly, a plurality of gate regions 375 may be opened.

Subsequently, the processes described with reference to FIGS. 25A, 25B, 26, 27, 28A, 28B, 29A, 29B, 30A, 30B, 31A, 31B, 32A, and 32B may be performed.

Figure 34A:
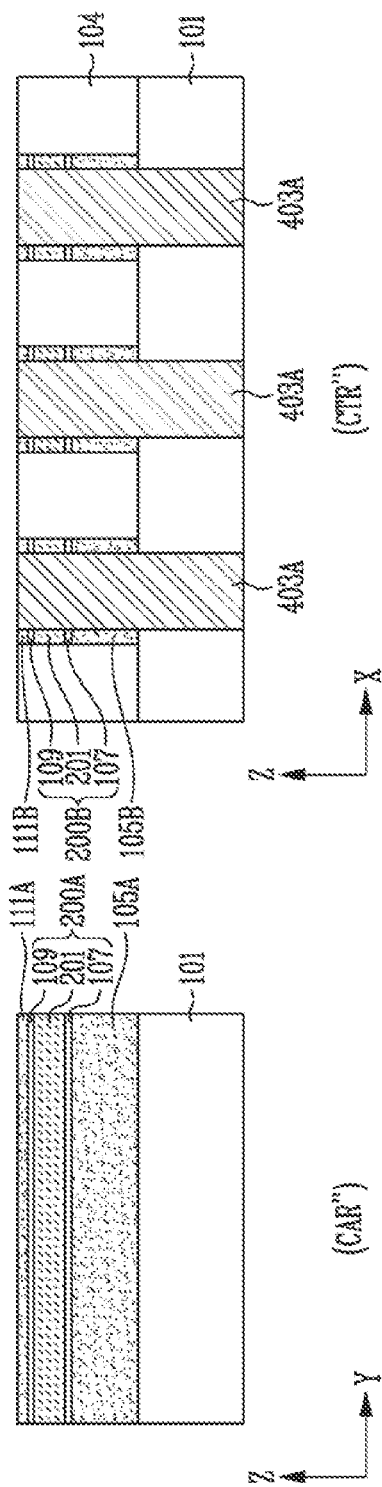
Figure 34B:
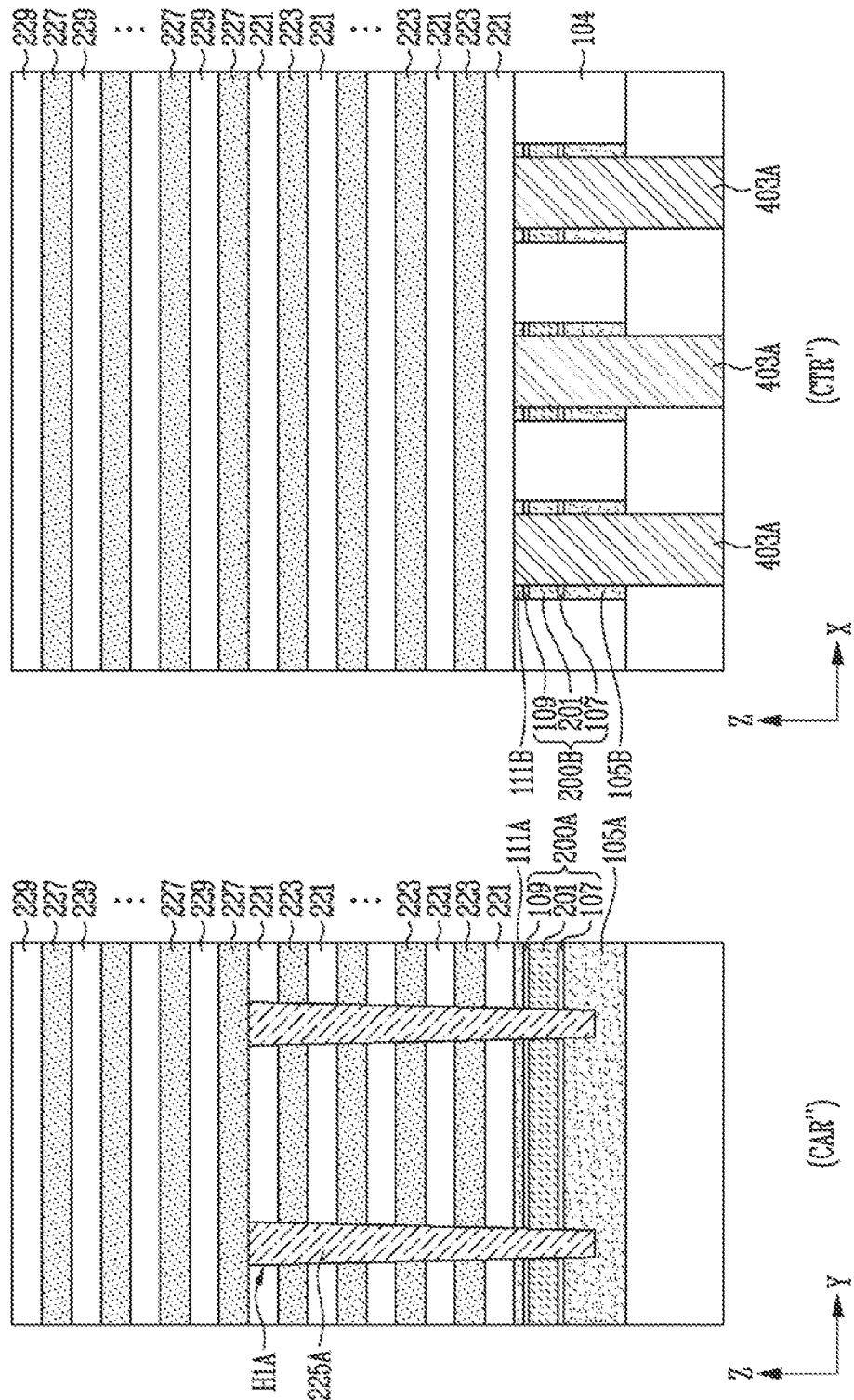
Figure 34C:
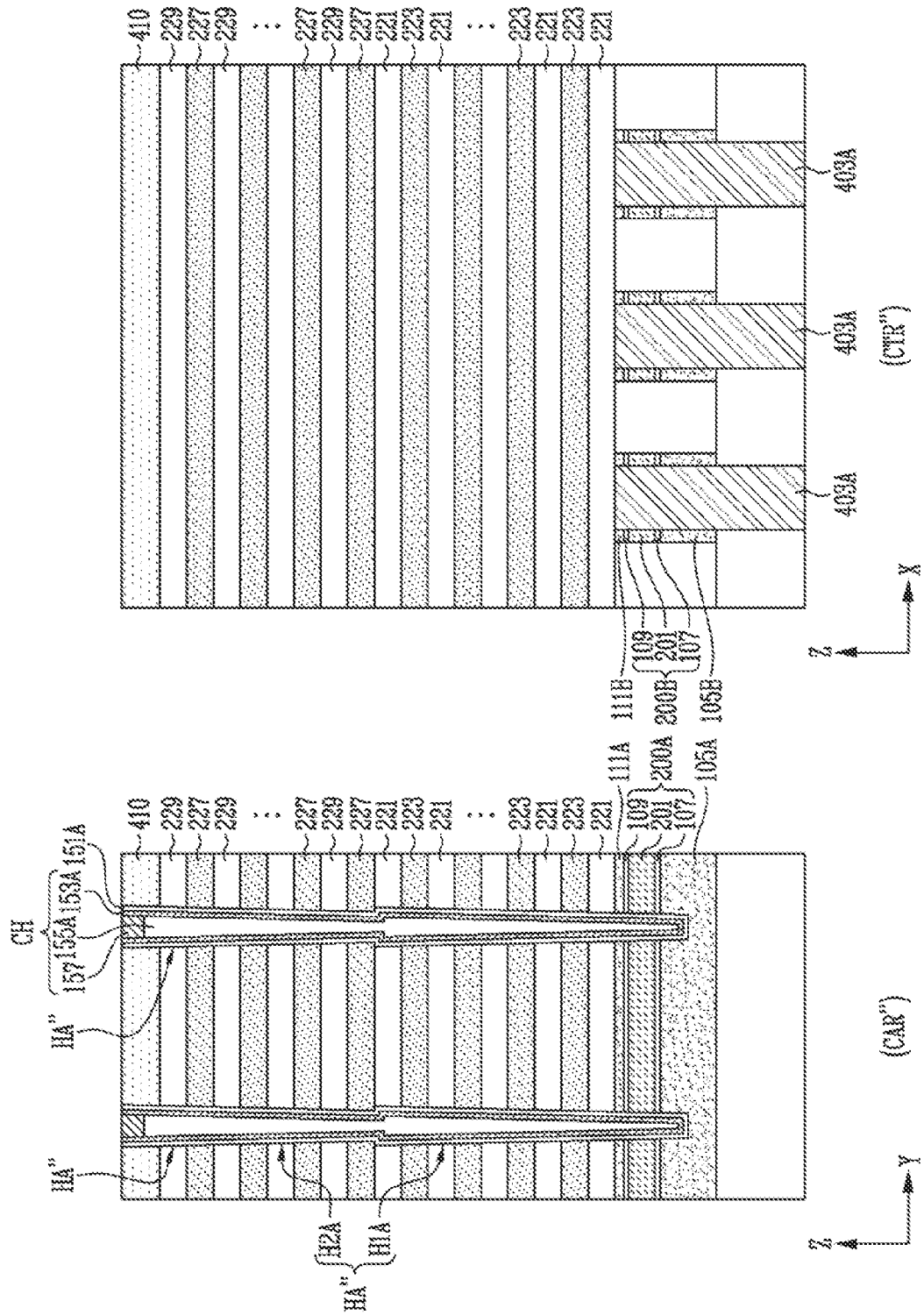
Figure 34D:
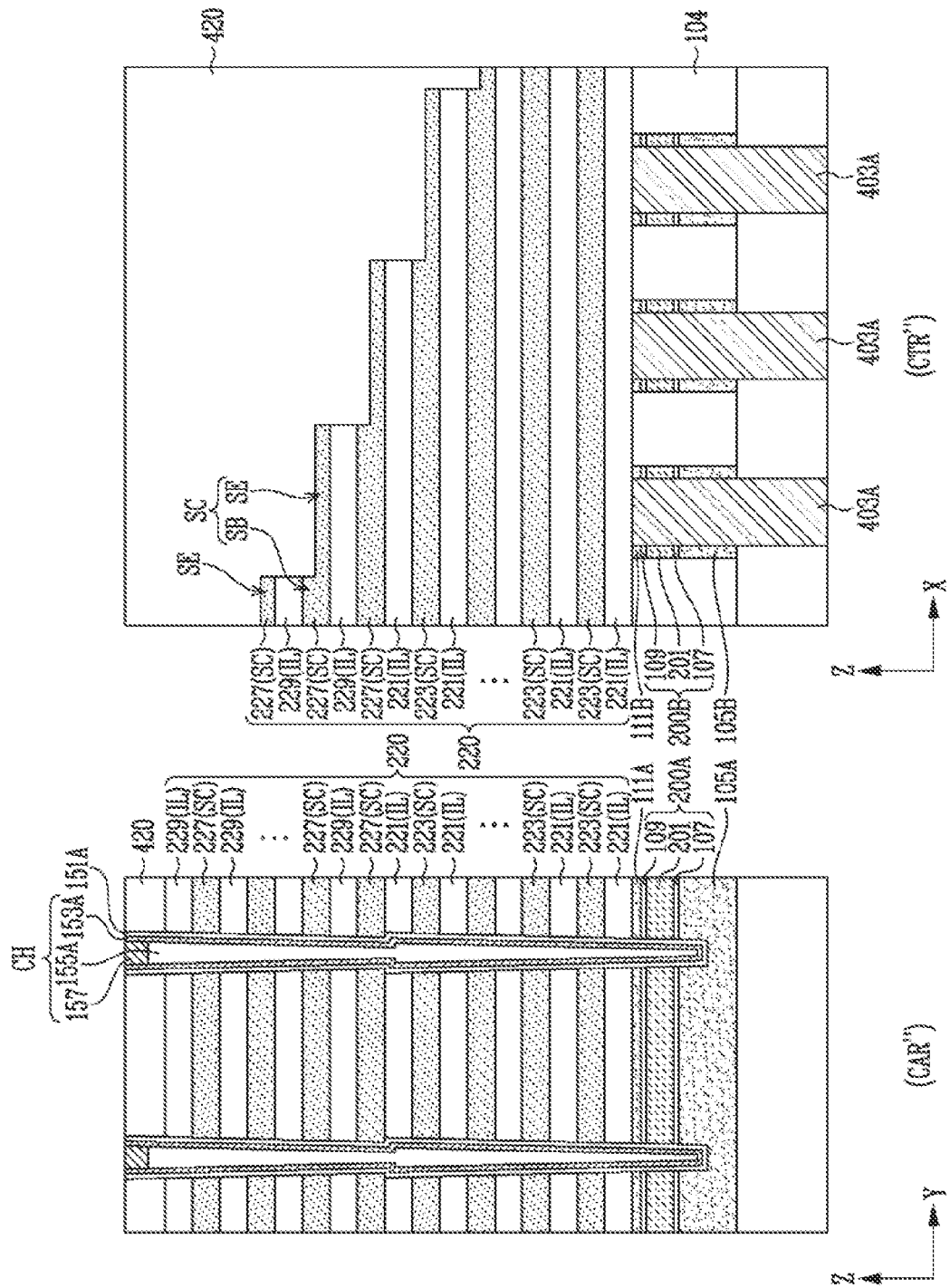
Figure 34E:
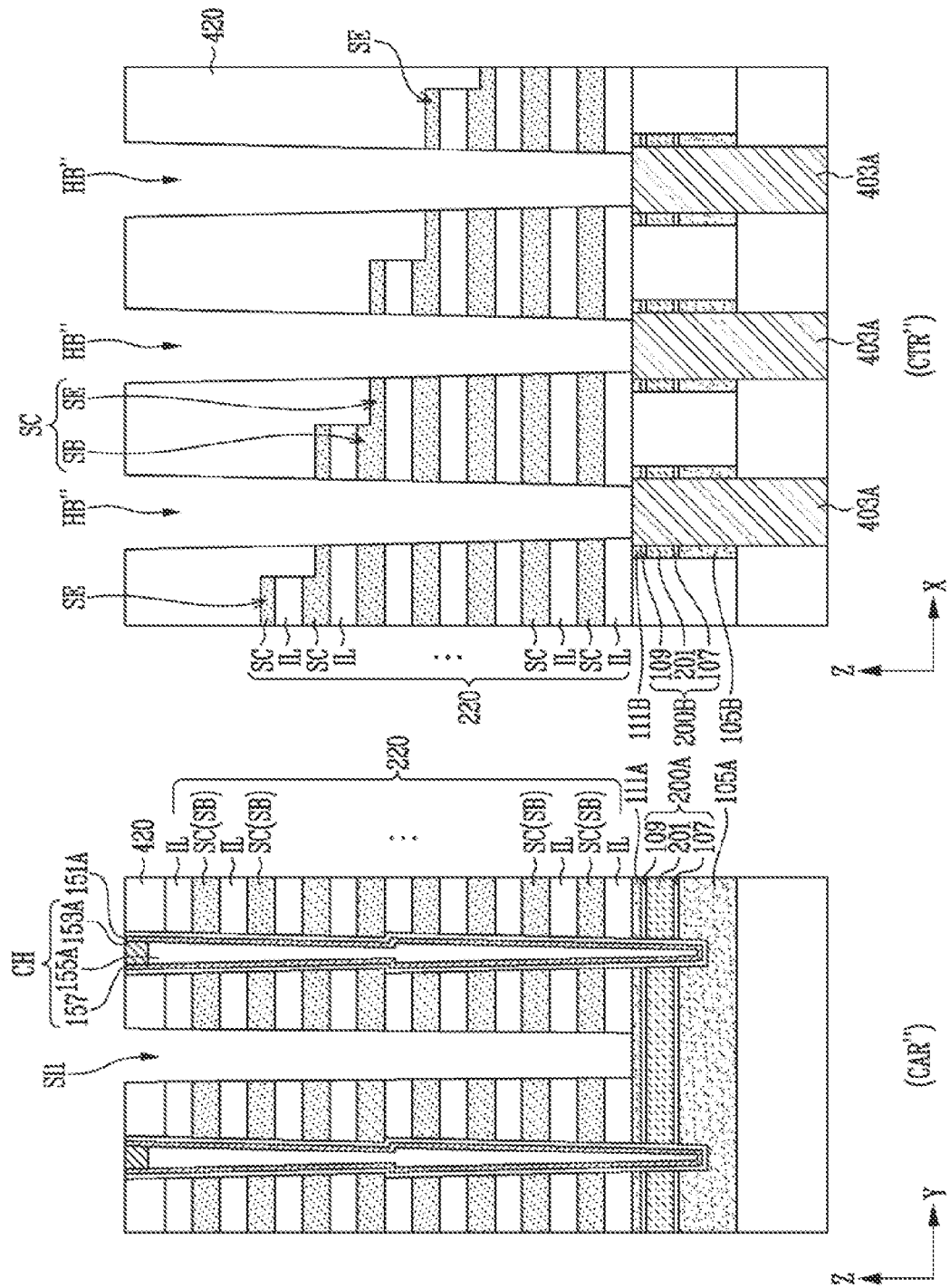
Figure 34G:
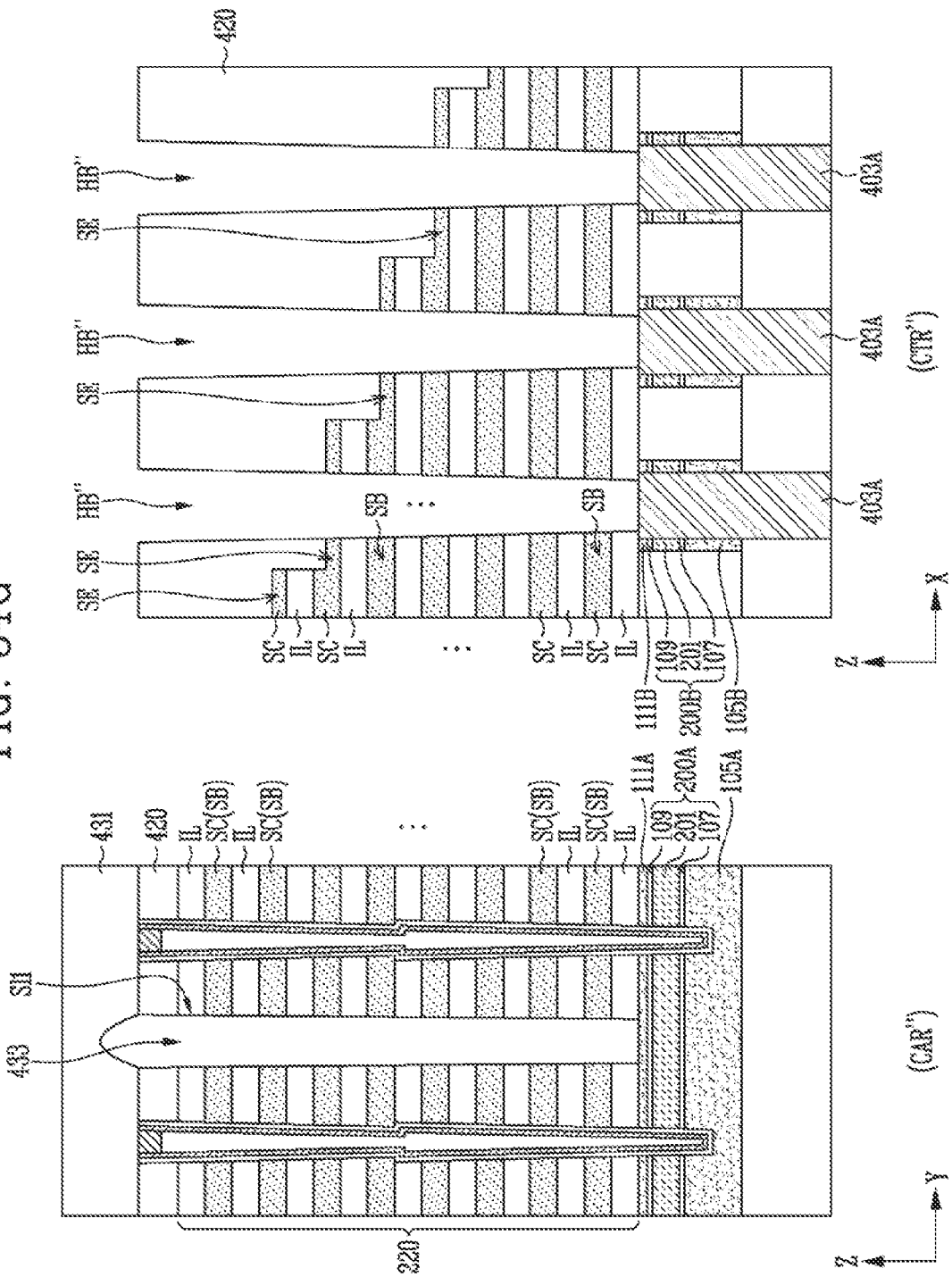
Figure 34H:
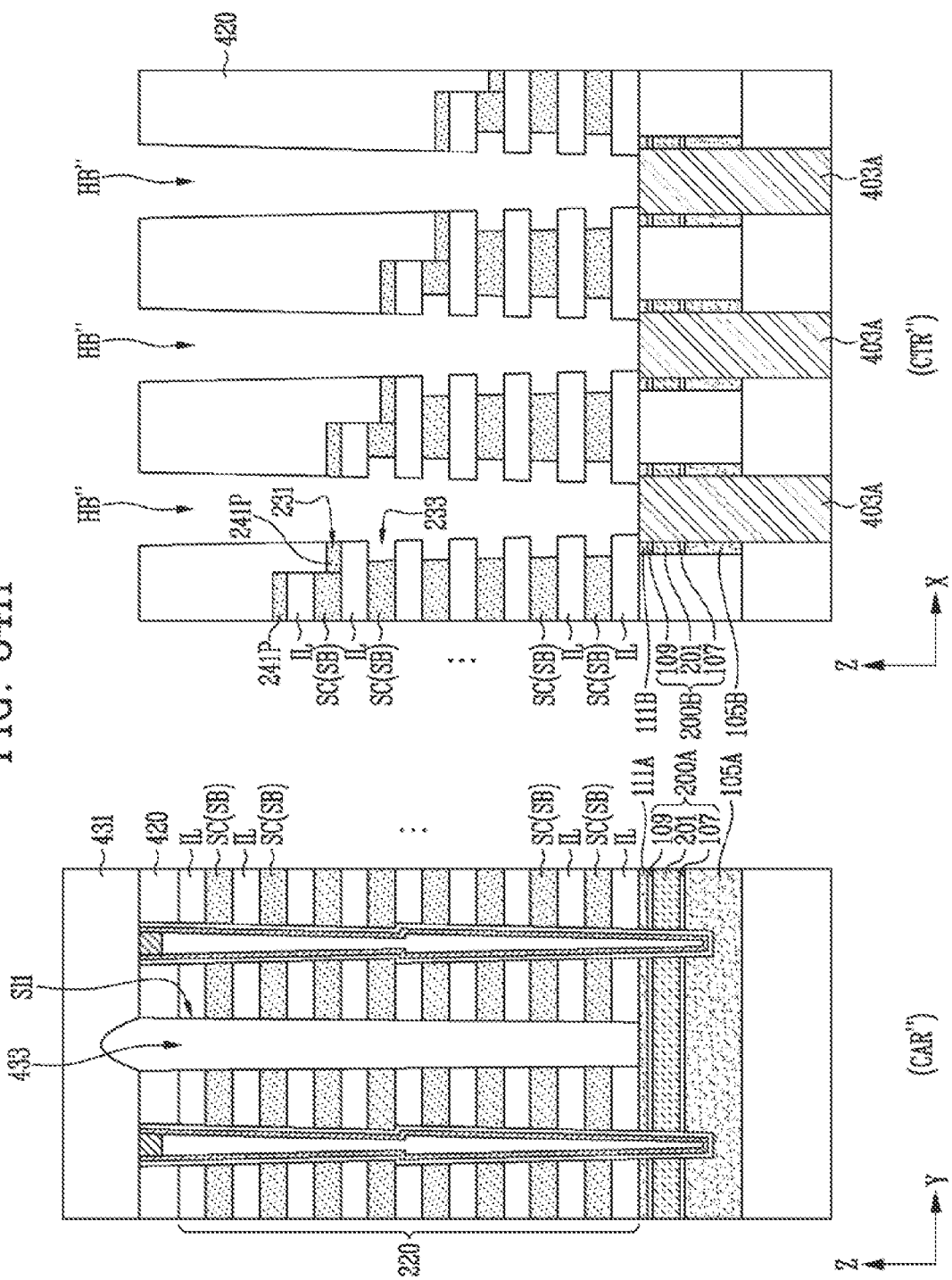
Figure 34I:
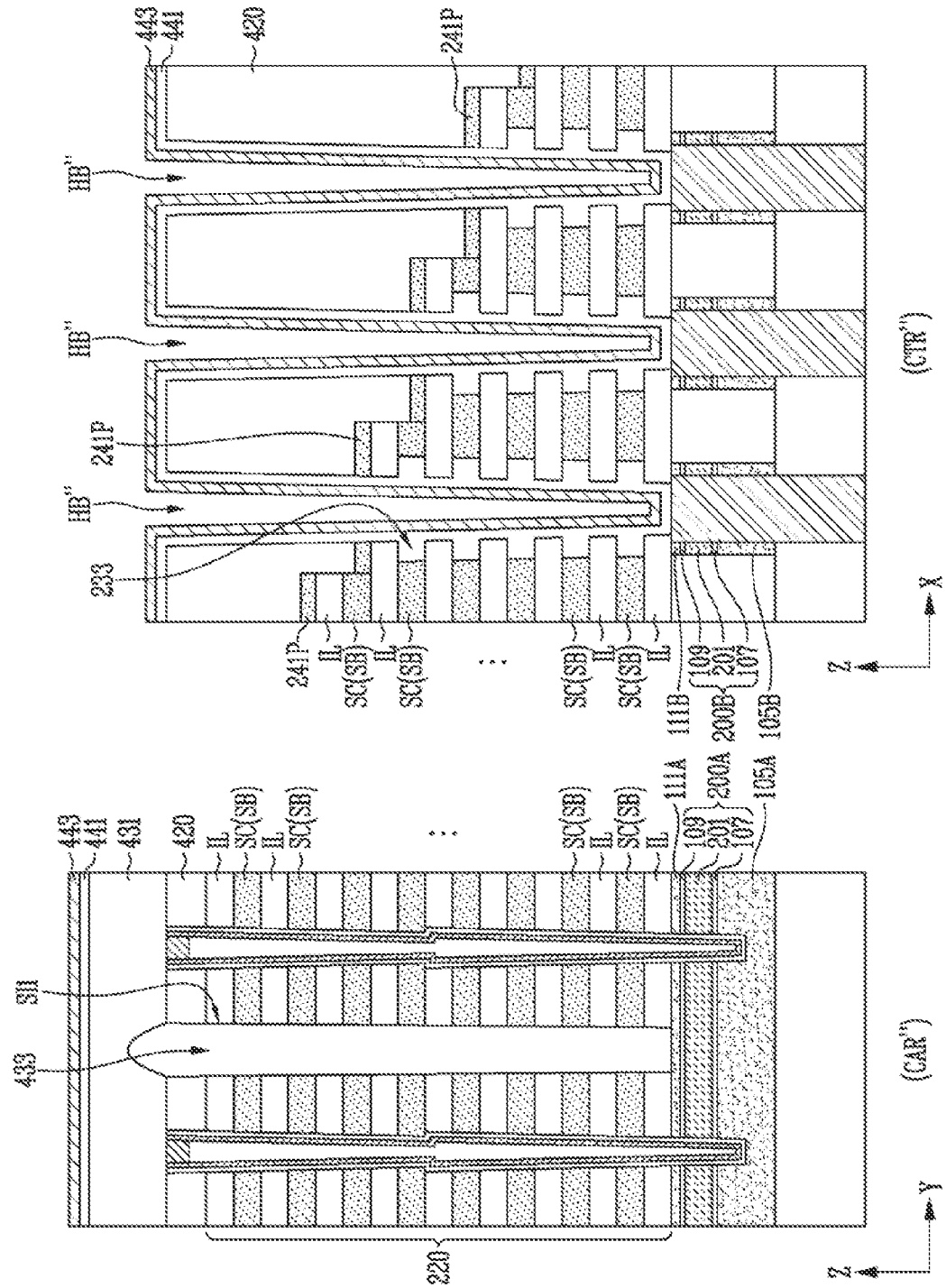
Figure 34J:
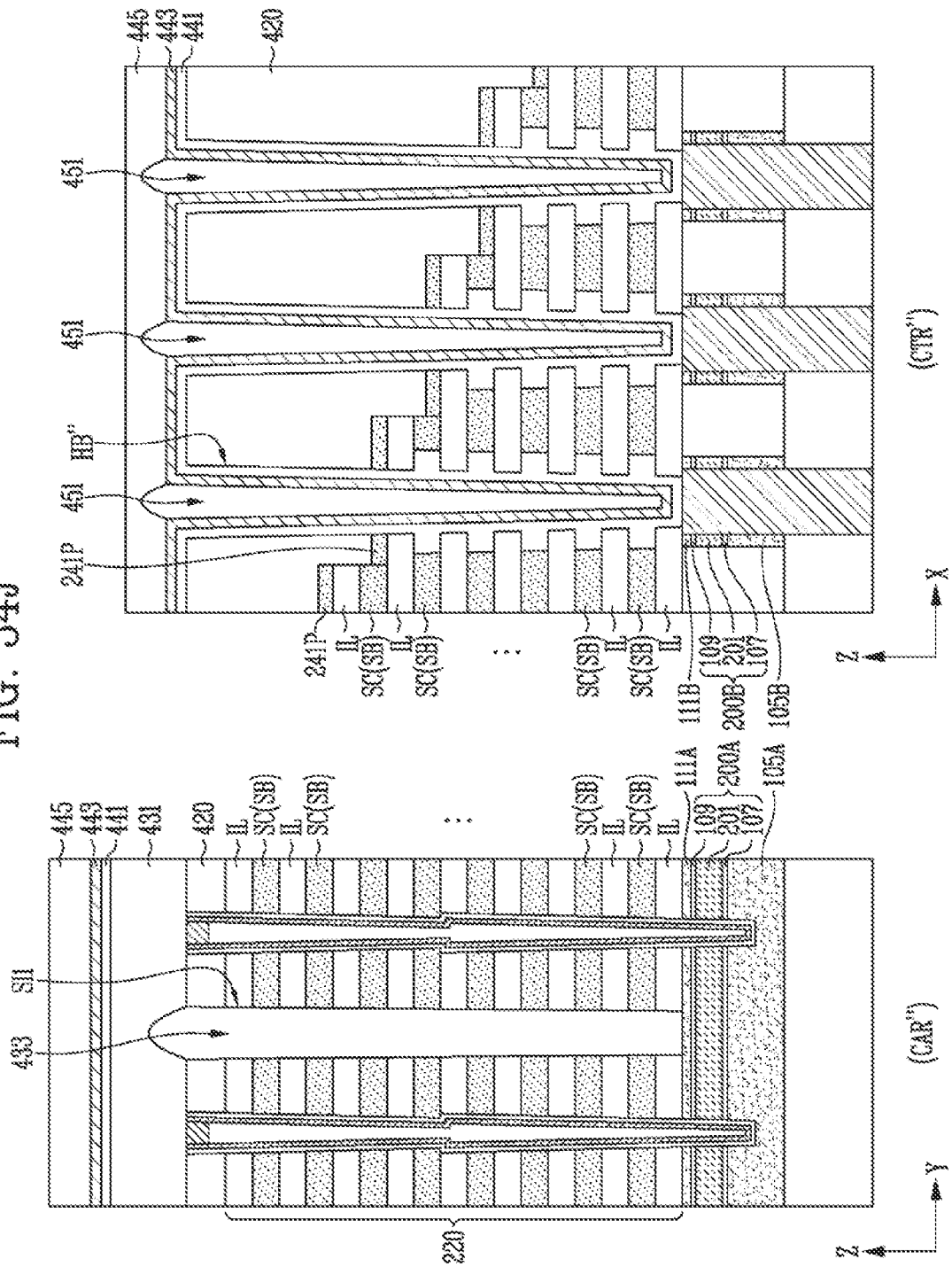
Figure 34K:
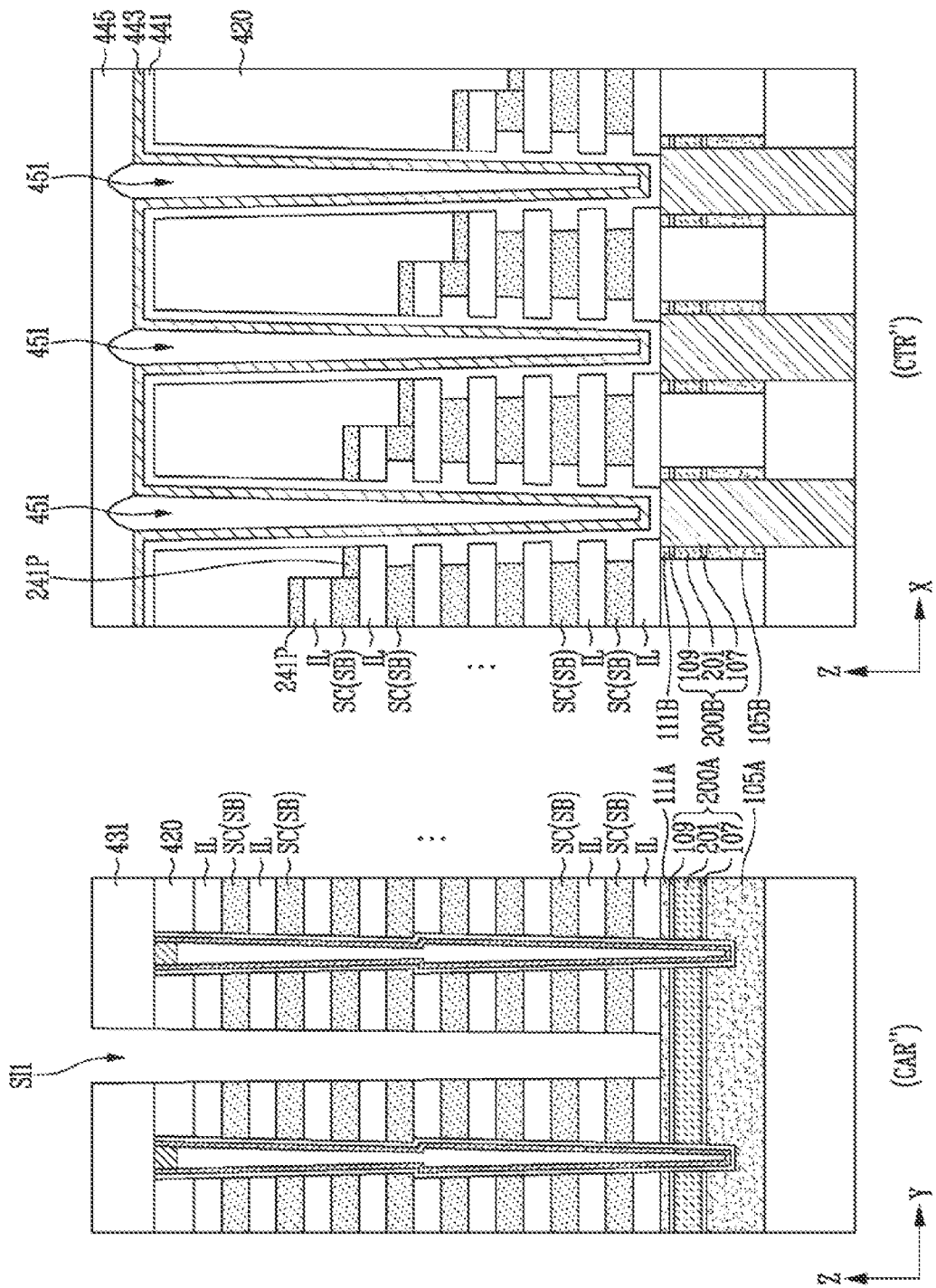
Figure 34L:
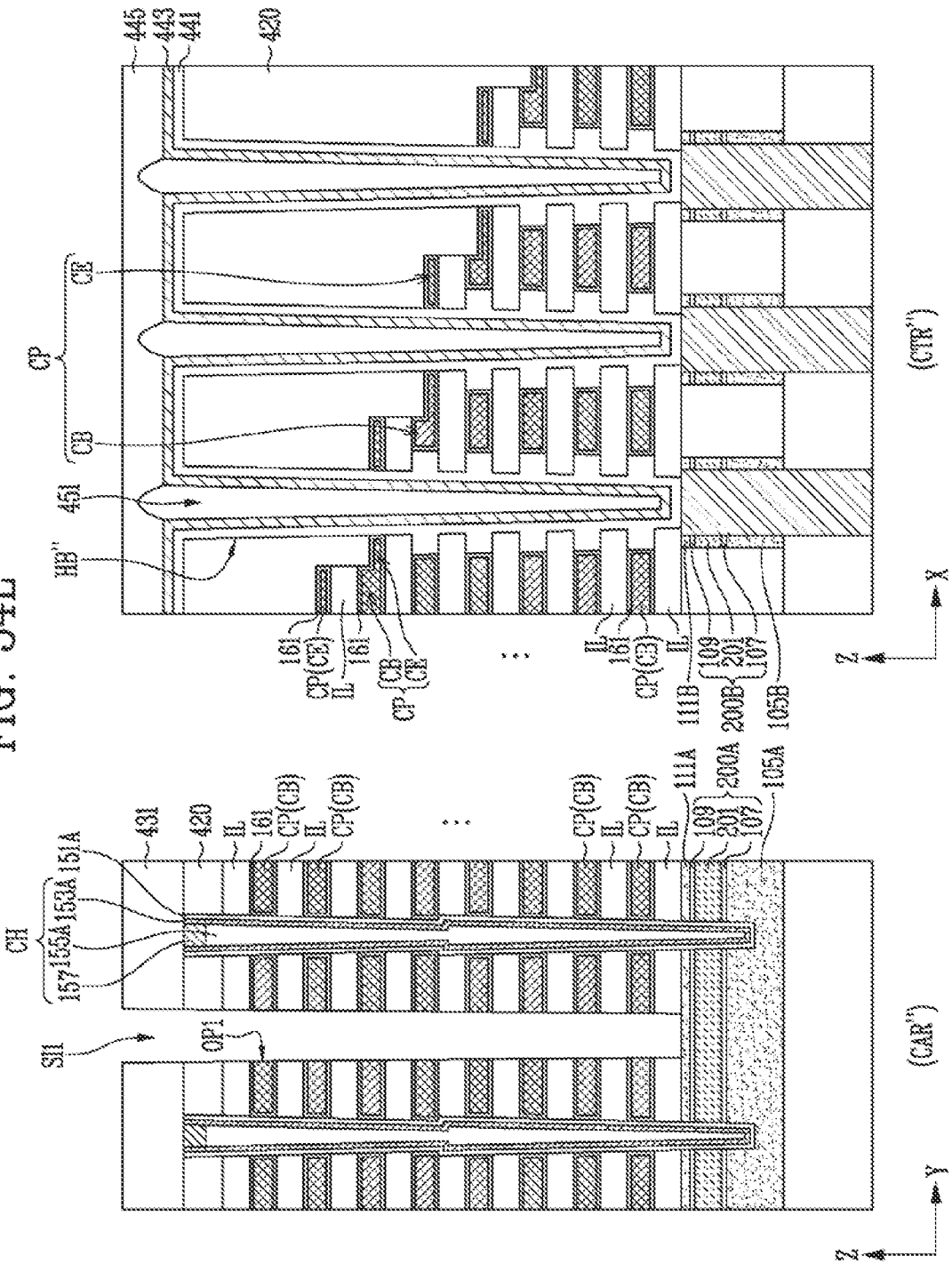
Figure 34M:
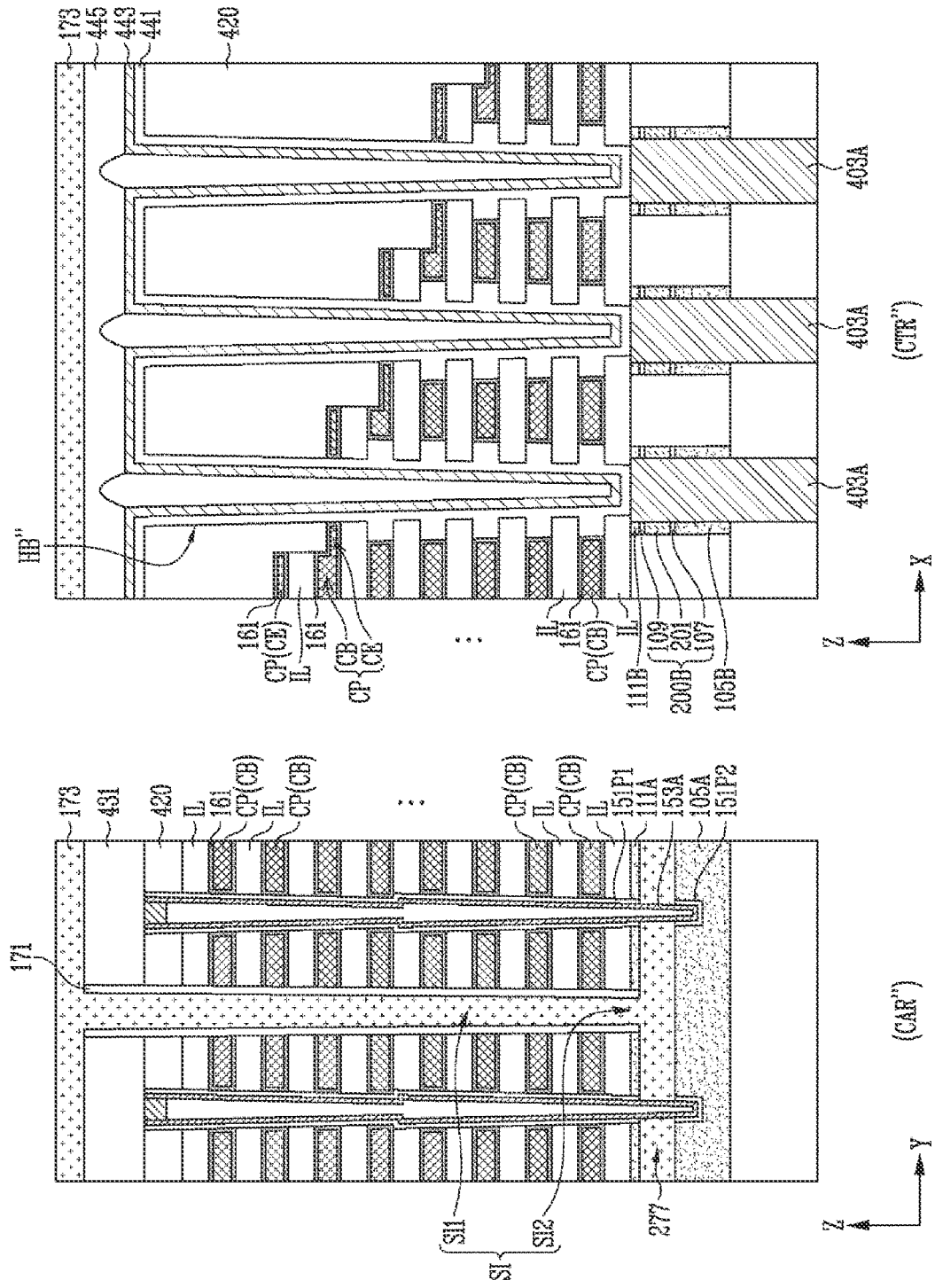
Figure 34O:
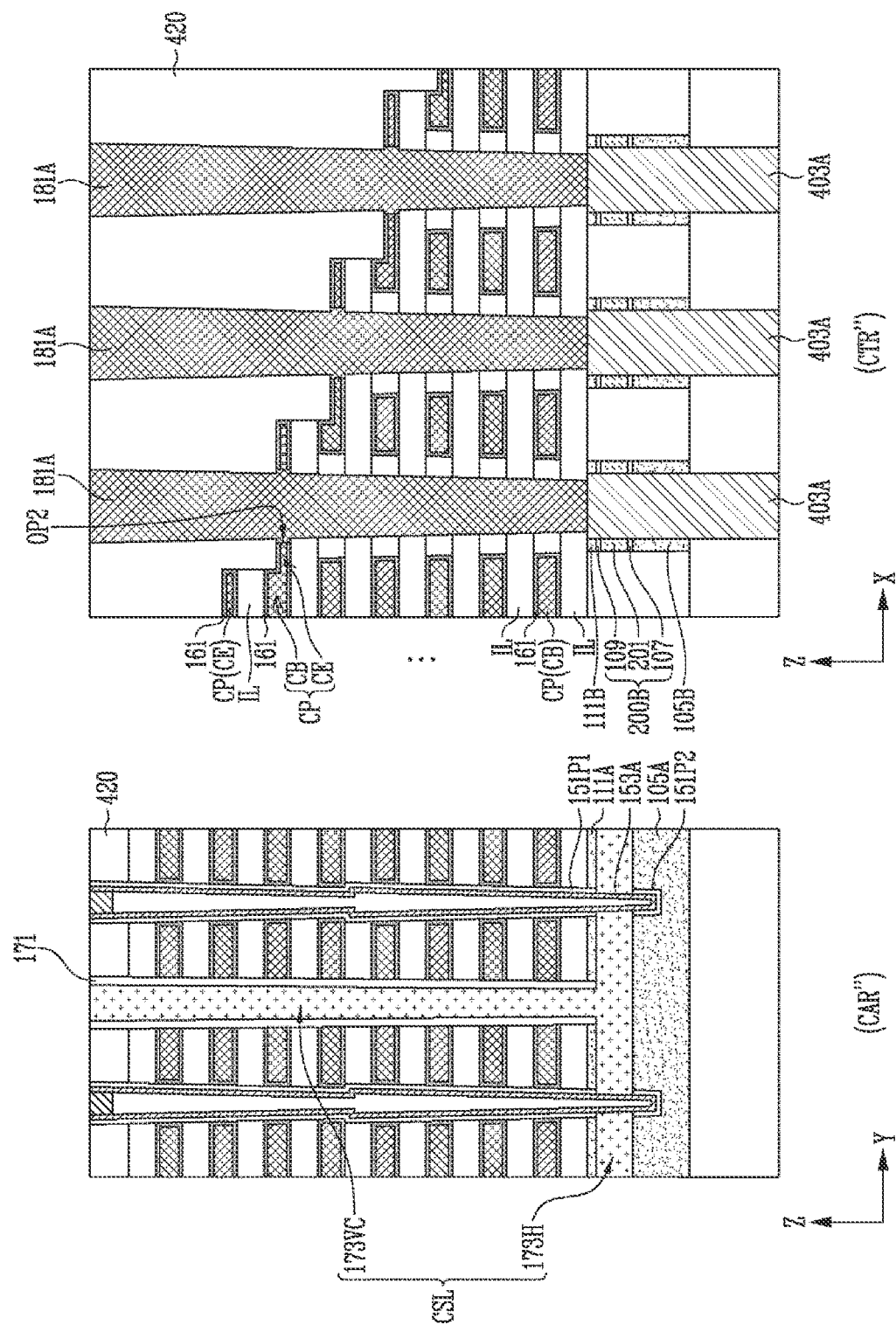

FIGS. 34A to 34O are sectional views illustrating a manufacturing method of a semiconductor memory device in accordance with an embodiment of the present disclosure. FIGS. 34A to 34O illustrate a manufacturing method of partial regions of the semiconductor memory device, which correspond to a cell region CAR" and a contact region CTR" of a gate stack structure. Although not shown in the following drawings, the gate stack structure may include an extension region as described with reference to FIG. 2, and a manufacturing process in the extension region may be performed similarly to that in the contact region CTR", which will be described later. Hereinafter, overlapping descriptions of components identical to those shown in FIGS. 7A to 32B will be omitted.

Referring to FIG. 34A, a first semiconductor layer, a lower stack structure, and a second semiconductor layer may be stacked on a first lower insulating layer 101. The lower stack structure may include a first protective layer 107, a horizontal layer 201 on the first protective layer 107, and a second protective layer 109 on the horizontal layer 201 as described with reference to FIGS. 7A and 7B.

Subsequently, as described with reference to FIGS. 7A and 7B, the second semiconductor layer, the lower stack structure, and the first semiconductor layer may be etched. Accordingly, the first semiconductor layer may be isolated into a plurality of first semiconductor patterns 105A and 105B overlapping with the first lower insulating layer 101. The second semiconductor layer may be isolated into a plurality of second semiconductor patterns 111A and 111B respectively overlapping with the plurality of first semiconductor patterns 105A and 105B. In addition, the lower stack structure may be isolated into a preliminary horizontal pattern 200A and a plurality of preliminary contact structures 200B. The preliminary horizontal pattern 200A may be disposed between a first semiconductor pattern 105A and a second semiconductor pattern 111A of the cell region CAR", and the plurality of preliminary contact structures 200B may be disposed between a plurality of first semiconductor patterns 105B and a plurality of second semiconductor patterns 111B of the contact region CTR".

Subsequently, spaces between the plurality of first semiconductor patterns 105A and 105B may be filled with a second lower insulating layer 104. The second lower insulating layer 104 may fill between the preliminary horizontal pattern 200A and the plurality of preliminary contact structures 200B and between the plurality of second semiconductor patterns 111A and 111B.

Subsequently, a plurality of lower contacts 403A may be formed. Each lower contact 403A may penetrate the second semiconductor pattern 111B, the preliminary contact structure 200A, the first semiconductor pattern 105B, and the first lower insulating layer 101 in the contact region CTR".

Referring to FIG. 34B, as described with reference to FIGS. 8A and 8B, a plurality of first material layers 221 and a plurality of second material layers 223 may be alternately stacked in the Z-axis direction on the second lower insulating layer 104 and the plurality of second semiconductor patterns 111A and 111B.

Subsequently, a first preliminary channel hole H1A may be formed, which penetrates the plurality of first material layers 221 and the plurality of second material layers 223 and extend to the inside of the first semiconductor pattern 105A in the cell region CAR". The first preliminary channel hole H1A may penetrate the second semiconductor pattern 111A and the preliminary horizontal pattern 200A, and extend to the inside of the first semiconductor pattern 105A.

Subsequently, as described with reference to FIGS. 8A and 8B, the first preliminary channel hole H1A may be filled with a sacrificial pillar 225A. While the first preliminary channel hole H1A and the sacrificial pillar 225A are formed, the plurality of first material layers 221 and the plurality of second material layers 223 may remain in a state in which the plurality of first material layers 221 and the plurality of second material layers 223 overlap with the plurality of lower contacts 403A in the contact region CTR".

Subsequently, as described with reference to FIGS. 9A and 9B, a plurality of third material layers 227 and a plurality of fourth material layers 229 on the sacrificial pillar 225A may be alternately stacked over the stack structure of the plurality of first material layers 221 and the plurality of second material layers 223, and the sacrificial pillar 225A.

Referring to FIG. 34C, an etch stop layer 410 may be formed over the stack structure of the plurality of third material layers 227 and the plurality of fourth material layers 229. The etch stop layer 410 may include a nitride layer. After the etch stop layer 410 is formed, the etch stop layer 410, the plurality of third material layers 227, and the plurality of fourth material layers 229, which overlap with the sacrificial pillar 225A shown in FIG. 34B, may be etched, thereby forming a second preliminary channel hole H2A. The second preliminary channel hole H2A may expose the sacrificial pillar 225A shown in FIG. 34B while penetrating the etch stop layer 410, the plurality of third material layers 227, and the plurality of fourth material layers 229.

Subsequently, the sacrificial pillar 225A shown in FIG. 34B may be removed through the second preliminary channel hole H2A. Accordingly, the first preliminary channel hole H1A may be opened. The second preliminary channel hole H2A may be connected to the first preliminary channel hole H1A, and accordingly, a channel hole HA" may be defined. The channel hole HA" may penetrate the plurality of first material layers 221, the plurality of second material layers 223, the plurality of third material layers 227, the plurality of fourth material layers 229, the second semiconductor layer 111A, and the preliminary horizontal pattern 200A in the cell region CAR". Also, the channel hole HA" may extend to the inside of the first semiconductor pattern 105A. While the channel hole HA" is formed, the plurality of first material layers 221, the plurality of second material layers 223, the plurality of third material layers 227, and the plurality of fourth material layers 229 may remain in a state in which the plurality of first material layers 221, the plurality of second material layers 223, the plurality of third material layers 227, and the plurality of fourth material layers 229 overlap with the plurality of lower contacts 403A in the contact region CTR".

Subsequently, a memory pattern 151A and a channel structure CH may be formed in the channel hole HA". The channel structure CH may include a cell channel layer 153A, a core insulating pattern 155A, and a capping pattern 157.

The process of forming the memory pattern 151A and the channel structure CH may include a process of forming a memory layer by sequentially stacking a first blocking insulating layer, a data storage layer, and a tunnel insulating layer along a surface of the channel hole HA", a process of forming a channel layer along a surface of the memory layer, a process of filling a central region of the channel hole HA" with the core insulating pattern 155A and the capping pattern 157, and a process of removing a portion of each of the memory layer and a channel layer by performing a planarization process to expose the etch stop layer 410.

Referring to FIG. 34D, as described with reference to FIGS. 10A and 10B, the plurality of first material layers 221, the plurality of second material layers 223, the plurality of third material layers 227, and the plurality of fourth material layers 229 may be etched such that a preliminary stepped stack structure 220 is defined. The plurality of first material layers 221 and the plurality of fourth material layers 229 may remain as a plurality of interlayer insulating layers IL, and the plurality of second material layers 223 and the plurality of third material layers 227 may remain as a plurality of sacrificial layers SC. As described with reference to FIGS. 10A and 10B, each sacrificial layer SC may include a base part SB and an edge part SE extending from the base part SB. The edge part SE may remain thinner than the base part SB.

Subsequently, a remaining portion of the etch stop layer 410 shown in FIG. 34C may be removed. Subsequently, a filling insulating layer 420 may be formed to cover the cell region CAR" and the contact region CTR" of the preliminary stepped stack structure 220.

Referring to FIG. 34E, the filling insulating layer 420 and the preliminary stepped stack structure 220 may be etched such that a first preliminary slit SI1 and a plurality of contact holes HB" are defined. While the first preliminary slit SI1 and the plurality of contact holes HB" are formed, the second semiconductor pattern 111A of the cell region CAR" and the plurality of lower contacts 403A of the contact region CTR" may be used as an etch stop layer. The plurality of contact holes HB" is defined by using the process of forming the first preliminary slit SI1, and thus the manufacturing method of the semiconductor memory device can be simplified.

The first preliminary slit SI1 may penetrate the filling insulating layer 420 and the preliminary stepped stack structure 220 in the cell region CAR". The first preliminary slit SI1 may penetrate a plurality of base parts SB of the plurality of sacrificial layers SC. The plurality of contact holes HB" may penetrate the filling insulating layer 420 and the preliminary stepped stack structure 220 in the contact region CTR" to respectively expose the plurality of lower contacts 403A. A plurality of edge parts SE of the plurality of sacrificial layers SC may be respectively penetrated by the plurality of contact holes HB".

Referring to FIG. 34F, a first upper protective layer 431 may be formed over the filling insulating layer 420. The first upper protective layer 431 may be formed by using a deposition process having a low step coverage such that a void 433 can be defined in a central region of each of the first preliminary slit SI1 and the plurality of contact holes HB".

Referring to FIG. 34G, a portion of the first upper protective layer 431 overlapping with the contact region CTR" of the preliminary stepped stack structure 220 may be removed. Accordingly, the plurality of contact holes HB" may be opened, and the plurality of edge parts SE of the plurality of sacrificial layers SC may be respectively exposed through the plurality of contact holes HB".

Referring to FIG. 34H, as described with reference to FIGS. 14A and 14B, the plurality of sacrificial layers SC may be etched through the plurality of contact holes HB", thereby defining a plurality of first recess regions 231 and a plurality of second recess regions 233.

Each first recess region 231 may be defined in a region in which the edge part SE of the sacrificial layer SC shown in FIG. 34G is removed. Each second recess region 233 may be defined in a region in which a portion of the base part SB of the sacrificial layer SC disposed under the edge part SE shown in FIG. 34G is removed.

Subsequently, a sacrificial pad 241P may be formed in the first recess region 231 by using the processes described with reference to FIGS. 15A and 15B and the processes described with reference to FIGS. 16A and 16B.

Referring to FIGS. 34I, a contact insulating layer 441 may be formed along a surface of the contact hole HB". The contact insulating layer 441 may fill the second recess region 233. A central region of the contact hole HB" is not filled by the contact insulating layer 441 but may be opened. The contact insulating layer 441 may extend along a surface of the filling insulating layer 420 in the contact region CTR", and extend along a top surface of the first upper protective layer 431 in the cell region CAR". The contact insulating layer 441 may be formed of a material having an etch selectivity with respect to the sacrificial layer SC. In an embodiment, the contact insulating layer 441 may include an oxide layer.

Subsequently, a liner layer 443 may be formed over the contact insulating layer 441. The liner layer 443 may include a material having an etch selectivity with respect to the contact insulating layer 441. In an embodiment, the liner layer 443 may include silicon. The central region of the contact hole HB" is not filled with the liner layer 443 but may be opened.

Referring to FIG. 34J, a second upper protective layer 445 may be formed on the liner layer 443. The second upper protective layer 445 may be formed by using a deposition process having a low step coverage such that a void 451 can be defined in the central region of the plurality of contact holes HB".

Referring to FIG. 34K, a portion of each of the second upper protective layer 445, the liner layer 443, and the contact insulating layer 441, which overlap with the cell region CAR" of the preliminary stepped stack structure 220, may be removed. Subsequently, a portion of the first upper protective layer 431 may be removed such that the first preliminary slit SI1 is opened. To this end, a mask pattern (not shown) which opens the cell region CAR" of the preliminary stepped stack structure 220 and blocks the contact region CTR" may be used as an etching barrier. After the first preliminary slit SI1 is opened, the mask pattern may be removed.

Referring to FIG. 34L, the plurality of sacrificial layers SC and the plurality of sacrificial pads 241P of the preliminary stepped stack structure 220 shown in FIG. 34K may be removed through the first preliminary slit SI1. Accordingly, a plurality of gate regions 275 may be defined as shown in FIGS. 24A and 24B. The contact insulating layer 441 and the liner layer 443, which remain in the plurality of contact holes HB", may be used as a support structure which stably maintains a gap between interlayer insulating layers IL adjacent to each other in the Z-axis direction. The contact insulating layer 441 of the support structure may extend between the interlayer insulating layers IL adjacent to each other.

Subsequently, as described with reference to FIGS. 25A and 25B, a second blocking insulating layer 161 and a plurality of conductive patterns CP may be formed. As described with reference to FIGS. 25A and 25B, each conductive pattern CP may be exposed by a first opening OP1 of the second blocking insulating layer 161. As described with reference to FIGS. 25A and 25B, each conductive pattern CP may include a base part CB and an edge part CE having a thickness thinner than that of the base part CB. The base part CB may surround the channel structure CH and the memory pattern 151A.

Referring to FIG. 34M, as described with reference to FIG. 26, a second preliminary slit SI2 penetrating the second semiconductor pattern 111A may be formed, thereby defining a slit SI. Subsequently, as described with reference to FIG. 27, after a sidewall insulating layer 171 is formed on a sidewall of the slit SI, portions of the preliminary horizontal pattern 200A shown in FIG. 34L and the memory pattern 151A shown in FIG. 34L may be removed. Accordingly, the horizontal space 277 may be opened, and a first memory pattern 151P1 and a second memory pattern 151P2 may be isolated from each other by the horizontal space 277. In addition, a sidewall of the cell channel layer 153A may be exposed by the horizontal space 277.

Subsequently, as described with reference to FIGS. 28A and 28B, a doped semiconductor layer 173 may be formed to fill the horizontal space 277 and the slit SI. The doped semiconductor layer 173 may extend to cover the first upper protective layer 431 and the second upper protective layer 445.

Referring to FIG. 34N, a portion of the doped semiconductor layer 173, and the upper protective layer 445 and the liner layer 443, which are shown in FIG. 34M, may be removed by using an etching process using, as an etching barrier, a mask pattern (not shown) which blocks the cell region CAR" and opens the contact region CTR". Subsequently, a portion of the contact insulating layer 441 shown in FIG. 34M may be removed through an etching process such as etch-back, thereby exposing a portion of the second blocking insulating layer 161. A portion of the second blocking insulating layer 161 facing a sidewall of the contact hole HB" shown in FIG. 34M may be exposed, and a portion of the contact insulating layer 441 between the interlayer insulating layers IL shown in FIG. 34M may remain as the contact insulating pattern 441P in the second recess region. In addition, the plurality of contact holes HB" may be opened.

Subsequently, as described with reference to FIGS. 30A and 30B, a portion of the second blocking insulating layer 161 may be removed, thereby defining a second opening OP2. The edge part CE of the conductive pattern CP may be exposed by the second opening OP2 of the second blocking insulating layer 161. The mask pattern may be removed after the second opening OP2 is formed.

Referring to FIG. 34O, after the plurality of contact holes HB" shown in FIG. 34M is filled with a conductive material, a planarization process may be performed to expose the filling insulating layer 420. Accordingly, a plurality of conductive gate contacts 181A may be formed, which are respectively connected to the plurality of lower contacts 403A. The second semiconductor pattern 111B, the preliminary contact structure 200B, and the first semiconductor pattern 105B may remain to surround each lower contact 403A in the contact region CTR".

The doped semiconductor layer 173 shown in FIG. 34M may remain as a common source pattern CSL through the described-above planarization process. As described with reference to FIG. 32A, the common source pattern CSL may be divided into a horizontal doped semiconductor pattern 173H and a conductive vertical contact 173VC, and be in contact with the cell channel layer 153A.

Subsequently, subsequent processes for forming the upper insulating layer UI, the bit line contact 193A, the upper contact 193H, the bit line BL, and the upper line UL, which are shown in FIGS. 3A, 3B, and 3C, may be performed.

FIGS. 34A to 34M illustrate an embodiment of a manufacturing method of a conductive pattern CP including a base part CB and an edge part CE having a thickness thinner than that of the base par CB. However, the embodiment of the present disclosure is not limited thereto. In another embodiment, the edge part of the conductive pattern may be formed thicker than the base part of the conductive pattern by using the processes shown in FIGS. 33A to 33J.

Figure 35:
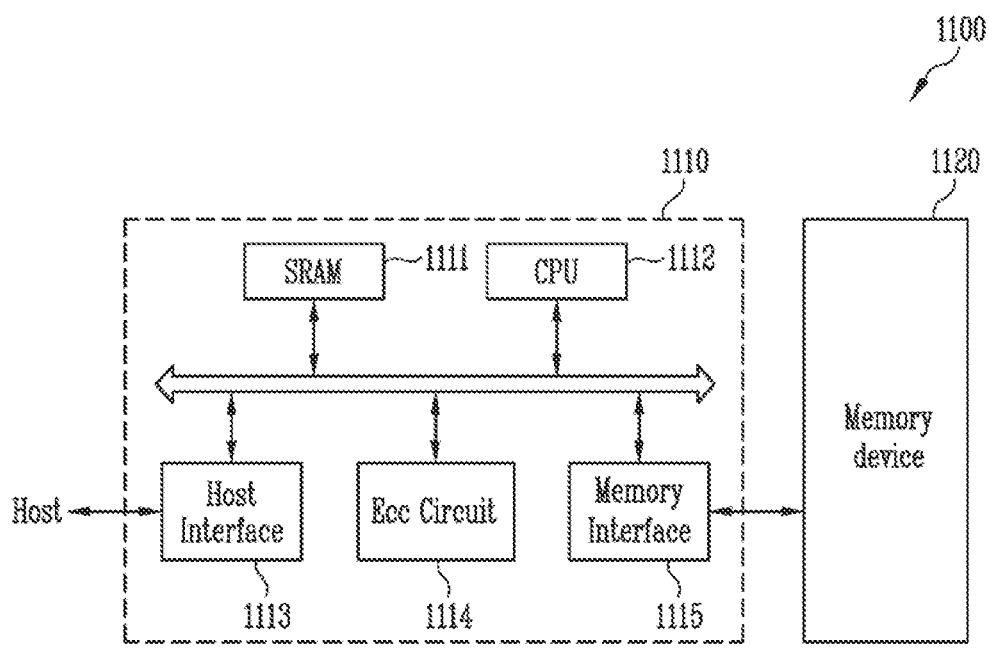
FIG. 35 is a block diagram illustrating a configuration of a memory system in accordance with an embodiment of the present disclosure.

FIG. 35 is a block diagram illustrating a configuration of a memory system in accordance with an embodiment of the present disclosure.

Referring to FIG. 35, the memory system 1100 includes a memory device 1120 and a memory controller 1110.

The memory device 1120 may be a multi-chip package configured with a plurality of flash memory chips. The memory device 1120 may include a plurality of conductive patterns stacked in a stepped shape, and a conductive gate contact which penetrates an edge part of one conductive pattern among the plurality of conductive patterns and is in contact with the edge part. The plurality of conductive patterns may include a lower conductive pattern disposed under the edge part of the conductive pattern in contact with a conductive gate contact, and the conductive gate contact may penetrate the lower conductive pattern. The conductive gate contact may be insulated from the lower conductive pattern by a contact insulating pattern. Also, the memory device 1120 may include a horizontal doped semiconductor pattern disposed under the plurality of conductive patterns and a cell channel layer which is connected to the horizontal doped semiconductor pattern and extends to be surrounded by the plurality of conductive patterns. The conductive gate contact may extend to a level at which the horizontal doped semiconductor pattern is disposed, and have a groove into which a protective layer is inserted at the level at which the horizontal doped semiconductor pattern is disposed. Alternatively, the conductive gate contact may extend to be in contact with a lower contact extending to the level at which the horizontal doped semiconductor pattern is disposed.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. The memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 36:
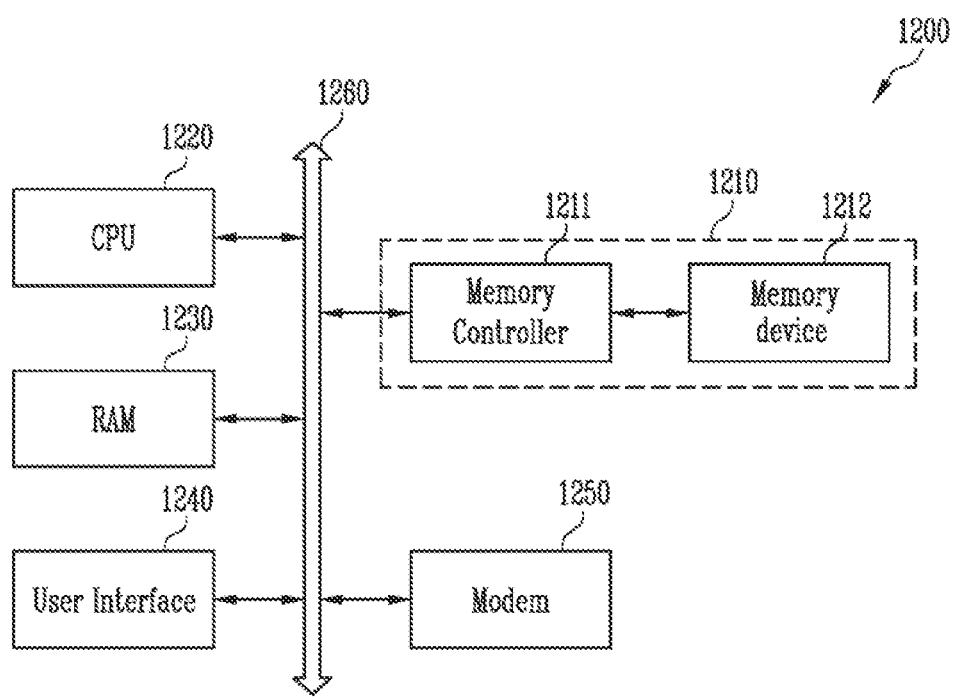
FIG. 36 is a block diagram illustrating a configuration of a computing system in accordance with an embodiment of the present disclosure.

FIG. 36 is a block diagram illustrating a configuration of a computing system in accordance with an embodiment of the present disclosure.

Referring to FIG. 36, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211.

The memory device 1212 may be configured identically to the memory device 1120 described with reference to FIG. 35.

In accordance with an embodiment, a contact insulating pattern can be self-aligned at a target position by using a thickness difference of a sacrificial material included in at least one of a sacrificial layer and a sacrificial pad. Accordingly, the stability of manufacturing processes can be improved.

In accordance with an embodiment, a support structure is placed with a conductive gate contact, so that the area occupied by the conductive gate contact and the support structure can be reduced. In addition, in an embodiment, although any separate support structure is not disposed at the periphery of the conductive gate contact, the structural stability and the stability of a manufacturing processes can be improved through a support structure previously formed in a region in which the conductive gate contact is to be disposed.

In accordance with an embodiment, although some support structures disposed at the periphery of the conductive gate contact are omitted, the stability of manufacturing processes can be improved. Thus, in an embodiment, the area of the conductive gate contact, which corresponds to the omitted area of the support structure, can be increased.

What is claimed is:

1. A semiconductor memory device comprising:
   a first conductive gate contact;
   a first contact insulating pattern surrounding the first conductive gate contact;
   a first conductive pattern surrounding the first contact insulating pattern; and
   a second conductive pattern disposed over the first conductive pattern, the second conductive pattern surrounding the first conductive gate contact;
   a blocking insulating layer extending along an upper surface, a lower surface, and a sidewall of each of the first conductive pattern and the second conductive pattern; and
   an insulating layer surrounding a portion of the first conductive gate contact, the portion protruding more than the second conductive pattern,
   wherein the second conductive pattern includes:
   a first edge part disposed between the first contact insulating pattern and the insulating layer, the first edge part being in contact with the first conductive gate contact; and
   a first base part spaced apart from the first conductive gate contact by the first edge part, the first base part extending from the first edge part and away from the first conductive gate contact, and the first base part being thicker than the first edge part,
   wherein a portion of the blocking insulating layer extending along the upper surface, the lower surface, and the sidewall of the second conductive pattern includes a first opening exposing a sidewall of the first base part and a second opening exposing a sidewall of the first edge part contacting the first conductive gate contact, and
   wherein a contact surface between the blocking insulating layer and the first conductive gate contact protrudes toward the first base part of the second conductive pattern more than a sidewall of the insulating layer facing the portion of the first conductive gate contact.

2. The semiconductor memory device of claim 1, wherein the first conductive pattern includes:
   a second base part overlapping with the first edge part of the second conductive pattern, the second base part being thicker than the first edge part; and
   a second edge part extending from the second base part, the second edge part being thinner than the second base part.

3. The semiconductor memory device of claim 2, further comprising a second conductive gate contact surrounded by the second edge part of the first conductive pattern, the second conductive gate contact having a sidewall in contact with the second edge part.

4. The semiconductor memory device of claim 1, further comprising:
   an interlayer insulating layer between the first conductive pattern and the second conductive pattern;
   a sidewall insulating layer extending along sidewalls of the first conductive pattern, the second conductive pattern, and the interlayer insulating layer; and
   a conductive vertical contact on the sidewall insulating layer.

5. The semiconductor memory device of claim 4, wherein the sidewall insulating layer is in contact with the sidewall of the first base part through the first opening, and wherein the second opening is narrower than the first opening.

6. The semiconductor memory device of claim 1, further comprising:
   a dummy contact penetrating the first conductive pattern and the second conductive pattern;
   a second contact insulating pattern disposed between the dummy contact and at least one of the first conductive pattern and the second conductive pattern; and
   an upper insulating layer on a top surface of the dummy contact.

7. A semiconductor memory device comprising:
   a horizontal doped semiconductor pattern;
   a stepped stack structure including a plurality of interlayer insulating layers and a plurality of conductive patterns, which are alternately stacked on the horizontal doped semiconductor pattern, the stepped stack structure including a cell region overlapping with the horizontal doped semiconductor pattern and a contact region extending from the cell region;
   a cell channel layer in contact with the horizontal doped semiconductor pattern, the cell channel layer penetrating the cell region of the stepped stack structure;
   a plurality of conductive gate contacts penetrating the contact region of the stepped stack structure, the plurality of conductive gate contacts extending to a level at which the horizontal doped semiconductor pattern is disposed; and
   a protective layer filling a groove formed at a sidewall of each of the conductive gate contacts, wherein the groove is disposed at the level at which the horizontal doped semiconductor pattern is disposed.

8. The semiconductor memory device of claim 7, wherein the plurality of conductive gate contacts include a first conductive gate contact and a second conductive gate contact, which are spaced apart from each other, and
   wherein the plurality of conductive patterns include:
   a first conductive pattern surrounding the first conductive gate contact and the second conductive gate contact; and
   a second conductive pattern disposed over the first conductive pattern, the second conductive pattern being spaced apart from the second conductive gate contact.

9. The semiconductor memory device of claim 8, wherein the second conductive pattern includes a first edge part surrounding the first conductive gate contact and a first base part extending toward the cell channel layer from the first edge part,
   wherein the first conductive pattern includes a second base part which overlaps with the first edge part of the second conductive pattern and surrounds the first conductive gate contact, and a second edge part extending to surround the second conductive gate contact from the second base part,
   wherein the first edge part of the second conductive pattern includes a sidewall in contact with the first conductive gate contact, and
   wherein the second edge part of the first conductive pattern includes a sidewall in contact with the second conductive gate contact.

10. The semiconductor memory device of claim 9, wherein the first edge part and the second edge part are thinner than the first base part and the second base part.

11. The semiconductor memory device of claim 9, wherein the first edge part and the second edge part are thicker than the first base part and the second base part.

12. The semiconductor memory device of claim 9, further comprising a contact insulating pattern disposed between the first conductive pattern and the first conductive gate contact.

13. The semiconductor memory device of claim 7, further comprising:
- a conductive vertical contact extending parallel to the cell channel layer from the horizontal doped semiconductor pattern;
- a sidewall insulating layer between the conductive vertical contact and the stepped stack structure; and
- a blocking insulating layer extending along a surface of each of the plurality of conductive patterns,
- wherein the blocking insulating layer includes a first opening facing the sidewall insulating layer and a second opening facing a corresponding conductive gate contact among the plurality of conductive gate contacts.

14. The semiconductor memory device of claim 13, wherein a width of the second opening is narrower than that of the first opening.

15. The semiconductor memory device of claim 13, wherein a width of the second opening is wider than that of the first opening.

16. The semiconductor memory device of claim 7, wherein the stepped stack structure further includes an extension region extending from the contact region.

17. The semiconductor memory device of claim 16, further comprising:
- a plurality of upper contacts connected to the plurality of conductive gate contacts;
- a plurality of upper lines connected to the plurality of upper contacts;
- a plurality of dummy contacts penetrating the extension region of the stepped stack structure, the plurality of dummy contacts extending to a level at which the horizontal doped semiconductor pattern is disposed; and
- an upper insulating layer located between the plurality of upper contacts and between the plurality of upper lines, the upper insulating layer covering the plurality of dummy contacts.

* * * * *